(12) United States Patent
Lee et al.

(10) Patent No.: US 8,385,115 B2
(45) Date of Patent: Feb. 26, 2013

(54) METHODS OF PRECHARGING NON-VOLATILE MEMORY DEVICES DURING A PROGRAMMING OPERATION AND MEMORY DEVICES PROGRAMMED THEREBY

(75) Inventors: Chang Hyun Lee, Cambridge, MA (US); Dong Dae Kim, Yongin-shi (KR); Byung In Choi, Hwasung-shi (KR)

(73) Assignee: Samsung Electronics Co., Ltd. (KR)

( * ) Notice: Subject to any disclaimer, the term of this patent is extended or adjusted under 35 U.S.C. 154(b) by 232 days.

(21) Appl. No.: 12/583,811

(22) Filed: Aug. 26, 2009

(65) Prior Publication Data
US 2010/0054036 A1 Mar. 4, 2010

(30) Foreign Application Priority Data
Aug. 27, 2008 (KR) ........................ 10-2008-0084013

(51) Int. Cl.
*G11C 11/34* (2006.01)
(52) U.S. Cl. ......... 365/185.03; 365/185.02; 365/185.18; 365/185.19; 365/200
(58) Field of Classification Search ............. 365/185.03, 365/185.02, 185.25, 200, 203, 210.1
See application file for complete search history.

(56) References Cited

U.S. PATENT DOCUMENTS

| | | | |
|---|---|---|---|
| 5,621,684 A | 4/1997 | Jung | |
| 5,677,873 A | 10/1997 | Choi et al. | |
| 5,715,194 A | 2/1998 | Hu | |
| 5,991,202 A | 11/1999 | Derhacobian et al. | |
| 6,061,270 A | 5/2000 | Choi | |
| 7,436,714 B2 | 10/2008 | Yaegashi et al. | |
| 7,623,386 B2 * | 11/2009 | Dong et al. ............. | 365/185.18 |
| 2004/0080980 A1 * | 4/2004 | Lee .......................... | 365/185.17 |
| 2007/0252201 A1 | 11/2007 | Kito et al. | |
| 2007/0279986 A1 * | 12/2007 | Yaegashi et al. ......... | 365/185.17 |
| 2008/0025098 A1 * | 1/2008 | Byeon et al. ............. | 365/185.18 |
| 2008/0089129 A1 * | 4/2008 | Lee .......................... | 365/185.17 |
| 2008/0144378 A1 * | 6/2008 | Park et al. ................ | 365/185.05 |
| 2009/0121271 A1 | 5/2009 | Son et al. | |

FOREIGN PATENT DOCUMENTS

| | | |
|---|---|---|
| JP | 08279297 | 10/1996 |
| JP | 2007323735 | 12/2007 |
| KR | 100145475 | 10/1999 |
| KR | 1020070115604 A | 12/2007 |
| KR | 1020080010032 A | 1/2008 |

* cited by examiner

*Primary Examiner* — Pho M Luu
*Assistant Examiner* — Thao Bui
(74) *Attorney, Agent, or Firm* — Onello & Mello, LLP

(57) ABSTRACT

Embodiments are directed to a method of programming a semiconductor memory device, the memory device including: a plurality of memory cell transistors arranged in a plurality of transistor strings; a plurality of word lines, each word line connected to a corresponding memory cell transistor of each of the transistor strings; and a plurality of bit lines, each bit line connected to at least one of the transistor strings, the method comprising: applying a first voltage, and then applying a programming voltage to a selected word line corresponding to the selected memory cell transistor; and in advance of applying the first voltage to the selected word line, applying a second voltage to at least one neighboring word line that neighbors the selected word line, the neighboring word line connected to a neighboring, unselected memory cell transistor of the selected transistor string, to ensure precharging of a channel region of another, unselected transistor string between a first, unselected transistor of the unselected transistor string connected to the neighboring word line and a second, unselected transistor of the unselected transistor string connected to the selected word line, the first, unselected transistor neighboring the second, unselected transistor in the unselected transistor string.

22 Claims, 39 Drawing Sheets

METHODS OF PRECHARGING NON-VOLATILE MEMORY DEVICES DURING A PROGRAMMING OPERATION AND MEMORY DEVICES PROGRAMMED THEREBY

RELATED APPLICATIONS

This application claims priority under 35 U.S.C. 119 to Korean Patent Application No 10-2008-0084013, filed on Aug. 27, 2008, the content of which is incorporated herein by reference in its entirety.

BACKGROUND

With the continued emphasis on highly integrated electronic devices, there is an ongoing need for semiconductor memory devices that operate at higher speeds and lower power and that have increased device density. Flash devices are the best match to meet these requirements because flash devices provide a large memory capacity without the need for a periodic refresh operation. As scaling progresses, reduced power consumption may be anticipated. Recently, devices with aggressive scaling and multiple-layered devices with transistor cells arranged in horizontal and vertical arrays have been under development.

Flash device, which have become well-known as a form of electrically erasable programmable read only memory, comprise one or more memory cell arrays. A memory cell array, in turn, is comprised of a plurality of memory blocks, each block is connected to a plurality of bit lines of the device. Each bit line is configured to connect to one or more memory cell strings where transistor stacks comprising charge storage layers, such as floating gates or charge trap layers, are arranged in series. A plurality of word lines run in a perpendicular direction relative tot the bit lines and connect to control gates over each of the charge storage layers.

In contemporary non-volatile memory devices, programming operations are performed by applying a programming voltage Vpgm to a word line of a memory cell to be programmed, while a pass voltage Vpass is applied to word lines of unselected cells of the string. At the same time, a ground voltage 0V is applied to a bit line of the cell string including the memory cell to be programmed, while a power voltage Vcc is applied to other bit lines corresponding to cell strings not including the memory cells to be programmed. In order to ensure a precise programming operation, the threshold voltage of the memory cell to be programmed, i.e. the "selected memory cell", should be raised while the threshold voltages of unselected memory cells should not change.

The programming voltage Vpgm is generally a very high voltage, such as 20V, even though the effort to lower the level of the programming voltage has been made. Such a voltage level is strong enough to cause injection of electrons into the charge storage layer of the memory cell to be programmed. The electron injection is a result of the electric field generated between the control gate of the memory cell to be programmed to which the programming voltage Vpgm is applied, and the channel region of the memory cell to be programmed to which the ground voltage 0V is applied via the bit line. The resulting injection of electrons into the charge storage layer of the desired memory cell operates to program the memory cell.

In contemporary devices, the programming voltage is applied not only to the selected memory cell but also to unselected memory cells connected to the selected word line. As a result, unselected memory cells connected to the selected word line may be inadvertently programmed. Such unwanted programming in the unselected memory cells connected to the selected word line is referred to as a "program disturb."

SUMMARY

Embodiments of the present invention are directed to methods of programming memory devices that address and overcome the limitations of the conventional methods. Further, embodiments of the present invention are directed to memory devices programmed according to methods that address and overcome such limitations, as well as systems employing such memory devices. In particular, embodiments of the present invention ensure the pre-charging of the channel regions of certain, unselected memory cells just prior to a programming operation to be performed on the memory cells, and, in particular, for a programming operation to be performed on memory cells of non-volatile memory devices. As a result, pre-charging of the channel regions of memory cells of unselected cell strings sharing the same word line as the selected memory cell is ensured. This, in turn, mitigates or eliminates the inadvertent disturbance of the threshold voltage in the memory cells of unselected cell strings sharing the same word line as the selected memory cell during a programming operation of the selected memory cell.

In one aspect, in a method of programming a semiconductor memory device, the memory device includes: a plurality of memory cell transistors arranged in a plurality of transistor strings; a plurality of word lines, each word line connected to a corresponding memory cell transistor of each of the transistor strings; and a plurality of bit lines, each bit line connected to at least one of the transistor strings. The method comprises: applying a first voltage, and then applying a programming voltage to a selected word line corresponding to the selected memory cell transistor; and in advance of applying the first voltage to the selected word line, applying a second voltage to at least one neighboring word line that neighbors the selected word line, the neighboring word line connected to a neighboring, unselected memory cell transistor of the selected transistor string, to ensure precharging of a channel region of another, unselected transistor string between a first, unselected transistor of the unselected transistor string connected to the neighboring word line and a second, unselected transistor of the unselected transistor string connected to the selected word line, the first, unselected transistor neighboring the second, unselected transistor in the unselected transistor string.

In one embodiment, the application of the second voltage to the neighboring word line precedes application of the pass voltage to the unselected word lines of the plurality of word lines.

In another embodiment, the first voltage and the second voltage are at the same voltage level or the first voltage is higher than the second voltage.

In another embodiment, the first voltage is less than the programming voltage; and wherein the second voltage is a precharge voltage.

In another embodiment, applying the second voltage to the neighboring word line is performed at substantially the same time as, or subsequent to applying a voltage to a bit line.

In another embodiment, applying the second voltage to at least one neighboring word line that neighbors the selected word line further comprises applying the second voltage to the neighboring word line connected to the neighboring memory cell transistor of the selected transistor string positioned between the selected memory cell transistor and the other of either a ground select transistor or a string select transistor of the selected transistor string.

In another embodiment, the method further comprises applying the second voltage to all neighboring, unselected word lines that are directly next to the selected word line, in advance of applying the first voltage to the selected word line.

In another embodiment, the method further comprises applying the second voltage to all word lines that are connected to transistors of the transistor string that comprises the selected memory cell transistor, in advance of applying the first voltage to the selected word line.

In another embodiment, each transistor string further comprises at least one dummy memory cell transistor and wherein the memory device further comprises at least one dummy word line connected to a corresponding at least one dummy memory cell transistor of the transistor strings, and the method further comprises: applying the second voltage to the at least one dummy word line in advance of applying the first voltage to the selected word line.

In another embodiment, the at least one dummy memory cell transistor of each transistor string is positioned either between the plurality of memory cell transistors and a string select transistor of the transistor string or between the plurality of memory cell transistors and a ground select transistor of the transistor string, or both sides of the end of memory cell transistors.

In another embodiment, one of the at least one dummy word line is the neighboring word line of the selected word line to which the second voltage is applied in advance of applying the first voltage to the selected word line.

In another embodiment, the first voltage is the same as or greater than the second voltage.

In another embodiment, the method further comprises applying a third voltage to the selected word line at the time stage between applying the first and applying the programming voltage to the selected word line, and wherein the third voltage is lower than the first voltage.

In another embodiment, the memory cell transistors comprise a transistor type selected from the group consisting of SONOS-type, SANOS-type, TANOS-type, CTF-type, and floating gate type.

In another embodiment, the transistor strings of the memory device are configured as a configuration selected from the group consisting of: planar strings extending in a horizontal direction relative to a base substrate and vertical strings extending in a vertical direction relative to a base substrate.

In another aspect, a multiple-level cell (MLC) programming operation of a non-volatile memory device includes the method of programming described above.

In another embodiment, a shadow programming operation of a non-volatile memory device includes the method described above. In another embodiment, the shadow programming operation further comprises turning down the second voltage to a low voltage to two unselected word lines of the unselected word lines, wherein the two unselected word lines are positioned on each side of the selected word line, In another aspect, in a method of programming a semiconductor memory device, the memory device includes: a plurality of memory cell transistors arranged in a plurality of transistor strings; a plurality of word lines, each word line connected to a corresponding memory cell transistor of each of the transistor strings; and a plurality of bit lines, each bit line connected to at least one of the transistor strings. The method comprises: raising a voltage of a selected word line to a programming voltage Vpgm corresponding to the selected memory cell transistor; and in advance of raising the voltage of the selected word line, applying a second voltage to at least one neighboring word line that neighbors the selected word line, the neighboring word line connected to a neighboring, unselected memory cell transistor of the selected transistor string, to ensure precharging of a channel region of another, unselected transistor string between a first, unselected transistor of the unselected transistor string connected to the neighboring word line and a second, unselected transistor of the unselected transistor string connected to the selected word line, the first, unselected transistor neighboring the second, unselected transistor in the unselected transistor string.

In another aspect, a semiconductor memory device comprises: a plurality of memory cell transistors arranged in a plurality of transistor strings; a plurality of word lines, each word line connected to a corresponding memory cell transistor of each of the transistor strings; a plurality of bit lines, each bit line connected to at least one of the transistor strings; and a signal generator that: applies a first voltage, and then applies a programming voltage to a selected word line corresponding to the selected memory cell transistor; and in advance of applying the first voltage to the selected word line, applies a second voltage to at least one neighboring word line that neighbors the selected word line, the neighboring word line connected to a neighboring, unselected memory cell transistor of the selected transistor string, to ensure precharging of a channel region of another, unselected transistor string between a first, unselected transistor of the unselected transistor string connected to the neighboring word line and a second, unselected transistor of the unselected transistor string connected to the selected word line, the first, unselected transistor neighboring the second, unselected transistor in the unselected transistor string.

In one embodiment, the data are programmed in multiple-level cell (MLC) programming.

In another embodiment, the transistor strings of the memory device are configured as a configuration selected from the group consisting of: planar strings extending in a horizontal direction relative to a base substrate and vertical strings extending in a vertical direction relative to a base substrate.

In another aspect, a memory system comprises: a memory controller that generates command and address signals; and a memory module comprising a plurality of memory devices, the memory module receiving the command and address signals and in response storing and retrieving data to and from at least one of the memory devices, wherein each memory device comprises: a plurality of memory cell transistors arranged in a plurality of transistor strings; a plurality of word lines, each word line connected to a corresponding memory cell transistor of each of the transistor strings; a plurality of bit lines, each bit line connected to at least one of the transistor strings; and a signal generator that: applies a first voltage, and then applies a programming voltage to a selected word line corresponding to the selected memory cell transistor; and in advance of applying the first voltage to the selected word line, applies a second voltage to at least one neighboring word line that neighbors the selected word line, the neighboring word line connected to a neighboring, unselected memory cell transistor of the selected transistor string, to ensure precharging of a channel region of another, unselected transistor string between a first, unselected transistor of the unselected transistor string connected to the neighboring word line and a second, unselected transistor of the unselected transistor string connected to the selected word line, the first, unselected transistor neighboring the second, unselected transistor in the unselected transistor string.

In another aspect, in a method of programming a semiconductor memory device, the memory device includes: a plurality of memory cell transistors arranged in a plurality of transistor strings; a plurality of word lines, each word line connected to a corresponding memory cell transistor of each of the transistor strings; and a plurality of bit lines, each bit line connected to at least one of the transistor strings. The method comprises: performing a programming operation on a selected memory cell transistor of a selected transistor string by applying a first voltage, followed by applying a programming voltage, to a selected word line corresponding to the selected memory cell transistor and applying a pass voltage to unselected word lines of the plurality of word lines; and prior to performing the programming operation on the selected memory cell transistor, applying a precharge voltage to a neighboring word line that neighbors the selected word line, the neighboring word line connected to a neighboring memory cell transistor of the selected transistor string positioned between the selected memory cell transistor and the bit line connected to the transistor string, to ensure precharging of a channel region of another, unselected transistor string between a first, unselected transistor of the unselected transistor string connected to the neighboring word line and a second, unselected transistor of the unselected transistor string connected to the selected word line, the first, unselected transistor neighboring the second, unselected transistor in the unselected transistor string, wherein the application of the precharge voltage to the neighboring word line precedes application of the pass voltage to the unselected word lines of the plurality of word lines during the programming operation.

In one embodiment, the first voltage and the precharge voltage are at the same voltage level.

In another embodiment, each of the transistor strings further includes a string select transistor positioned between the memory cell transistors of a string and the bit line and wherein applying the precharge voltage to the neighboring word line is performed at substantially the same time as, or subsequent to applying a string select voltage signal to a string select line connected to the string select transistors.

In another embodiment, the method further comprises applying the precharge voltage to the selected word line prior to performing the programming operation on the selected memory cell transistor.

In another embodiment, applying the precharge voltage to a neighboring word line that neighbors the selected word line further comprises applying the precharge voltage to a neighboring word line connected to a neighboring memory cell transistor of the selected transistor string positioned between the selected memory cell transistor and a ground select transistor of the selected transistor string.

In another embodiment, the method further comprises applying the precharge voltage to the selected word line prior to performing the programming operation on the selected memory cell transistor.

In another embodiment, the method further comprises applying the precharge voltage to all word lines that are connected to transistors of the transistor string that includes the selected memory cell transistor prior to performing the programming operation on the selected memory cell transistor.

In another embodiment, each transistor string further includes at least one dummy memory cell transistor and wherein the memory device further includes at least one dummy word line connected to a corresponding at least one dummy memory cell transistor of the transistor strings, and the method further comprises: applying the precharge voltage to the at least one dummy word line prior to performing the programming operation on the selected memory cell transistor.

In another embodiment, the at least one dummy memory cell transistor of each transistor string is positioned in series between the plurality of memory cell transistors and a string select transistor of the transistor string.

In another embodiment, the at least one dummy memory cell transistor of each transistor string is positioned in series between the plurality of memory cell transistors and a ground select transistor of the transistor string.

In another embodiment, one of the at least one dummy word line is the neighboring word line of the selected word line to which the precharge voltage is applied prior to performing the programming operation on the selected memory cell transistor.

In another embodiment, the first voltage is greater than the precharge voltage and wherein performing the programming operation further comprises applying the precharge voltage to unselected word lines corresponding to unselected memory cell transistors of the selected transistor string.

In another embodiment, the first voltage is equal to the precharge voltage and further comprising applying a second voltage greater than the precharge voltage to the selected word line corresponding to the selected memory cell transistor prior to performing the programming operation on the selected memory cell transistor of the selected transistor string, and wherein performing the programming operation further comprises applying the precharge voltage to unselected word lines corresponding to unselected memory cell transistors of the selected transistor string.

In another embodiment, performing the programming operation further comprises applying a first voltage less than the programming voltage to unselected word lines corresponding to unselected memory cell transistors of the selected transistor string; and wherein the first voltage and the precharge voltage are at the same voltage level.

In another embodiment, applying the precharge voltage to at least one neighboring word line that neighbors the selected word line occurs at a time contemporaneous with or subsequent to applying a string selection signal that selects the selected transistor string.

In another embodiment, the memory cell transistors comprise a transistor type selected from the group consisting of SONOS-type, SANOS-type, TANOS-type, CTF-type, and floating gate type.

In another embodiment, the transistor strings of the memory device are configured as a configuration selected from the group consisting of: planar strings extending in a horizontal direction relative to a base substrate and vertical strings extending in a vertical direction relative to a base substrate.

In another embodiment, a multiple-level cell (MLC) programming operation of a non-volatile memory device includes the methods described above.

In another embodiment, a shadow programming operation of a non-volatile memory device includes the methods described above.

In another aspect, in a method of programming a semiconductor memory device, the memory device includes: a plurality of memory cell transistors arranged in a plurality of transistor strings; a plurality of word lines, each word line connected to a corresponding memory cell transistor of each of the transistor strings; and a plurality of bit lines, each bit line connected to at least one of the transistor strings. The method comprises: initiating a programming operation on a selected memory cell transistor of a selected transistor string by applying a first voltage to a selected word line corresponding to the selected memory cell transistor, and contemporaneously applying a precharge voltage to unselected word lines corresponding to unselected memory cell transistors of the selected transistor string, to ensure precharging of a channel region of an unselected transistor of an unselected transistor string connected to the selected word line, wherein the first voltage is greater than the precharge voltage; and following initiating the programming operation, completing the programming operation of the selected memory cell transistor of the selected transistor string by applying a programming voltage greater than the first voltage to the selected word line corresponding to the selected memory cell transistor.

In another embodiment, the method further comprises, prior to initiating the programming operation on the selected memory cell transistor, applying the first voltage to at least one neighboring word line that neighbors the selected word line.

In another aspect, a semiconductor memory device comprises: a plurality of memory cell transistors arranged in a plurality of transistor strings; a plurality of word lines, each word line connected to a corresponding memory cell transistor of each of the transistor strings; a plurality of bit lines, each bit line connected to at least one of the transistor strings; and a signal generator that: performs a programming operation on a selected memory cell transistor of a selected transistor string by applying a first voltage, followed by applying a programming voltage, to a selected word line corresponding to the selected memory cell transistor and applying a pass voltage to unselected word lines of the plurality of word lines; and prior to performing the programming operation on the selected memory cell transistor, applies a precharge voltage to a neighboring word line that neighbors the selected word line, the neighboring word line connected to a neighboring memory cell transistor of the selected transistor string positioned between the selected memory cell transistor and the bit line connected to the transistor string, to ensure precharging of a channel region of another, unselected transistor string between a first, unselected transistor of the unselected transistor string connected to the neighboring word line and a second, unselected transistor of the unselected transistor string connected to the selected word line, the first, unselected transistor neighboring the second, unselected transistor in the unselected transistor string, wherein the application of the precharge voltage to the neighboring word line precedes application of the pass voltage to the unselected word lines of the plurality of word lines during the programming operation.

In another aspect, a semiconductor memory device comprises: a plurality of memory cell transistors arranged in a plurality of transistor strings; a plurality of word lines, each word line connected to a corresponding memory cell transistor of each of the transistor strings; a plurality of bit lines, each bit line connected to at least one of the transistor strings, and a signal generator that: initiates a programming operation on a selected memory cell transistor of a selected transistor string by applying a first voltage to a selected word line corresponding to the selected memory cell transistor, and contemporaneously applying a precharge voltage to unselected word lines corresponding to unselected memory cell transistors of the selected transistor string, to ensure precharging of a channel region of an unselected transistor of an unselected transistor string connected to the selected word line, wherein the first voltage is greater than the precharge voltage; and following initiating the programming operation, completes the programming operation of the selected memory cell transistor of the selected transistor string by applying a programming voltage greater than the first voltage to the selected word line corresponding to the selected memory cell transistor.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings:

FIGS. 6A-17A are timing diagrams of signals applied to a memory cell array illustrating memory cell programming operations in accordance with other embodiments of the present invention. FIGS. 6B-17B are schematic diagrams of memory cell array circuits illustrating a memory cell programming operation during time stage t2 of the timing diagram of FIGS. 6A-17A, in accordance with other embodiments of the present invention.

DETAILED DESCRIPTION OF EMBODIMENTS

Figure 1A:
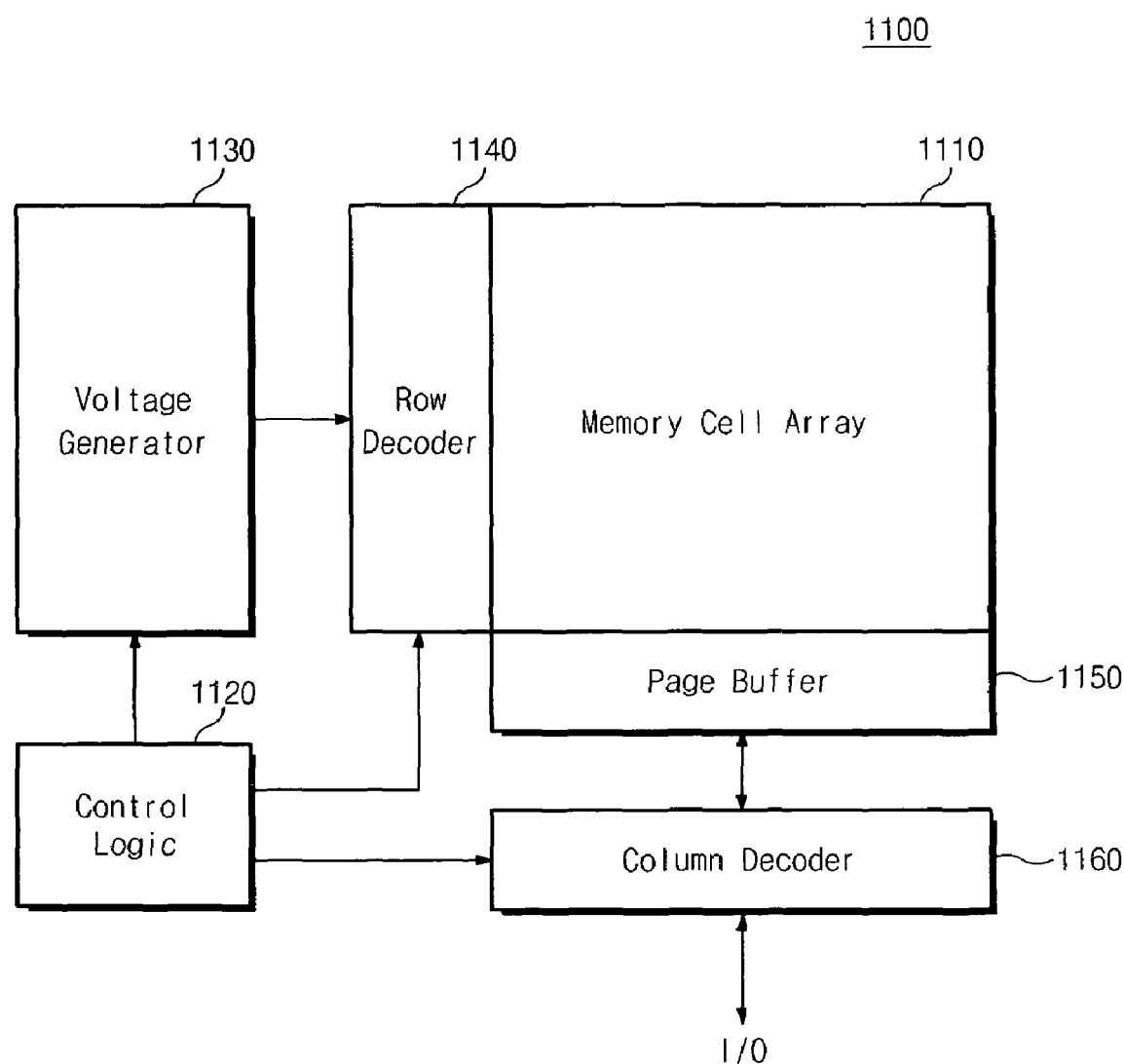
FIG. 1A is a block diagram of a memory device in accordance with embodiments of the present invention.

One of the proposed solutions to address unwanted cell programming due to cell disturbance is the "self-boosting scheme," which is disclosed in U.S. Pat. No. 5,677,873 entitled "Method of Programming Flash EEPROM Integrated Circuit Memory Devices to Prevent Inadvertent Programming of Non-Designated NAND Memory Cells Therein," and U.S. Pat. No. 5,991,202 entitled "Method for Reducing Program Disturb during Self-boosting in a NAND Flash Memory," which are herein incorporated by reference.

Application of the programming voltage Vpgm to the word line connected to the memory cell to be programmed can also lead to inadvertent programming of other memory cells in other cell strings connected to the same word line. For this reason, a self-boosting programming operation has been developed by which the power voltage Vcc, rather than the ground voltage, is applied to the bit lines corresponding to unselected cell strings (the term "unselected cell string", as referred to herein is meant to designate cell strings that do not include memory cells to be programmed). The self-boosting programming operation boosts the potential in the channel regions of transistors of the unselected cell strings, thereby reducing the electric field in the memory cells sharing the same word line as the selected memory cell. The reduced electric field is thus insufficient for causing the programming of cells in the unselected cell strings.

For example, the ground path is opened by applying 0V to the gate of a ground select transistor (GST.) A voltage of 0V is applied to a selected bit line, while a Vcc voltage, as a program inhibition voltage, is applied to an unselected bit line. At the same time, the Vcc voltage is applied to a gate of a string selection transistor. A source region of a string select transistor of an unselected string becomes charged to a level of Vcc-Vth (Vth refers to the threshold voltage of the string select transistor). As a result, the string selection transistor is substantially shut-off. Then, a Vpgm voltage is applied to a selected word line and a Vpass voltage is applied to unselected word lines and a channel voltage of the unselected cell string is boosted.

The self-boosting programming operation described above under some circumstances may not result in the pre-charging of the channel of the memory cell of an unselected cell string sharing the same word line as the selected memory cell. This can occur in a case, for example, where the threshold voltage Vth of a neighboring memory cell in the unselected cell string is greater than the ground voltage. In this case, the neighboring memory cell of the unselected cell string will not convey the applied power voltage Vcc properly to the memory cell of the unselected cell string sharing the same word line as the selected memory cell.

Without proper precharging of the memory cells of unselected cell strings, the threshold voltages of the other memory cells of the unselected cell strings can be modified when the selected memory cell is programmed. Modification of the threshold voltages in this manner can cause overlapping of the program and erase voltages of the affected cells, which can lead to device malfunction. As devices become more highly integrated, lowering of the programming voltage Vpgm and the pass voltage Vpass is desired, rendering the resulting device more susceptible to the threshold voltage overlapping problem. If so, the injection of electrons into a charge storage layer by F-N tunneling into an unselected string will not happen because the electric field between the gate and channel region is insufficient.

Another approach used for cell program inhibition is the "local boosting scheme," which is disclosed in U.S. Pat. No. 5,715,194 entitled "Bias Scheme of Program Inhibit for Random Programming in a NAND Flash Memory," and U.S. Pat. No. 6,061,270 entitled "Method for Programming a Non-Volatile Memory Device with Program Disturb Control," which are also herein incorporated by reference.

According to the local-boosting scheme, a voltage of 0V is applied to unselected word lines adjacent to the selected word line. A Vpass voltage, for example 10V, is applied to the other unselected word lines and a Vpgm voltage is applied to the selected word line. Prior to a programming operation to the selected word line, a sufficiently low voltage is applied to the adjacent unselected word lines. Under this biasing condition, the self-boosted channel of transistors is confined to the selected word line and the channel boosting voltage of inhibited cell transistors is increased as compared to that of self-boosting scheme. As a result, any F-N tunneling between the channel and the charge storage layer is prevented. In this regard, the adjacent unselected word line need not be directly next to a selected word line and the sufficiently low voltage does not require a ground voltage, but it may be sufficiently low enough to isolate the adjacent word line.

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

When it comes to programming method such as for example shadow programming, the term "upper" is used in the local sense not in the geometrical sense. In other words, the term upper may refer to the directional position in which shadow programming is performed. For example, if programming is performed in a direction from word line WLk to word line WL1, then the word line WL1 is an "upper" word line relative to word line WL2. If programming is performed in a direction from word line WL1 to word line WLk, then the WL2 word line is an "upper" word line relative to word line WL1.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

FIG. 1A shows a block diagram of a memory device in accordance with embodiments of the present invention. A memory device 1100 comprises a memory cell array 1110, control logic 1120, a voltage generator 1130, a row decoder 1140, a page buffer 1150, and a column decoder 1160. Though not shown in the figure, the memory cell array 1110 is comprised of a plurality of memory cells which are connected to word lines and bit lines. The memory cells may be arranged in a NAND or NOR memory cell configuration. In the case of a NAND structure, the memory cells that are arranged in series form cell strings. Memory cells connected to the same string share a common bit line.

Control logic 1120 is configured to control overall operation of the memory device. The control logic controls the sequential operations regarding programming, erase and reading actions. For example, control logic 1120 transmits signals to the voltage generator 1130, the row decoder 1140 and the column decoder 1160 in accordance with the operation to be performed, for example, erase, programming, and read operations.

The voltage generator 1130, controlled by the control logic 1120, generates voltages to be applied to components of the memory device such as selected word lines, unselected word lines, string select lines SSL, ground select lines GSL, and common source lines CSL. The voltage 1130 generator also generates the various voltage levels such as the Vpass, Vread, Verase, and Vstep voltages required for performing the device operations.

The row decoder 1140, controlled by the control logic 1120, drives the word lines WLk, string select lines SSL, ground select lines GSL, and common source lines CSL, in response to the row address. For example, in a programming operation, the row decoder applies a programming voltage Vpgm to a selected word line and a pass voltage Vpass to an unselected word line.

The page buffer 1150 operates as a sense amplifier and/or a write driver. In a reading operation, the page buffer reads data from a memory cell array 1110. The page buffer detects a bit line voltage, and latches the data to be detected. In a programming operation, depending on data I/O that is input through a column decoder 1160, the page buffer 1150 drives a power voltage Vcc or a ground voltage 0V to the corresponding bit lines.

The column decoder 1160 reads latched data from the page buffer, or delivers data to the page buffer in response to a column address. In other words, the column decoder 1160 determines which signals of the bit lines BLn of the device read by the page buffer 1150 are to be used in determining data values that are read, or determines voltages that are applied to the bit lines BLn during programming and erase operations.

Figure 1B:
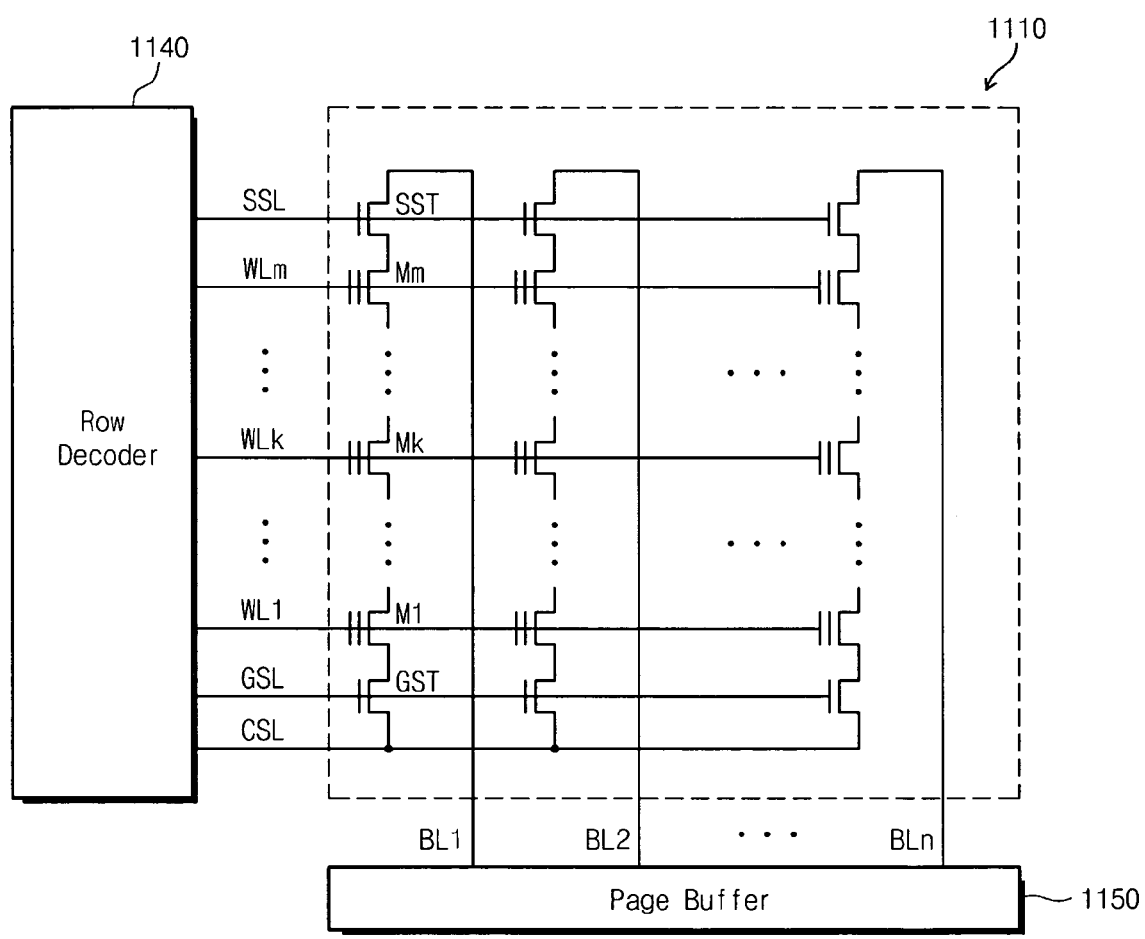
FIG. 1B is a block diagram of the memory cell array of the memory device of FIG. 1A, in accordance with embodiments of the present invention.

FIG. 1B is a block diagram of the memory cell array 1110, of the memory device 1100 of FIG. 1A, in accordance with embodiments of the present invention. In this figure, it can be seen that the row decoder 1140 applies the various voltage levels to the one of or more string select lines SSL, the word lines WLk, the ground select line GSL, and the common source line CSL. The page buffer 1150 is connected to the bit lines BLn of the device 1110.

Referring to FIG. 1B, a memory cell array 1110 comprises a plurality of word lines WL1 ... WLk, a plurality of bit lines BL1 ... BLn, and a plurality of memory cells M1 ... $M_{m,n}$. Word lines of the memory cell array are connected to a row decoder 1140. The row decoder 1140 is connected to the SSL, the word lines, the GSL and the CSL. Bit lines BLn of the memory cell array are connected to page buffers 1150. Cells can be arranged in two dimensions or three dimensions such as the arrangement of BICs available from Toshiba and TCATs available from Samsung Electronics Co., Ltd., for increased memory capacity. A detailed explanation of BICs devices is available in United States Patent Application Publication No. 2007/0252201 entitled "Nonvolatile Semiconductor Memory Device and Manufacturing Method Thereof," and detailed explanation of TCAT devices is disclosed in United States Patent Application Publication No. 2009/0121271 entitled "Vertical-type Non-volatile Memory Devices," which are also herein incorporated by reference.

Non-volatile memory devices, for example Flash memory devices, are commonly programmed as single-level cells (SLC), in that each cell stores a single bit of data. In order to increase memory size, research efforts have explored multiple-level cell (MLC) programming. In MLC programming, two or more bits of data are stored in each cell. For example, in the case where two bits of data are stored in a memory cell, least significant bit (LSB) data and most significant bit (MSB) data are stored in each cell. In other words, in a case where a data value '10' is stored in a memory cell, the MSB data is "1" and the LSB data is "0." By adopting multi-bit programming, memory capacity can be increased without increasing memory size.

Figure 2:
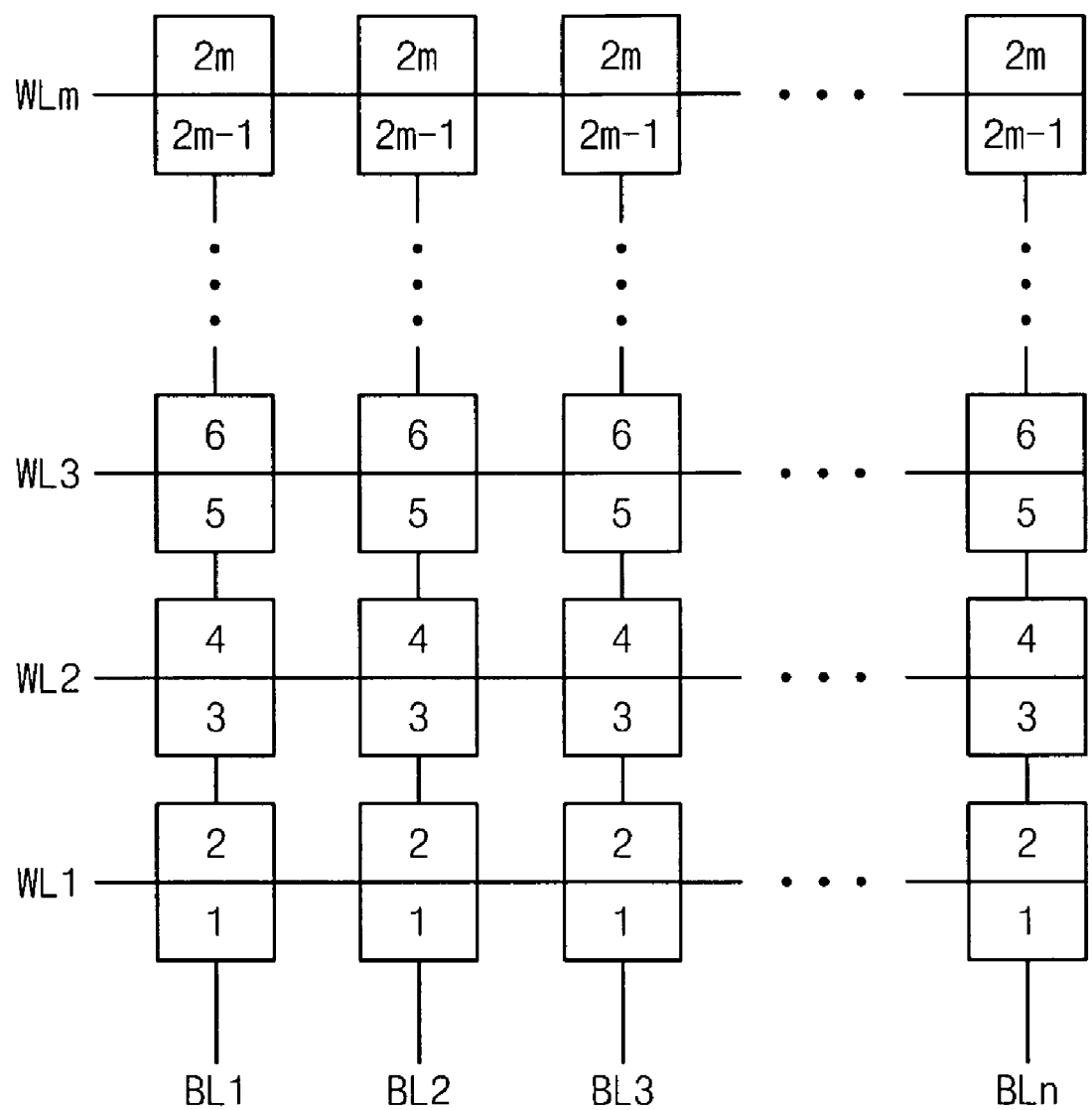
FIG. 2 is a conceptual diagram explaining the programming of a multiple-level memory cell.

FIG. 2 is a conceptual diagram explaining the programming of a multiple-level memory cell. In the conceptual drawing, each memory cell is positioned at a cross-point where word lines WLm and bit line BLn intersect. As one of exemplified embodiments, one memory block comprises 2m pages (page 1 to page 2m). In other words, each memory cell stores LSB and MSB data, and thus, one memory block can store two pages. According to FIG. 2, memory cells connected to word line 1 WL1 store page 1 in the form of LSB data and store page 2 in the form of MSB data.

In this regard, if the sequence of the programming operation is such that after MSB data is programmed in a given memory cell, LSB data is then programmed in a memory cell neighboring, or spatially next to, the given memory cell, the data previously programmed in the memory cell can be inadvertently changed due to cell disturbance. For example, if LSB data are programmed in WL2 after both LSB and MSB are programmed in WL1, the LSB or MSB data programmed in WL1 may be inadvertently changed due to cell disturbance.

In order to prevent this unwanted phenomenon caused by the cell disturbance, shadow programming has been adopted. Shadow programming is a method of programming by which LSB data is programmed to a neighboring memory cell ($MC_{k+1}$) that neighbors a given memory cell ($MC_k$) before MSB data is programmed to the given memory cell ($MC_k$). Therefore, the likelihood of cell disturbance in the given memory cell caused by programming of the LSB data of the neighboring memory cell is reduced.

Figure 3:
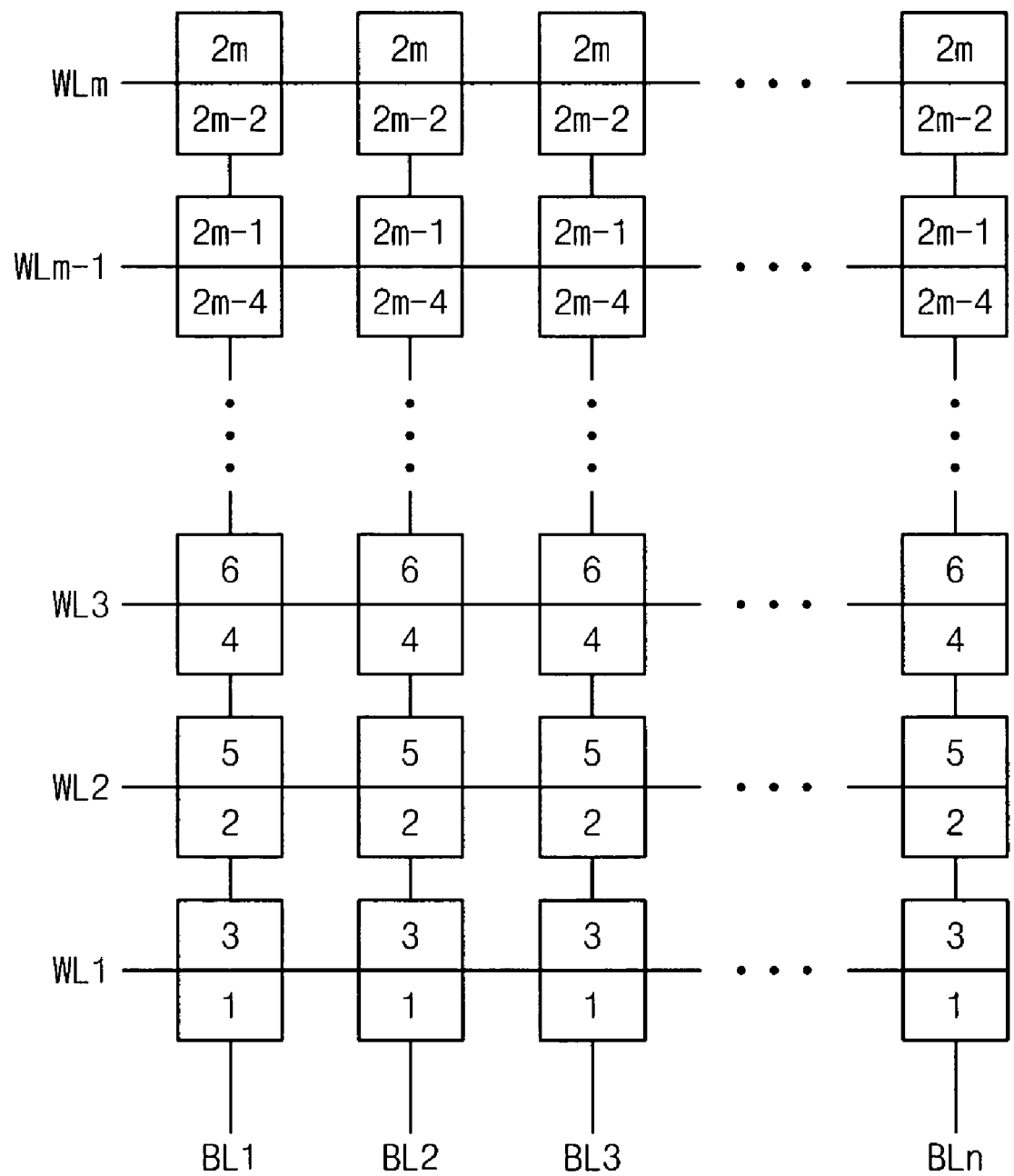
FIG. 3 is a conceptual diagram explaining the programming of a multiple-level memory cell according to a shadow-programming operation.

FIG. 3 is a conceptual diagram explaining the programming of a multiple-level memory cell according to a shadow-programming operation. Referring to FIG. 3, before MSB data is programmed to a given cell, LSB should already have been programmed to a neighboring memory cell directly next to the given cell. According to FIG. 3, the influence of the cells connected to WL1 caused by LSB programming of the cells connected to WL2 is minimized. The reason is that the span of voltage change during programming of LSB from an erase state to an LSB programmed state may be done at a relatively lower level than the targeted threshold voltage. Thus, the LSB programming in the adjacent memory cell would not seriously affect the programmed memory cell. In this regard, the span of voltage change refers to the magnitude of voltage change from the initial state to the resultant state. It should be noted that even though the multiple-programmed cell in this embodiment is a two-bit multiple-cell, embodiments of the present invention are not restricted to two-bit multi-cell programming; but rather can be adopted to n-bit multi-cell programming in accordance with the technical concept of the present invention.

However, in the case of a shadow programming, the self-boosting of a channel may not necessarily be delivered to the channel neighboring a selected word line; thus reducing the efficiency of the self-boosting operation. The reasons for this will be discussed with the help of the following figure.

Figure 4:
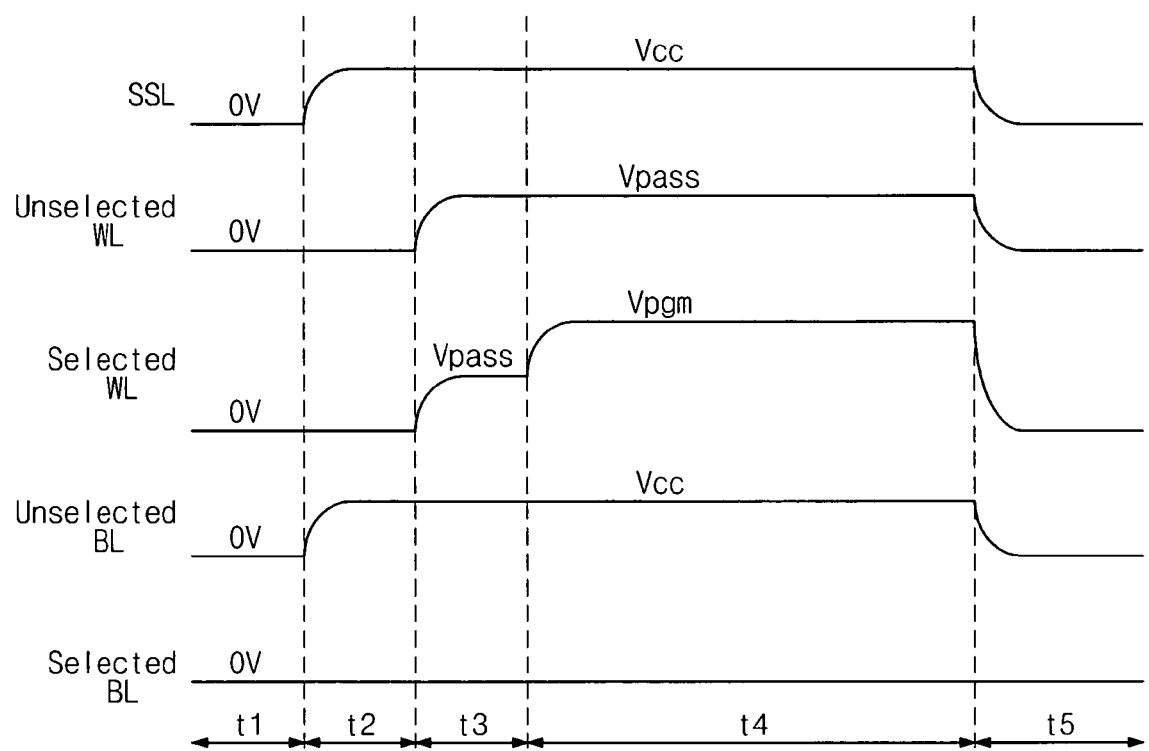
FIG. 4 is a timing diagram of signals applied to a memory cell array illustrating a reduction in the efficiency of self-boosting.

FIG. 4 is a timing diagram of signals applied to a memory cell array illustrating a reduction in the efficiency of self-boosting.

Referring to the timing diagram of FIG. 4, a programming operation may be partitioned into five stages. Stage t1 refers to an initialization stage when a ground voltage 0V is applied to respective lines such as SSL, unselected WL, selected WL, unselected BL and selected BL. Stage t2 is the stage when bit lines are set up. In other words, a ground voltage is applied to a selected bit line and Vcc is applied to an unselected bit line and the string select line SSL. At stage t3, a Vpass voltage is applied to the neighboring unselected word line $WL_{k+1}$ and the selected word line WLk. During the t3 stage, memory cells connected to the selected and unselected word lines turn on. At stage t4, the programming voltage application stage, a programming voltage Vpgm is applied to the selected word lines while Vpass is applied to the unselected word lines. At stage t5, the recovery stage, the ground voltage is applied to all lines.

At the t2 stage, the string select transistor SST turns on as Vcc is applied to the string select line SSL. However, when LSB data is programmed to the upper neighboring unselected cell $MC_{k+1}$, connected to the upper neighboring unselected word line, according to shadow programming, the threshold voltage of memory cell transistor $MC_{k+1}$ may be higher than a ground voltage 0V and the upper unselected memory cell may therefore not turn on. The efficiency of self-boosting is therefore low and the problem that the unselected memory cell connected the selected word line can become programmed may happen because the beneficial effect of the Vcc self-boosting voltage level does not reach the channel regions between the upper unselected memory cell and the memory cell connected to the selected word line.

Figure 5A:
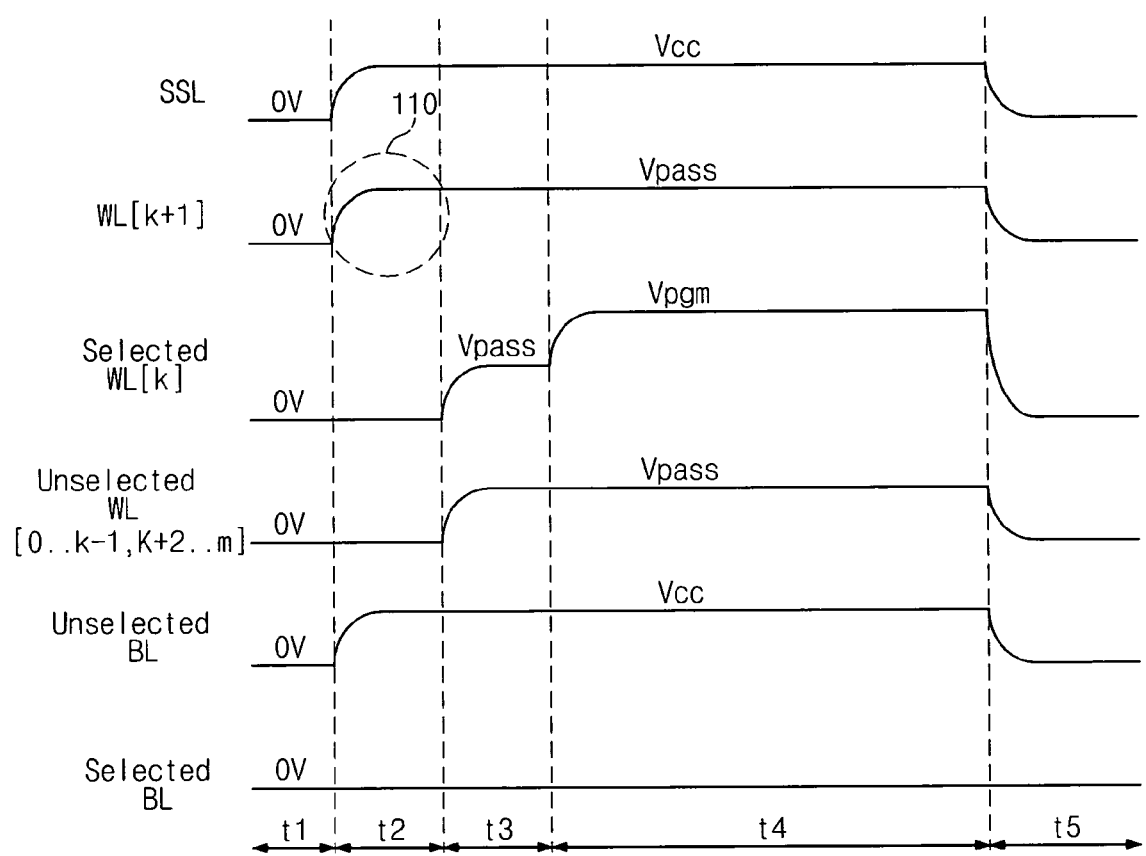
FIG. 5A is a timing diagram of signals applied to a memory cell array illustrating a memory cell programming operation in accordance with an embodiment of the present invention.

FIG. 5A is a timing diagram of signals applied to a memory cell array illustrating a memory cell programming operation in accordance with an embodiment of the present invention. Referring to the timing diagram of FIG. 5A, a programming operation in accordance with embodiments of the present invention can be partitioned into five stages. The t1 stage refers to the initialization stage when the ground voltage 0V is applied to respective lines such as string select line SSL, the unselected word lines, the selected word line, the unselected bit line and the selected bit line. At the t2 stage, a power voltage, Vcc is applied to the string select line SSL and the unselected bit lines, a pass voltage Vpass is applied to the upper unselected word line, WL[k+1] and the ground voltage is applied to word lines other than the unselected upper word line WL[k+1]. At stage t3, a Vpass voltage is applied to all unselected word lines and to the selected word line WL[k]. At stage t4, the programming stage, a Vpass voltage is applied to all unselected word lines and a programming voltage Vpgm is applied to the selected word line WL[k]. At stage t5, the recovery stage, the ground voltage is applied to all lines.

In an embodiment of the present invention, the Vpass voltage is applied to the upper unselected word line, $WL_{k+1}$, which is the upper directly neighboring word line to the selected word line WL[k]. Irrespective of whether LSB data is to be programmed on the upper unselected word line, the cell transistor connected to the upper, unselected, word line will turn on. As a result, the beneficial effect of the self-boosting Vcc voltage applied to the unselected bit line is made to reach the unselected memory cell MCk, which is connected the selected word line WL[k], thus enhancing the efficiency of self-boosting. The unwanted programming of the unselected memory cell connected to the selected word line is thus prevented.

Figure 5B:
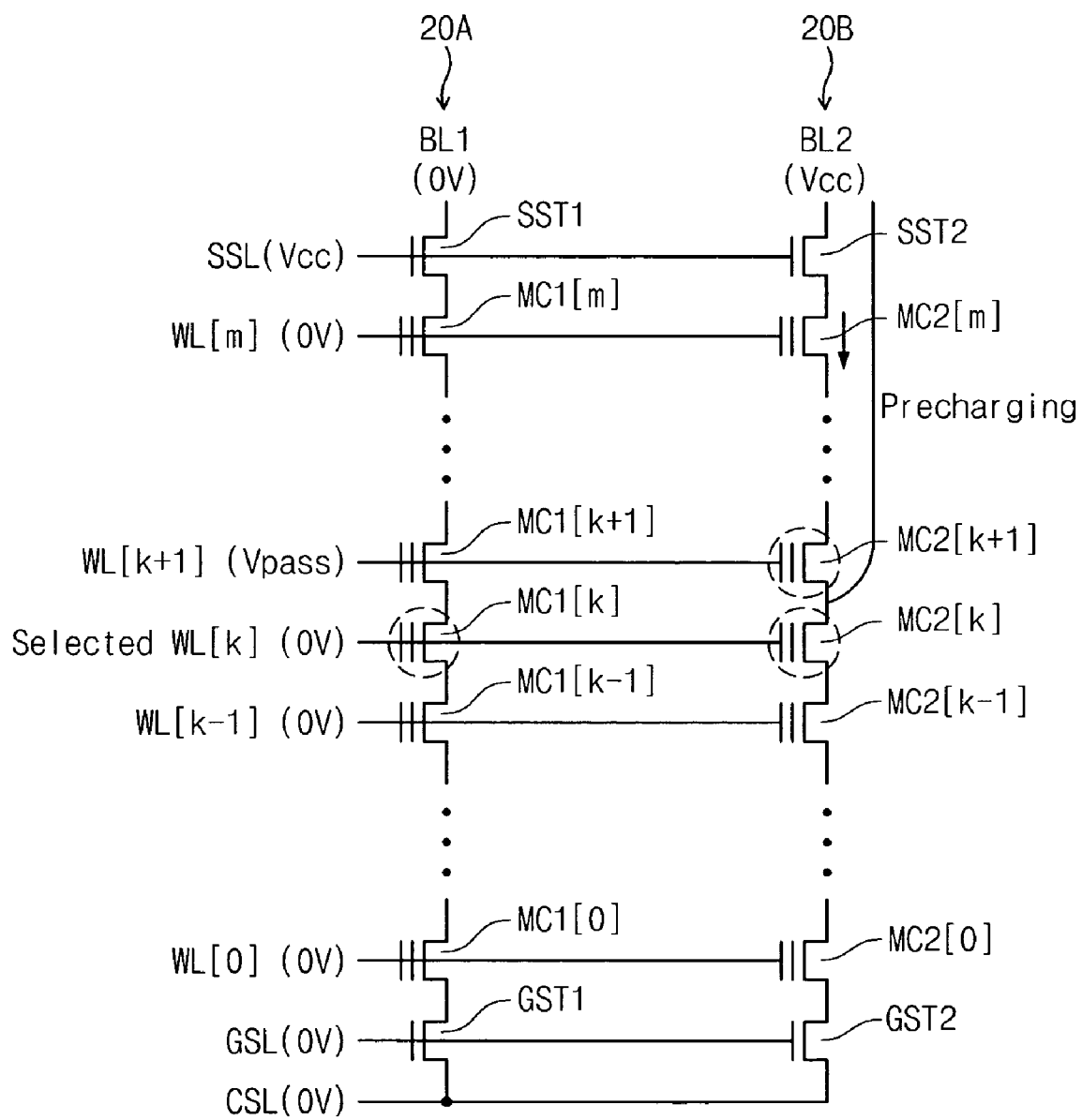
FIG. 5B is a schematic diagram of a memory cell array illustrating a memory cell programming operation during time stage t2 of the timing diagram of FIG. 5A, in accordance with an embodiment of the present invention.

FIG. 5B is a schematic diagram of a memory cell array illustrating a memory cell programming operation during time stage t2 of the timing diagram of FIG. 5A, in accordance with an embodiment of the present invention. Referring to FIG. 5B, a memory cell array comprises a plurality of memory cells MC arranged in rows and columns. A plurality of first memory cells MC1 are arranged in series between a first string select transistor SST1 and a first ground select transistor GST1. Together, the first memory cells MC1, the first string select transistor SST1 and the first ground select transistor GST1 combine to form a first cell string 20A. A plurality of second memory cells MC2 are similarly arranged in series between a second string select transistor SST2 and a second ground select transistor GST2. Together, the second memory cells MC2, the second string select transistor SST2 and the second ground select transistor GST2 combine to form a second cell string 20B. A first bit line BL1 of the device is connected to the first string select transistor SST1 of the first string 20A and a second bit line BL2 of the device is connected to the second string select transistor SST2 of the second string 20B. In this embodiment, the common source line CSL is connected to each of the ground select transistors GSTn, as shown. Gates of corresponding ground select transistors GST1, GST2, . . . , GSTn are connected to a ground select line GSL of the device. Gates of corresponding string select transistors SST1, SST2, . . . , SSTn are connected to a string select line SSL of the device. Control gates of corresponding memory cell transistors MC1[m], MC2[m], . . . MCn[m] of different cell strings 20A, 20B are connected to a word line WL[m] of the device. In this example, the reference letter "m" refers to the number of memory cell transistors MC1[m] in each cell string, and the reference letter "n" refers to the number of cell strings in the memory cell block.

During a programming operation of the memory cell array in accordance with embodiments of the present invention, a memory cell transistor MC1[k] is selected for programming and BL1 will be a selected bit line and BL2 will be an unselected bit line. In particular, a first voltage is applied to a selected word line WL[k] corresponding to a selected memory cell of a selected transistor string 20A to be programmed.

During a first, initialization, stage corresponding to time stage, t1, in this example, a ground voltage 0V is applied to the selected bit line BL1 connected to the selected cell string 20A, a ground voltage 0V is applied to the unselected bit lines BL2, a ground voltage 0V is applied to the string select line SSL, a ground voltage 0V is applied to the ground select line GSL, and a ground voltage 0V is applied to the common source line CSL. Also, a ground voltage 0V is applied to the selected word line WL[k] and a ground voltage is applied to the unselected word lines WL[0], WL[k−1], WL[k+1], . . . , WL[m].

During a second stage corresponding to time stage t2, in this example, a ground voltage 0V remains applied to the selected bit line BL1. A power voltage Vcc is applied to the unselected bit lines BL2 and a power voltage Vcc is applied to the string select line SSL. A ground voltage 0V remains applied to the ground select line GSL, and a ground voltage 0V remains applied to the common source line CSL. Also, a ground voltage 0V is applied to the selected word line WL[k] and a ground voltage is applied to the unselected word lines WL[0], . . . , WL[k−1], WL[k+2], WL[m]. In contrast, a pass voltage Vpass is applied to the word line WL[k+1] neighboring the selected word line WL[k] and positioned between the selected word line WL[k] and the string select line SSL.

The application of the pass voltage Vpass to the neighboring word line WL[k+1], highlighted as region 110 of the timing diagram of FIG. 5A, ensures self-boosting of the channel region of the neighboring transistors MC2[k+1] of the other, unselected cell strings 20B. In this manner, pre-charging of the channel regions of other, unselected, transistor strings 20B can be confirmed to reach the channel regions of the transistors MC2[k] sharing the same word line as WL[k] as the transistor MC1[k] selected for programming. During this stage, the memory cells MC1[k+1], MC2[k+1], MCn[k+1] connected to the neighboring word line WL[k+1] are all turned on, irrespective of any pre-existing programming operation that may have previously occurred on those cells MC1[k+1], MC2[k+1], MCn[k+1]. For example, LSB programming as part of a shadow programming operation of a multiple-level cell may have occurred on those cells, leaving residual charge in their respective charge storage layers that would affect the threshold voltages Vth of those cells. By applying the pass voltage Vpass to the neighboring word line WL[k+1] in the second stage corresponding to time stage t2, prior to application of the programming voltage Vpgm to the selected word line during subsequent t3 and t4 stages, the neighboring memory cells MC1[k+1], MC2[k+1], MCn[k+1] are all turned on, and therefore, the Vcc voltage applied to the unselected bit lines BL2, can be applied to the channel regions of the transistors MC2[k] sharing the same word line as WL[k] as the transistor MC1[k] selected for programming; therefore, those channel regions are self-boosted to the voltage level Vcc applied to the bit line BL2 minus the threshold voltage Vth of the string select transistor SST2. As a result of the self-boosting of the transistors MC2[k] sharing the same word line as WL[k] as the transistor MC1[k] selected for programming, any disturbance of the pre-existing threshold voltages Vth of memory cell transistors MC2[k] is mitigated or eliminated during the programming operation of the selected memory cell transistor MC1[k].

During a third stage corresponding to time stage t3, in this example, a ground voltage 0V remains applied to the selected bit line BL1 and the power voltage Vcc remains applied to the unselected bit line BL2 and the string select line SSL. A ground voltage 0V remains applied to the ground select line GSL, and a ground voltage 0V remains applied to the common source line CSL. A pass voltage Vpass is now applied to the selected word line WL[k] and to the unselected word lines WL[0], . . . , WL[k−1], WL[k+2], . . . , WL[m]. A pass voltage Vpass also remains applied to the word line WL[k+1] neighboring the selected word line WL[k] and positioned between the selected word line WL[k] and the string select line SSL.

During a fourth stage corresponding to time stage t4, in this example, a ground voltage 0V remains applied to the selected bit line BL1 and the power voltage Vcc remains applied to the unselected bit line BL2 and the string select line SSL. A ground voltage 0V remains applied to the ground select line GSL, and a ground voltage 0V remains applied to the common source line CSL. The pass voltage Vpass remains applied to the unselected word lines WL[0], . . . , WL[k−1], WL[k+2], . . . , WL[m], and remains applied to the word line WL[k+1] neighboring the selected word line WL[k] and positioned between the selected word line WL[k] and the string select line SSL. A programming voltage Vpgm is now applied to the selected word line WL[k] to perform the programming operation on the selected memory cell MC1[k].

The channel voltage which is connected to bit line BL2 remains in a floating state by applying the Vcc voltage to BL2 and thus, the channel voltage becomes boosted during the fourth programming stage. The voltage difference across the gate and the channel in the MC2[k] is small for being programmed and the MC2[k] cell is therefore in a program inhibit situation in accordance with self-boosting.

During a fifth, recovery, stage corresponding to time stage t5, in this example, a ground voltage 0V is applied to the selected bit line BL1, a ground voltage 0V is applied to the unselected bit line BL2, a ground voltage 0V is applied to the string select line SSL, a ground voltage 0V is applied to the ground select line GSL, and a ground voltage 0V is applied to the common source line CSL. Also, a ground voltage 0V is applied to the selected word line WL[k] and to the unselected word lines WL[0], . . . , WL[k−1], WL[k+1], . . . , WL[m], including the unselected word line WL[k+1] neighboring the selected word line WL[k] and positioned between the selected word line WL[k] and the string select line SSL.

In an example embodiment, the programming voltage Vpgm can be about 15-23V, for example 20V, the pass voltage Vpass can be about 7-12V for example 10V, and the Vcc voltage can be about 1.5 to 3.5 V. As scaling of the device is further progressed, the level of voltage may continue to be reduced, and thus, the levels of voltage described herein should be merely considered as an example. Other voltage values are equally applicable to the principles of the embodiments of the invention disclosed herein.

While the above embodiment illustrates, during the second stage corresponding to time stage t2 of FIG. 5A, that the application of the Vpass voltage to the unselected word line WL[k+1] neighboring the selected word line WL[k] and positioned between the selected word line WL[k] and the string select line SSL is synchronized with the application of the power voltage Vcc to the string select line SSL and to the unselected bit line BL2, such synchronization is optional and not necessary. What is of significance in this case is that the application of the Vpass voltage to the unselected word line WL[k+1] neighboring the selected word line WL[k] and positioned between the selected word line WL[k] and the string select line SSL precedes the initiation of the programming operation of the selected memory cell MC1[k], for example, at the time the programming voltage Vpgm is applied to the selected word line WL[k] at time stage t4.

Figure 6A:
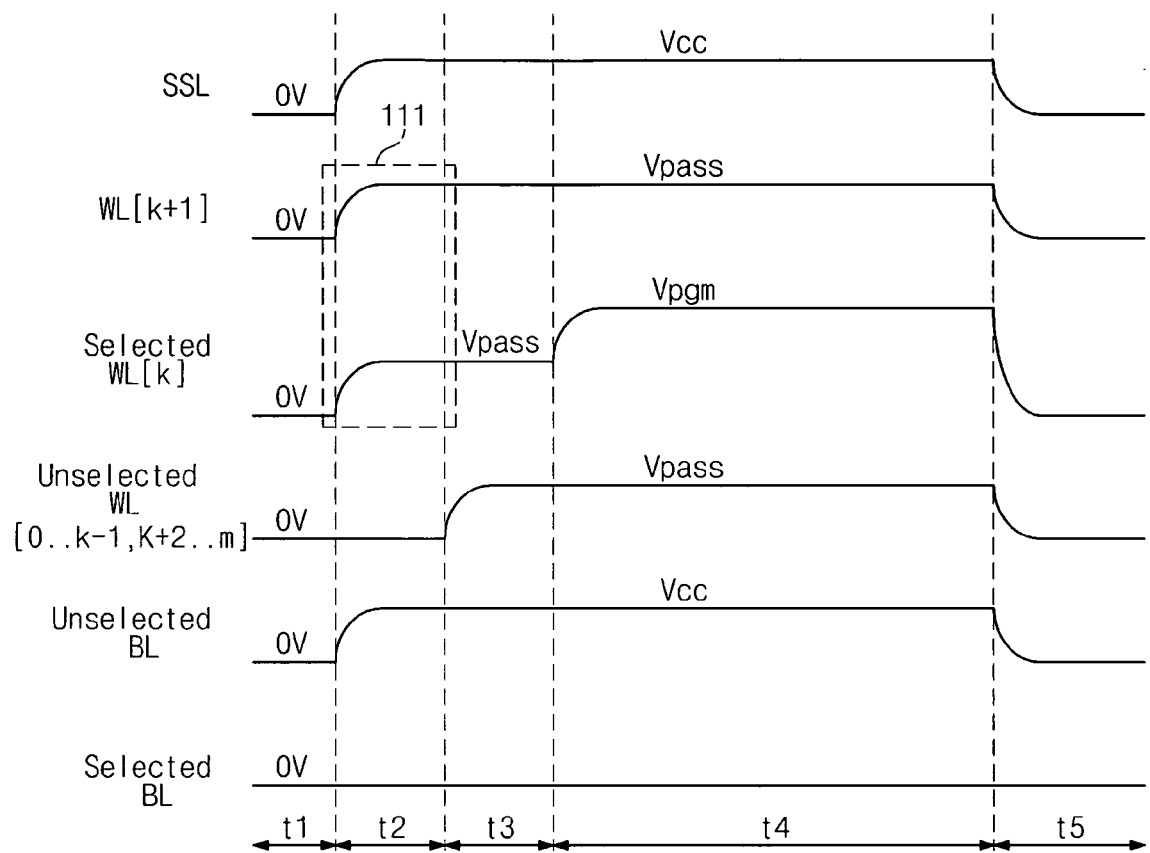
Figure 6B:
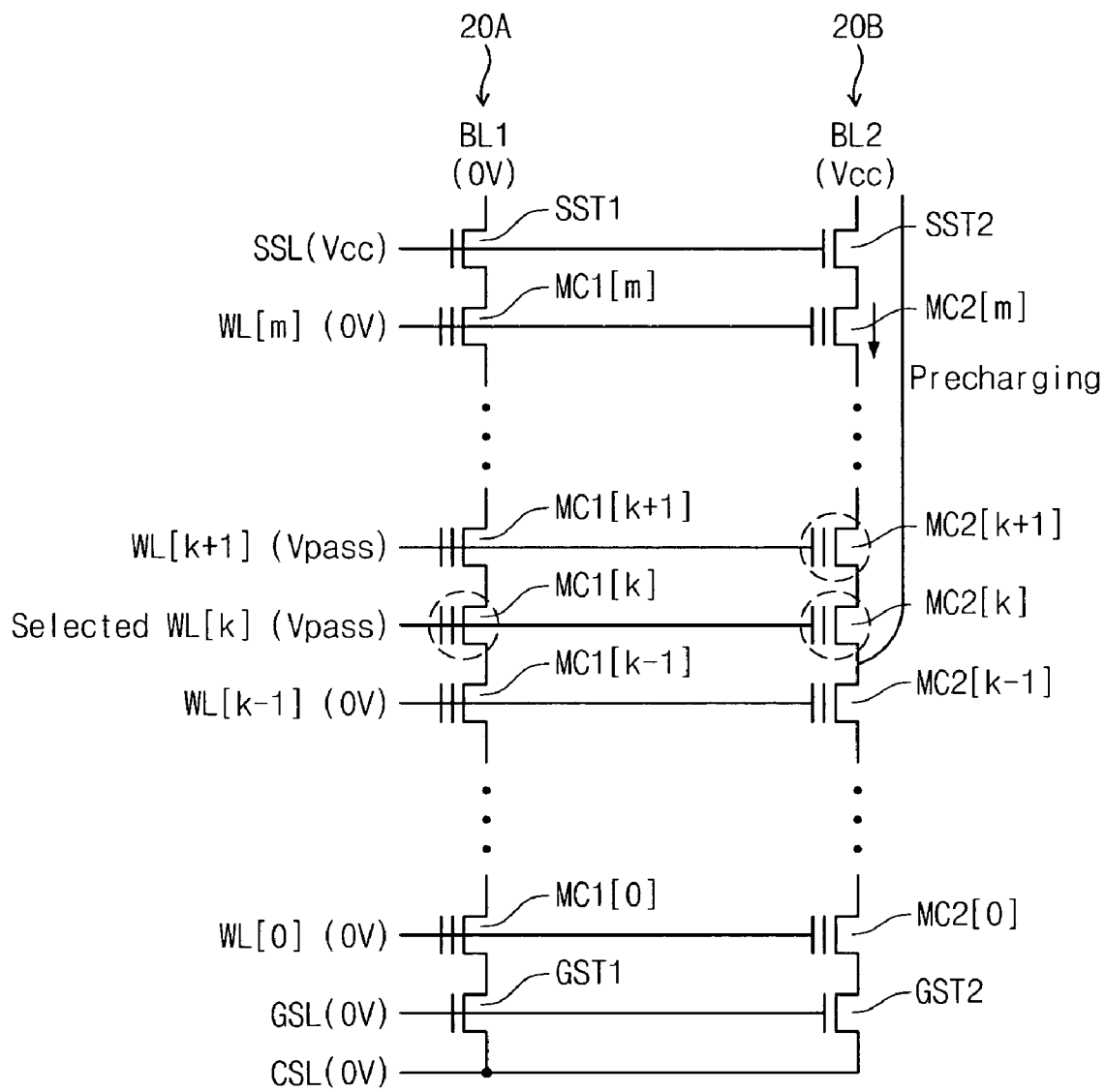

FIG. 6A is a timing diagram of signals applied to a memory cell array illustrating a memory cell programming operation in accordance with another embodiment of the present invention. FIG. 6B is a schematic diagram of a memory cell array illustrating a memory cell programming operation during time stage t2 of the timing diagram of FIG. 6A, in accordance with another embodiment of the present invention.

The programming operation of the embodiment of FIGS. 6A and 6B is similar to that shown and described above in connection with FIGS. 5A and 5B in that the application of the Vpass voltage to the unselected word line WL[k+1] neighboring the selected word line WL[k] and positioned between the selected word line WL[k] and the string select line SSL precedes the initiation of the programming operation of the selected memory cell MC1[k] at time stage t4. A distinction lies in this embodiment in that at the time the Vpass voltage is applied to the unselected neighboring word line WL[k+1] and the Vpass voltage is also applied to the selected word line WL[k], as highlighted at region 111 of the timing diagram of FIG. 6A. Application of the Vpass voltage at an earlier time further enhances the pre-charging of the channel region of the MC2[k] memory cell transistor sharing the same word line as WL[k] as the transistor MC1[k] selected for programming.

As in the above example embodiment of FIGS. 5A and 5B, in the present embodiment of FIGS. 6A and 6B, application of the Vpass voltage during time stage t2, to the neighboring word line WL[k+1] ensures self-boosting of the channel region of the neighboring transistor MC2[k+1] of the other, unselected cell strings 20B, and therefore, self-boosting of the memory cell transistors MC2[k] sharing the same word line as WL[k] as the memory cell transistor MC1[k] selected for programming. As a result of the self-boosting of the memory cell transistors MC2[k] sharing the same word line as WL[k] as the transistor MC1[k] selected for programming, any disturbance of the pre-existing threshold voltages Vth of memory cell transistors MC2[k] is mitigated or eliminated during the programming operation of the selected memory cell transistor MC1[k], as described above.

Figure 7A:
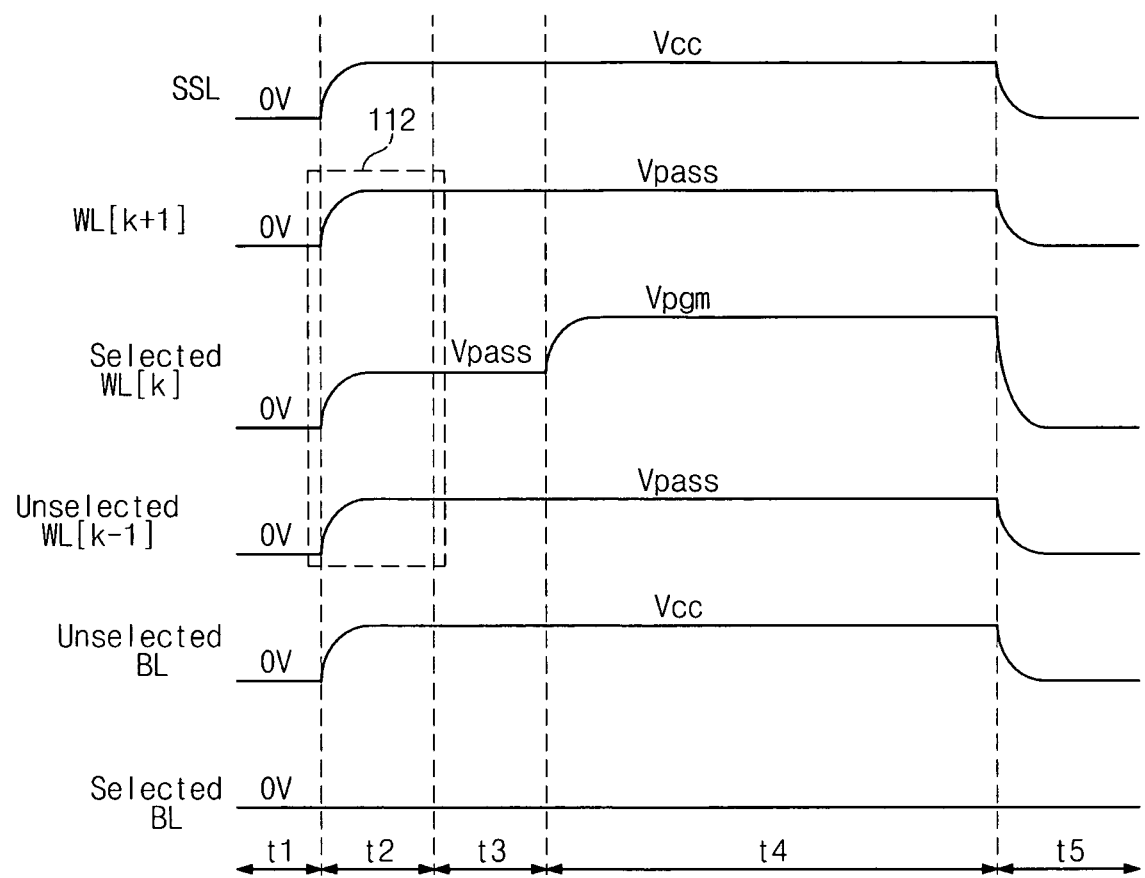
Figure 7B:
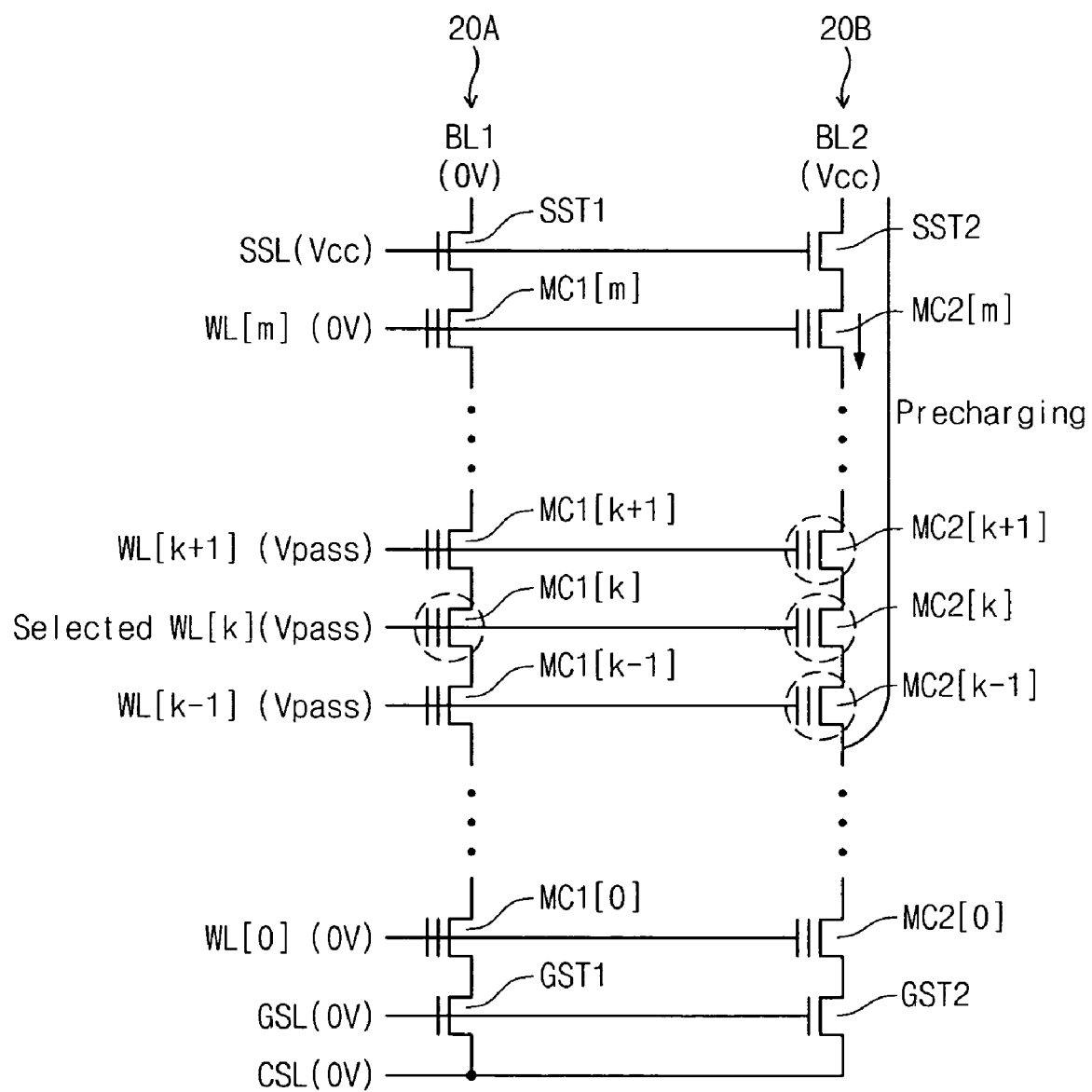

FIG. 7A is a timing diagram of signals applied to a memory cell array illustrating a memory cell programming operation in accordance with another embodiment of the present invention. FIG. 7B is a schematic diagram of a memory cell array illustrating a memory cell programming operation during time stage t2 of the timing diagram of FIG. 7A, in accordance with another embodiment of the present invention.

The programming operation of the embodiment of FIGS. 7A and 7B is similar to that shown and described above in connection with FIGS. 1 and 2 above in that the application of the Vpass voltage to the unselected word line WL[k+1] neighboring the selected word line WL[k] and positioned between the selected word line WL[k] and the string select line SSL precedes the initiation of the programming operation of the selected memory cell MC1[k] at time stage t4. A distinction lies in this embodiment in that at the time the Vpass voltage is applied to the unselected neighboring word line WL[k+1], the Vpass voltage is also applied to the selected word line WL[k], and to the unselected word line WL[k−1] neighboring the selected word line WL[k] and positioned between the selected word line WL[k] and the ground select line GSL, as highlighted as region 112 of the timing diagram of FIG. 7A. Application of the Vpass voltage at an earlier time further enhances the pre-charging of the channel of the MC2[k] memory cell transistor sharing the same word line as WL[k] as the transistor MC1[k] selected for programming, by turning on both neighboring transistors MC2[k+1], MC2[k−1] to pre-charge their channel regions and to further ensure pre-charging of the channel region of the MC2[k] memory cell transistors.

As in the above example embodiments of FIGS. 1 and 6, in the present embodiment of FIGS. 7A and 7B, application of the Vpass voltage during time stage t2, to the neighboring word line WL[k+1] and positioned between the selected word line WL[k] and the string select line SSL and to the neighboring word line WL[k−1] positioned between the selected word line WL[k] and the ground select line GSL further ensures self-boosting of the channel region of the neighboring transistors MC2[k+1], MC2[k−1] of the other, unselected cell strings 20B, and therefore, self-boosting of the memory cell transistors MC2[k] sharing the same word line as WL[k] as the memory cell transistor MC1[k] selected for programming. As a result of the self-boosting of the transistors MC2[k] sharing the same word line as WL[k] as the transistor MC1[k] selected for programming, any disturbance of the pre-existing threshold voltages Vth of the unselected memory cell transistors MC2[k] is mitigated or eliminated during the programming operation of the selected memory cell transistor MC1[k], as described above.

Figure 8A:
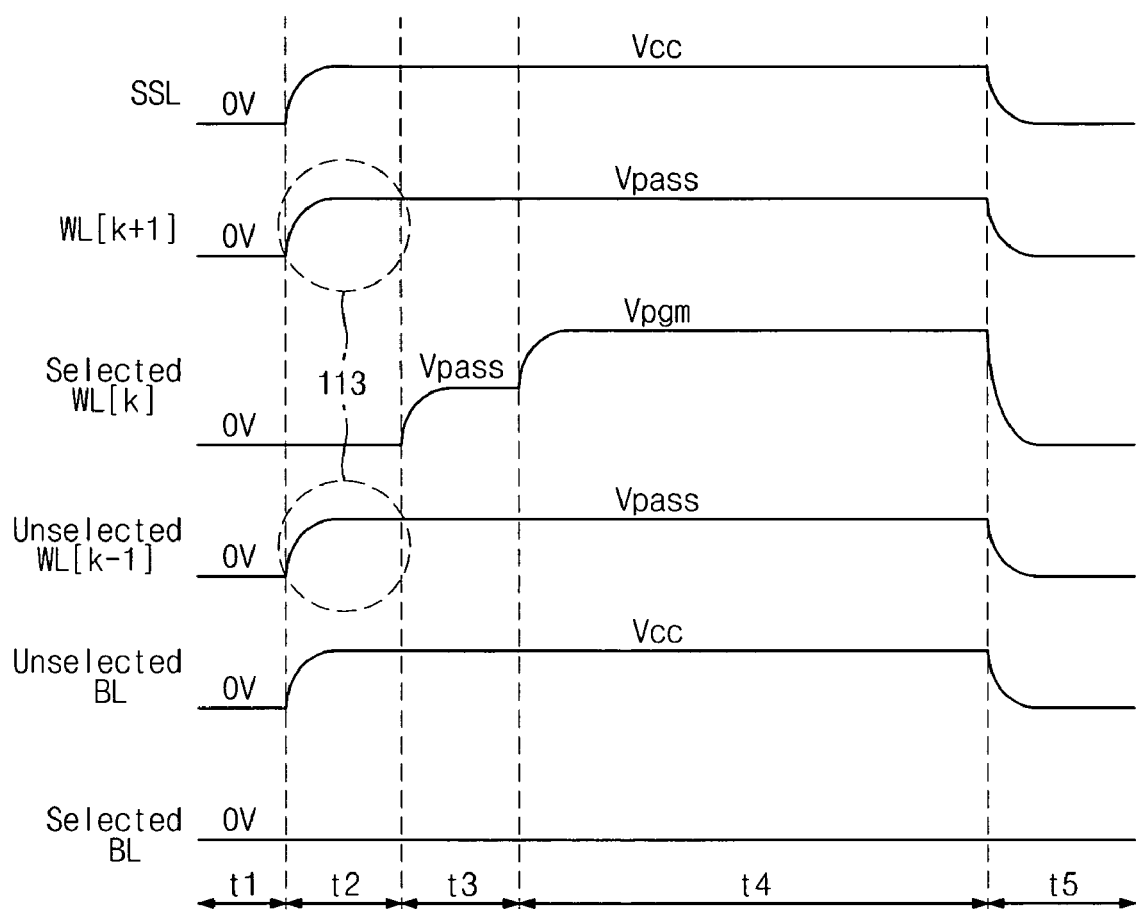
Figure 8B:
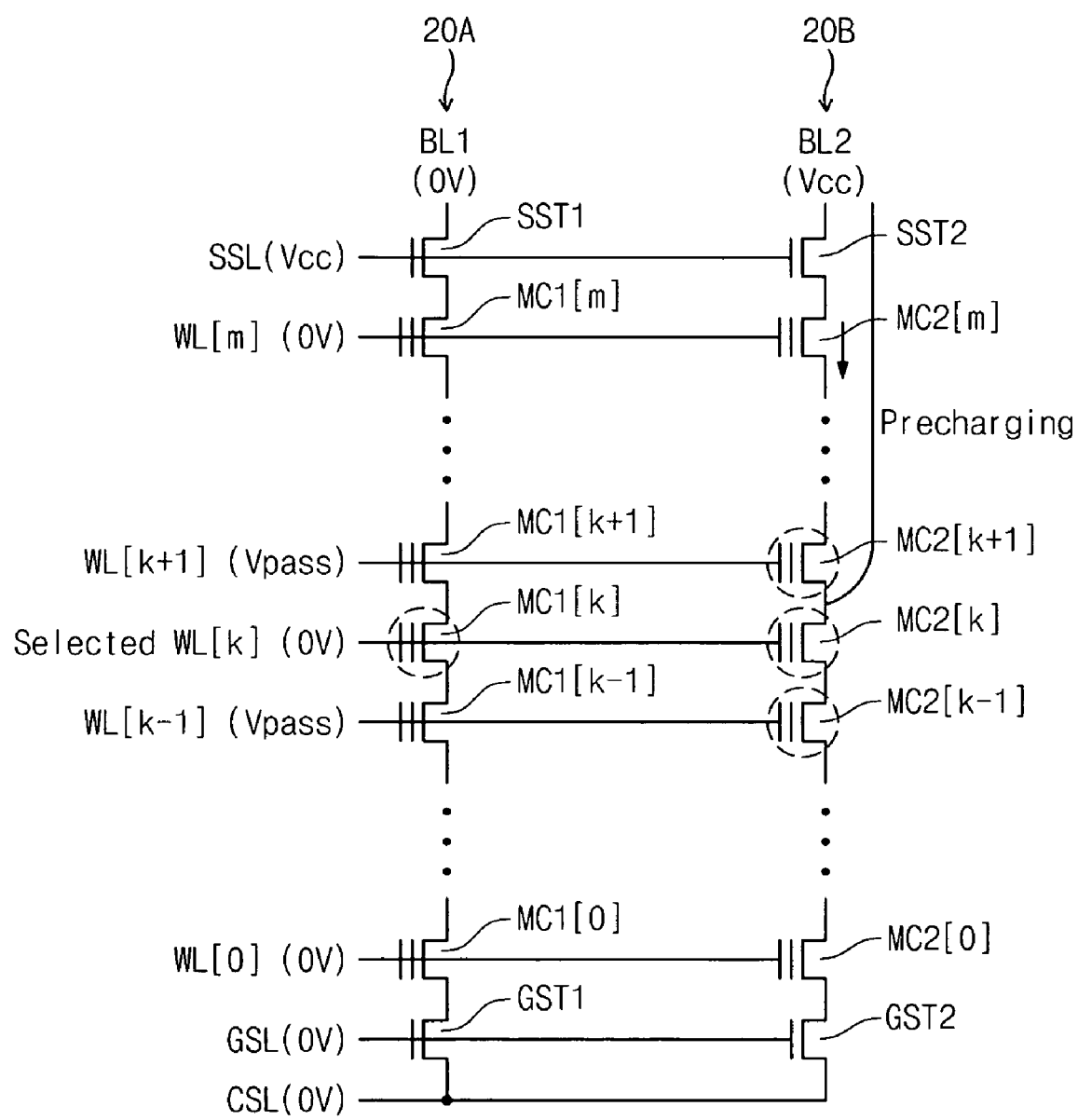

FIG. 8A is a timing diagram of signals applied to a memory cell array illustrating a memory cell programming operation in accordance with another embodiment of the present invention. FIG. 8B is a schematic diagram of a memory cell array illustrating a memory cell programming operation during time stage t2 of the timing diagram of FIG. 8A, in accordance with another embodiment of the present invention.

The programming operation of the embodiment of FIGS. 8A and 8B is similar to that shown and described above in connection with FIGS. 1-7 above in that the application of the Vpass voltage to the unselected word line WL[k+1] neighboring the selected word line WL[k] and positioned between the selected word line WL[k] and the string select line SSL precedes the initiation of the programming operation of the selected memory cell MC1[k] at time stage t4. A distinction lies in this embodiment in that at the time the Vpass voltage is applied to the unselected neighboring word line WL[k+1], the Vpass voltage is also applied to the unselected word line WL[k−1] neighboring the selected word line WL[k] and positioned between the selected word line WL[k] and the ground select line GSL, as highlighted at region 113 of the timing diagram of FIG. 8A. Application of the Vpass voltage at an earlier time further enhances the pre-charging of the channel of the MC2[k] memory cell transistor sharing the same word line as WL[k] as the transistor MC1[k] selected for programming, by turning on both neighboring transistors MC2[k+1], MC2[k−1] to pre-charge their channel regions and to further ensure pre-charging of the channel region of the MC2[k] memory cell transistors.

As in the above example embodiments of FIGS. 5-7, in the present embodiment of FIGS. 8A and 8B, application of the Vpass voltage during time stage t2, to the neighboring word line WL[k+1] and positioned between the selected word line WL[k] and the string select line SSL and to the neighboring word line WL[k−1] and positioned between the selected word line WL[k] and the ground select line GSL further ensures self-boosting of the channel region of the neighboring transistors MC2[k+1], MC2[k−1] of the other, unselected cell strings 20B, and, therefore, self-boosting of the memory cell transistors MC2[k] sharing the same word line as WL[k] as the memory cell transistor MC1[k] selected for programming. Since the neighboring unselected transistor MC2[k−1] is activated in advance of the programming operation, the channel voltage of the unselected transistor MC2[k] can be increased more rapidly, thereby enhancing self-boosting efficiency. As a result of the self-boosting of the transistors MC2[k] sharing the same word line as WL[k] as the transistor MC1[k] selected for programming, any disturbance of the pre-existing threshold voltages Vth of the unselected memory cell transistors MC2[k] is mitigated or eliminated during the programming operation of the selected memory cell transistor MC1[k], as described above.

In the embodiments described herein, including those described in connection with FIGS. 5-8 above, and other embodiments, the Vpass voltage can, during time stage t2, further be applied to other, unselected word lines WL[0, ..., k−2; k+2, ..., m] at the time the Vpass voltage is applied to the neighboring unselected word lines WL[k+1] or WL[k−1] or to the selected word line WL[k]. Alternatively, the other, unselected, word lines WL[0, ..., k−2; k+2, ..., m] can have another voltage, such as a ground voltage 0 V applied to them during this time stage t2.

Figure 9A:
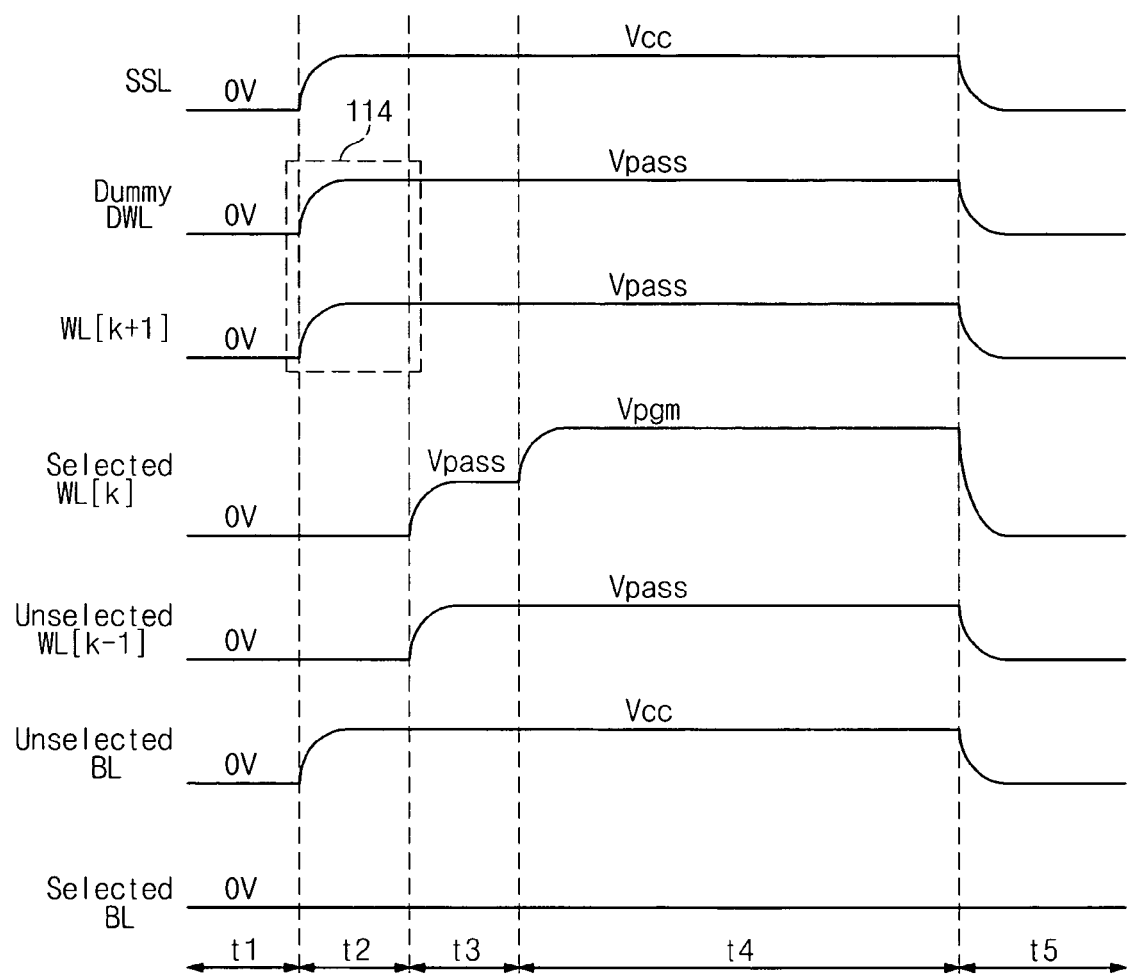
Figure 9B:
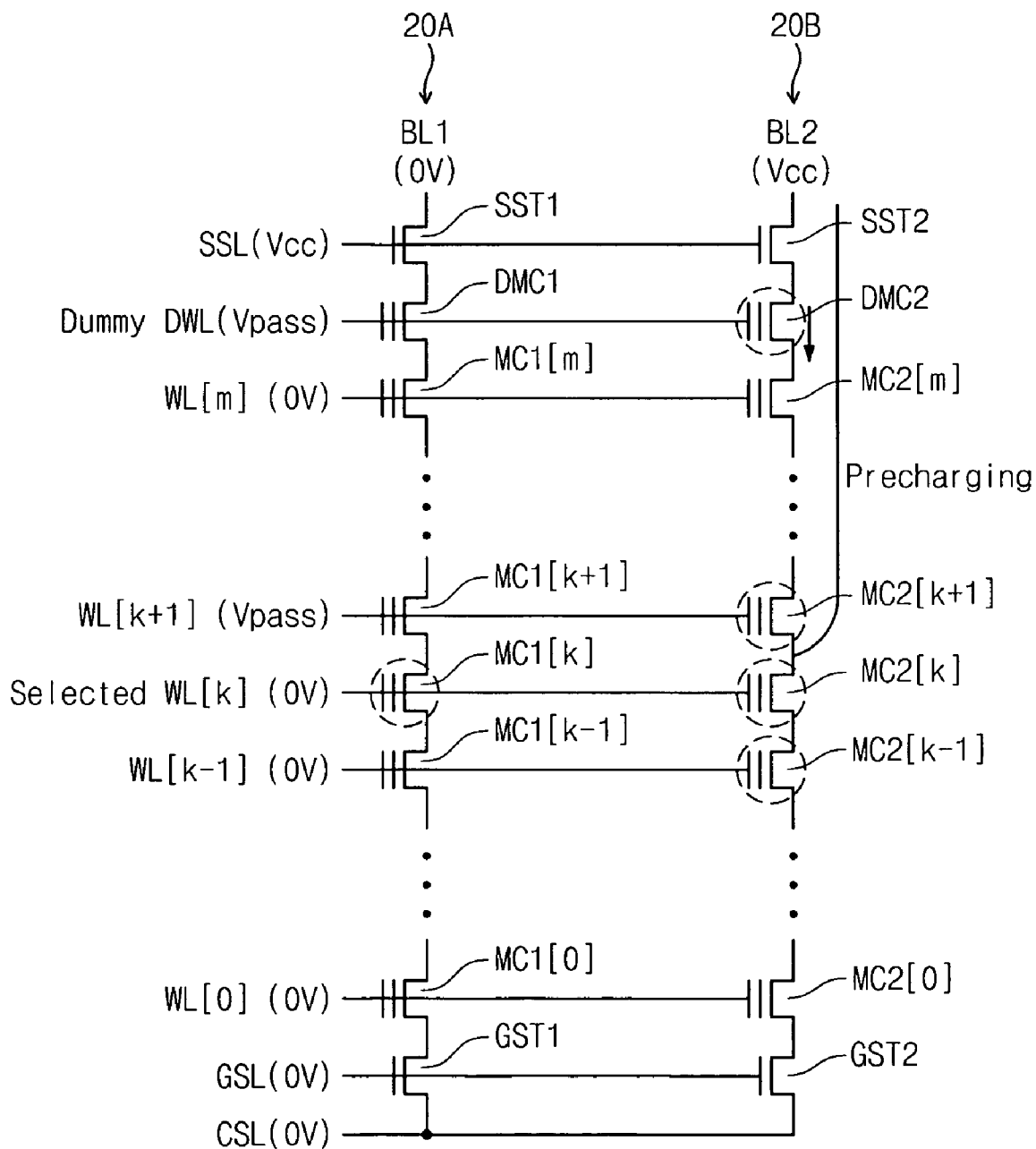

FIG. 9A is a timing diagram of signals applied to a memory cell array illustrating a memory cell programming operation in accordance with another embodiment of the present invention wherein the memory cell array comprises dummy word lines. FIG. 9B is a schematic diagram of a memory cell array illustrating a memory cell programming operation during time stage t2 of the timing diagram of FIG. 9A, in accordance with another embodiment of the present invention.

The programming operation of the embodiment of FIGS. 9A and 9B is similar to that shown and described above in connection with FIGS. 5-8 above in that the application of the Vpass voltage to the unselected word line WL[k+1] neighboring the selected word line WL[k] and positioned between the selected word line WL[k] and the string select line SSL precedes the initiation of the programming operation of the selected memory cell MC1[k] at time stage t4. A distinction lies in this embodiment in that at the time the Vpass voltage is applied to the unselected neighboring word line WL[k+1], the Vpass voltage is also applied to a dummy word line DWL connected to a dummy memory cell transistor DMC1, DMC2, ..., DMCn of the cell strings 20A, 20B, as highlighted at region 114 of the timing diagram of FIG. 9A.

Dummy memory cells DMC1, DMC2, ..., DMCn can be added to the cell strings for any of a number of purposes. For example, dummy memory cells DMC1, DMC2, ..., DMCn can be included in the cell strings for enhancing process margin or in a case where it is desired to increase the distance between the uppermost memory cell transistor MC1[m] and the string select transistor SST1, or for increasing the distance between the lowermost memory cell transistor MC1[0] and the ground select transistor GST1. This increased-distance configuration can be desired, for example, to avoid undesired GIDL-induced carrier programming of memory cells closest to the string select transistor SST or ground select transistor GST. Since photolithography limitations make it difficult to introduce spacing between memory cell patterns and string select transistors SST or ground select transistors GST, dummy memory cell transistors DMC can be introduced in the cell strings to effectively introduce such spacings. The dummy memory cells DMC1, DMC2, ..., DMCn can be positioned in series in the cell strings between the memory cells MC1[m] and the string select transistors SST1, or alternatively, or in addition to, between the memory cells MC1[m] and the ground select transistors GST1, so that if GIDL-induced carrier programming of memory cells occurs, it will occur in the dummy memory cells DMC, rather than in the uppermost memory cell transistor MC1[m] or lowermost memory cell transistor MC1[0]. A dummy cell connected to a dummy word line can become programmed. The threshold voltage of the programmed dummy cell may thus be higher than a ground voltage. If the ground voltage is applied to the dummy word line, the dummy cell may be turned-off. As a result, because the efficiency of self-boosting is reduced, the unselected memory cell connected to the selected word line may become inadvertently programmed.

Application of the Vpass voltage to the unselected word line WL[k+1] neighboring the selected word line WL[k] and positioned between the selected word line WL[k] and the string select line SSL at an earlier time further enhances the pre-charging of the channel of the MC2[k] memory cell transistor sharing the same word line as WL[k] as the transistor MC1[k] selected for programming, as described above. At the same time, application of the Vpass voltage to the dummy word line DWL ensures that the voltage Vcc applied to the unselected bit line BL2 is transferred by the dummy memory cell DMC2, irrespective of the pre-existing threshold voltage of the dummy memory cell DMC2 that is present as a result of some prior programming operation, for example, a GIDL-induced carrier programming of the dummy memory cell DMC2.

As in the above example embodiments of FIGS. 5-8, in the present embodiment of FIGS. 9A and 9B, application of the Vpass voltage during time stage t2, to the neighboring word line WL[k+1] ensures self-boosting of the channel region of the neighboring transistor MC2[k+1] of the other, unselected cell strings 20B, and, therefore, self-boosting of the memory cell transistors MC2[k] sharing the same word line as WL[k] as the memory cell transistor MC1[k] selected for programming. As a result of the self-boosting of the memory cell transistors MC2[k] sharing the same word line as WL[k] as the memory cell transistor MC1[k] selected for programming, any disturbance of the pre-existing threshold voltages Vth of memory cell transistors MC2[k] is mitigated or eliminated during the programming operation of the selected memory cell transistor MC1[k], as described above.

Figure 10A:
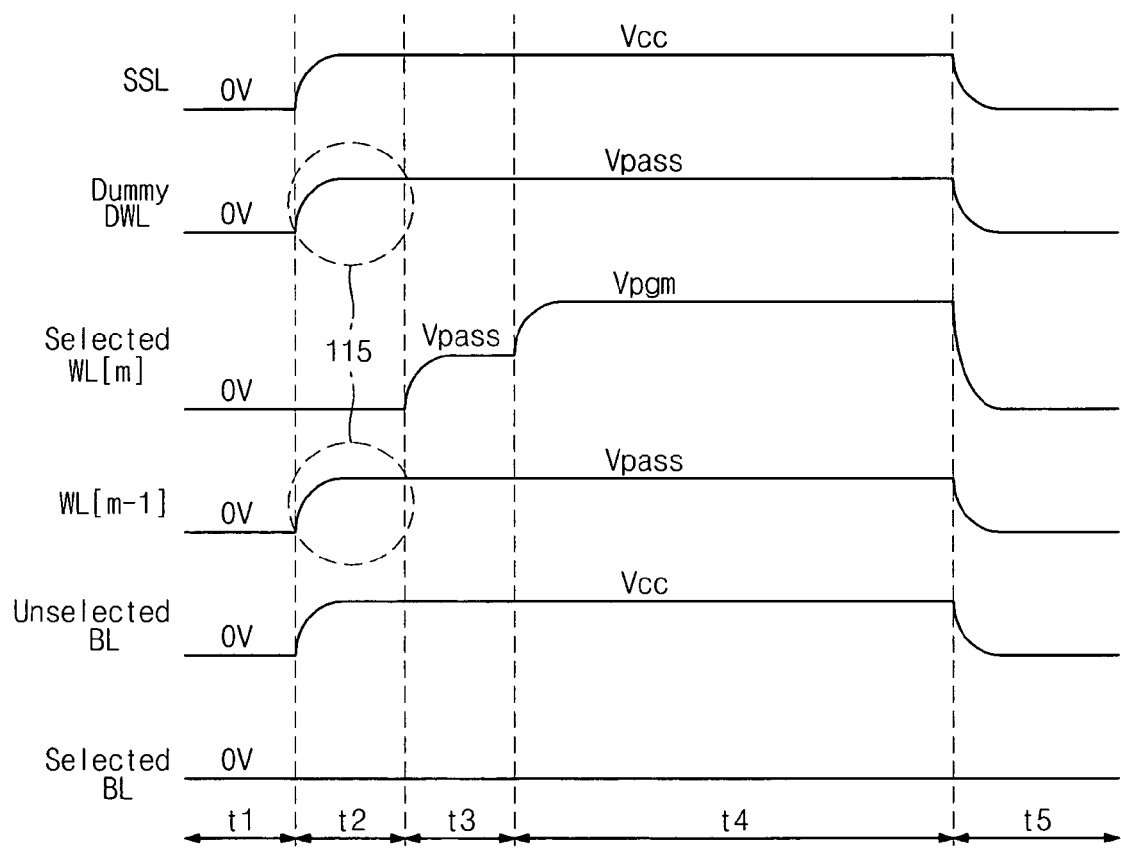
Figure 10B:
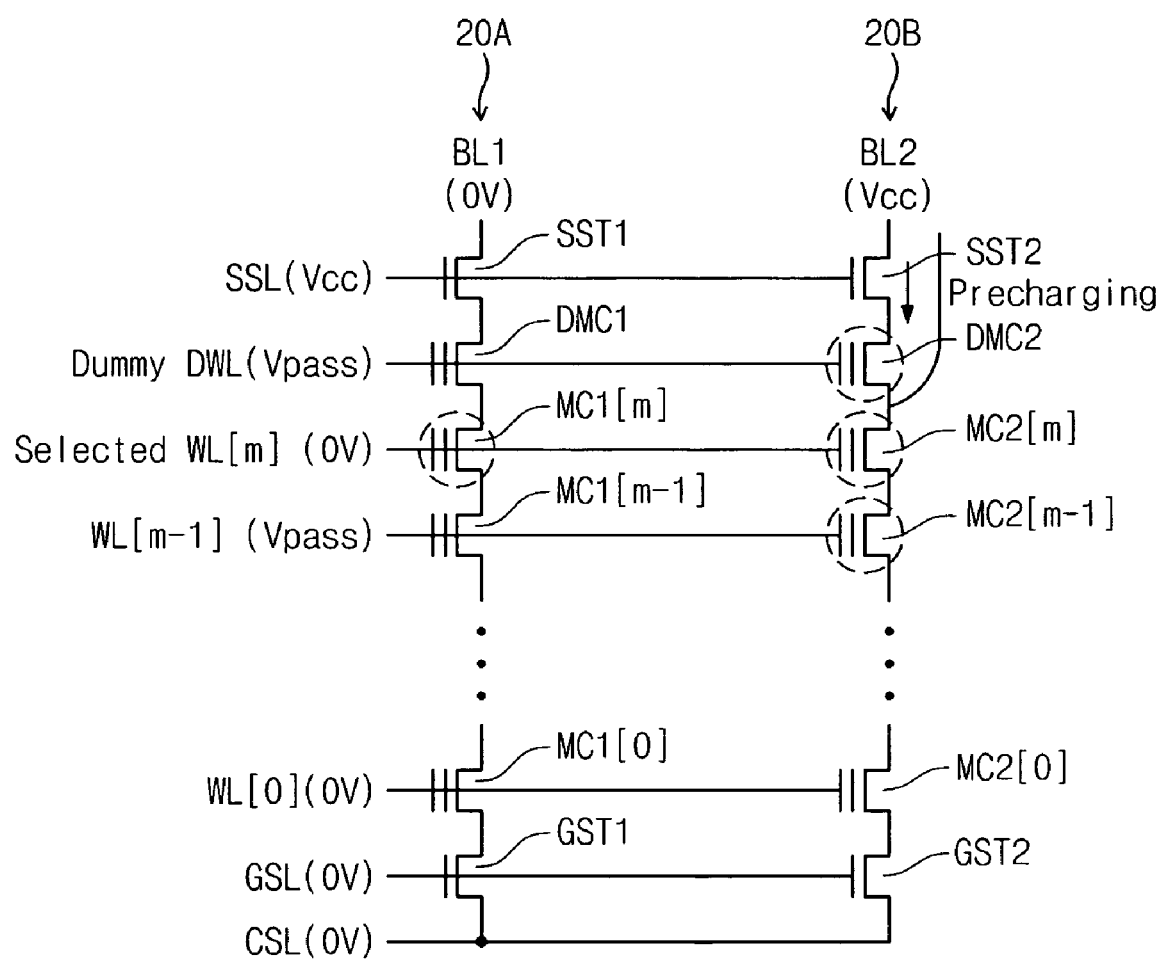

FIG. 10A is a timing diagram of signals applied to a memory cell array illustrating a memory cell programming operation in accordance with another embodiment of the present invention. FIG. 10B is a schematic diagram of a memory cell array illustrating a memory cell programming operation during time stage t2 of the timing diagram of FIG. 10A, in accordance with another embodiment of the present invention.

The programming operation of the embodiment of FIGS. 10A and 10B is similar to that shown and described above in connection with FIGS. 5-9 above in that the application of the Vpass voltage to the unselected word line WL[k+1] neighboring the selected word line WL[k] and positioned between the selected word line WL[k] and the string select line SSL precedes the initiation of the programming operation of the selected memory cell MC1[k] at time stage t4. However, the present embodiment of FIGS. 10A and 10B as FIGS. 9A and 9B is distinct in that the selected memory cell transistor MC1[m] is the uppermost memory cell transistor that is connected to the uppermost word line WL[m] in this example, and the word line neighboring the uppermost word line WL[m] is the dummy word line DWL.

In the present embodiment of FIGS. 10A and 10B, the Vpass voltage is applied to the dummy word line DWL connected to the dummy memory cell transistor DMC1, DMC2, ..., DMCn of the cell strings 20A, 20B in the same manner as the application of the Vpass voltage to the unselected word line WL[k+1] neighboring the selected word line WL[k] and positioned between the selected word line WL[k] and the string select line SSL in the embodiments of FIGS. 1-9 above. The Vpass voltage is applied to the dummy word line DWL prior to the programming operation of the selected memory cell MC1[m] to further enhance the pre-charging of the channel of the memory cell transistor MC2[m] sharing the same word line as WL[m] as the transistor MC1[m] selected for programming, as highlighted at regions 115 of the timing diagram of FIG. 10A, and as described above. In the present example, the Vpass voltage is also applied during the t2 time stage to the neighboring word line WL[k−1] positioned between the selected word line WL[m] and the ground select line GSL to further ensure self-boosting of the channel region of the neighboring transistors MC2[m], MC2[m−1] of the other, unselected cell strings 20B, and therefore, the self-boosting of the memory cell transistors MC2[m] sharing the same word line as WL[m] as the memory cell transistor MC1[m] selected for programming. As a result of the self-boosting of the memory cell transistors MC2[m] sharing the same word line as WL[m] as the memory cell transistor MC1[m] selected for programming, any disturbance of the pre-existing threshold voltages Vth of the unselected memory cell transistors MC2[m] is mitigated or eliminated during the programming operation of the selected memory cell transistor MC1[m], as described above.

Figure 11A:
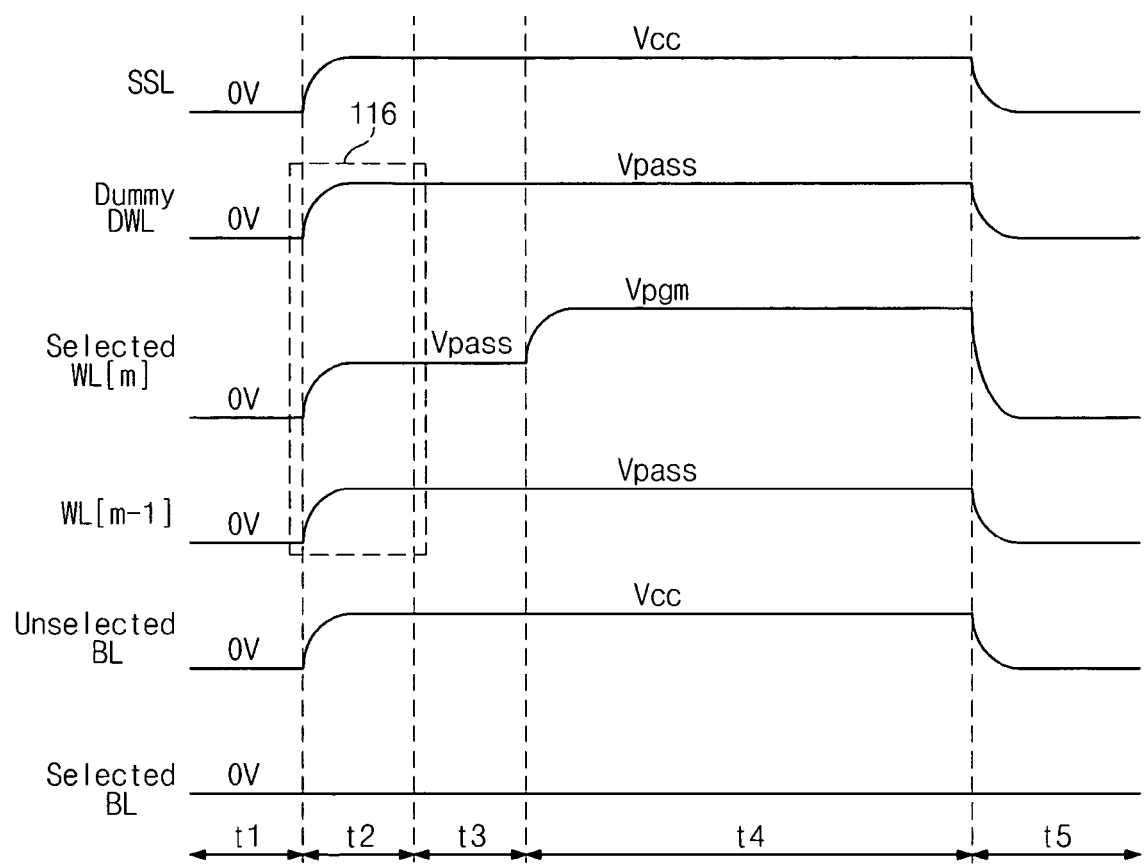
Figure 11B:
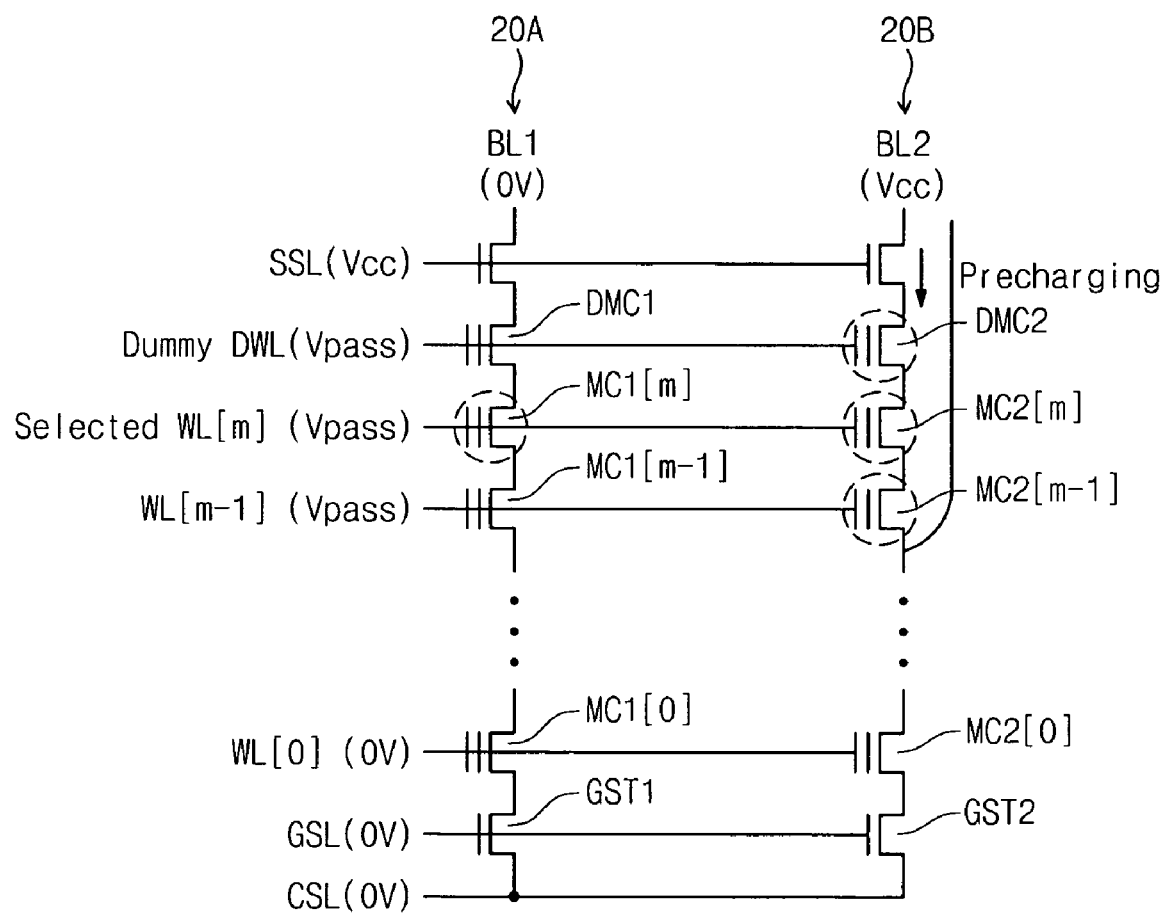

FIG. 11A is a timing diagram of signals applied to a memory cell array illustrating a memory cell programming operation in accordance with another embodiment of the present invention. FIG. 11B is a schematic diagram of a memory cell array illustrating a memory cell programming operation during time stage t2 of the timing diagram of FIG. 11A, in accordance with another embodiment of the present invention.

The programming operation of the embodiment of FIGS. 11A and 11B is similar to that shown and described above in connection with FIGS. 5-10 above in that the application of the Vpass voltage to the unselected word line WL[k+1] neighboring the selected word line WL[k] and positioned between the selected word line WL[k] and the string select line SSL precedes the initiation of the programming operation of the selected memory cell MC1[k] at time stage t4. However, as in the embodiment of FIGS. 10A and 10B above, the present embodiment of FIGS. 11A and 11B is a special case in that the selected memory cell transistor MC1[m] is the uppermost memory cell transistor that is connected to the uppermost word line WL[m] in this example, and the word line neighboring the uppermost word line WL[m] is the dummy word line DWL.

In the present embodiment of FIGS. 11A and 11B, the Vpass voltage is applied to the dummy word line DWL connected to the dummy memory cell transistor DMC1, DMC2, . . . , DMCn of the cell strings 20A, 20B in the same manner as the application of the Vpass voltage to the unselected word line WL[k+1] neighboring the selected word line WL[k] and positioned between the selected word line WL[k] and the string select line SSL in the embodiments of FIGS. 1-9 above. Further, in the present embodiment of FIGS. 11A and 11B, the Vpass voltage is applied to the dummy word line DWL prior to the programming operation of the selected memory cell MC1[m] to further enhance the pre-charging of the channel of the MC2[m] memory cell transistor sharing the same word line as WL[m] as the transistor MC1[m] selected for programming, as highlighted at region 116 of the timing diagram of FIG. 11A, and as described above in connection with the embodiments of FIGS. 10A and 10B. In the present embodiment, the Vpass voltage is also applied during the t2 time stage to the neighboring word line WL[m−1] positioned between the selected word line WL[m] and the ground select line GSL, and to the selected word line WL[m] itself, further ensuring self-boosting of the channel region of the neighboring transistors MC2[m], MC2[m−1] of the other, unselected cell strings 20B, and therefore, self-boosting of the memory cell transistors MC2[m] sharing the same word line as WL[m] as the memory cell transistor MC1[m] selected for programming, as described herein. As a result of the self-boosting of the memory cell transistors MC2[m] sharing the same word line as WL[m] as the transistor memory cell MC1[m] selected for programming, any disturbance of the pre-existing threshold voltages Vth of memory cell transistors MC2[m] is mitigated or eliminated during the programming operation of the selected memory cell transistor MC1[m], as described above.

Figure 12A:
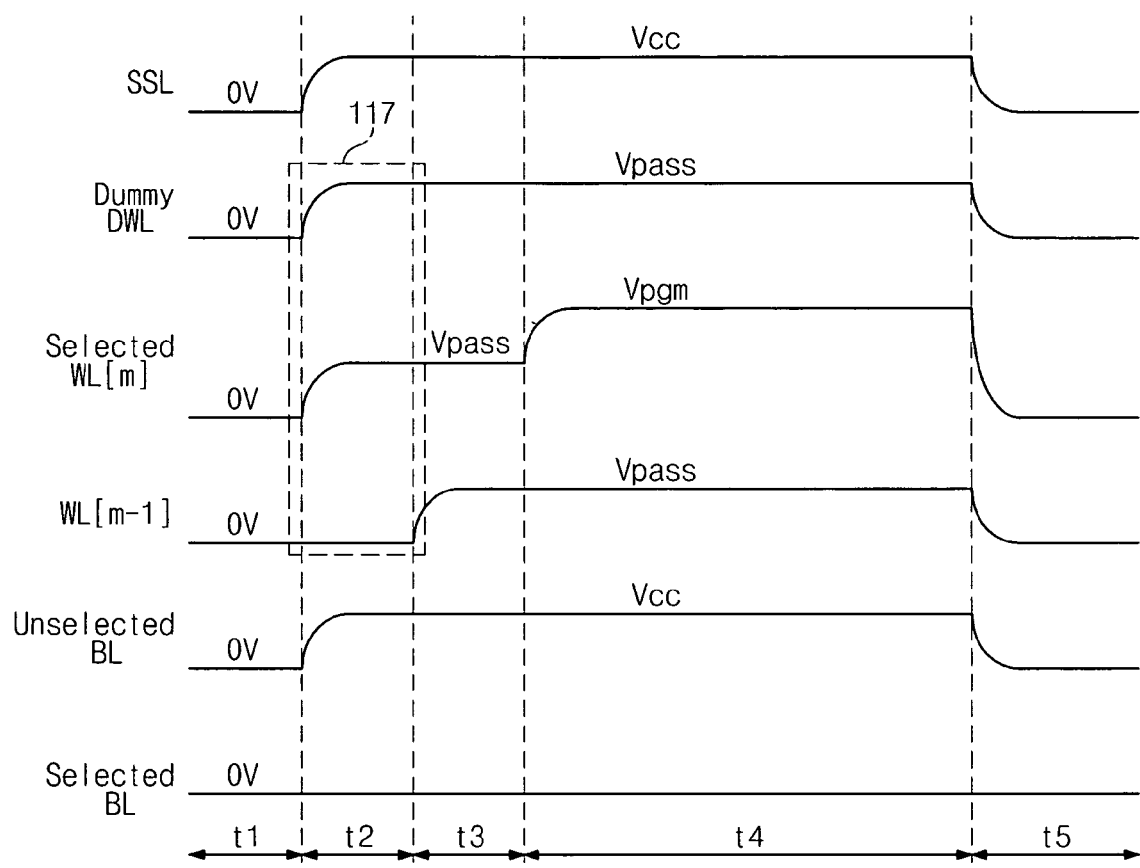
Figure 12B:
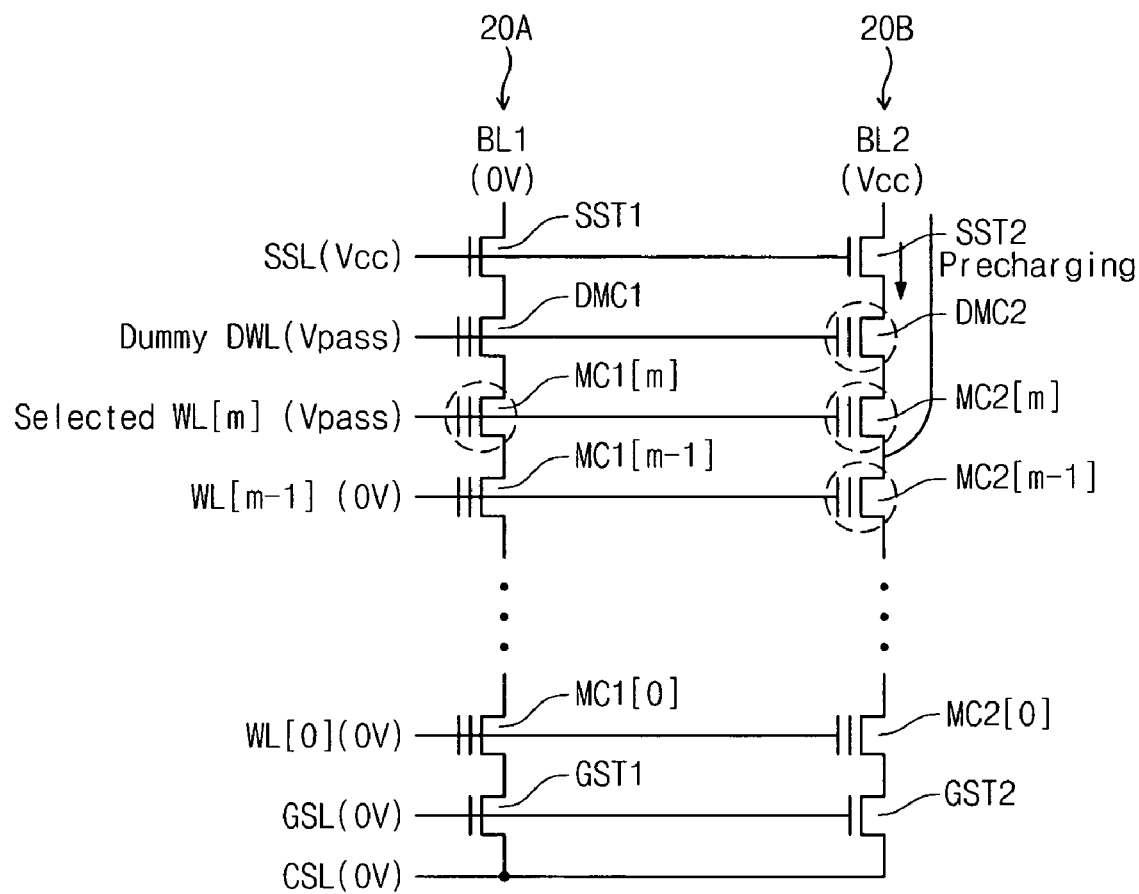

FIG. 12A is a timing diagram of signals applied to a memory cell array illustrating a memory cell programming operation in accordance with another embodiment of the present invention. FIG. 12B is a schematic diagram of a memory cell array illustrating a memory cell programming operation during time stage t2 of the timing diagram of FIG. 12A, in accordance with another embodiment of the present invention.

The programming operation of the embodiment of FIGS. 12A and 12B is similar to that shown and described above in connection with FIGS. 11A and 11B above. However, in the present embodiment of FIGS. 12A and 12B, the Vpass voltage is not applied during the t2 time stage to the neighboring word line WL[m−1] positioned between the selected word line WL[m] and the ground select line GSL, as highlighted at region 117 of the timing diagram of FIG. 12A.

Figure 13A:
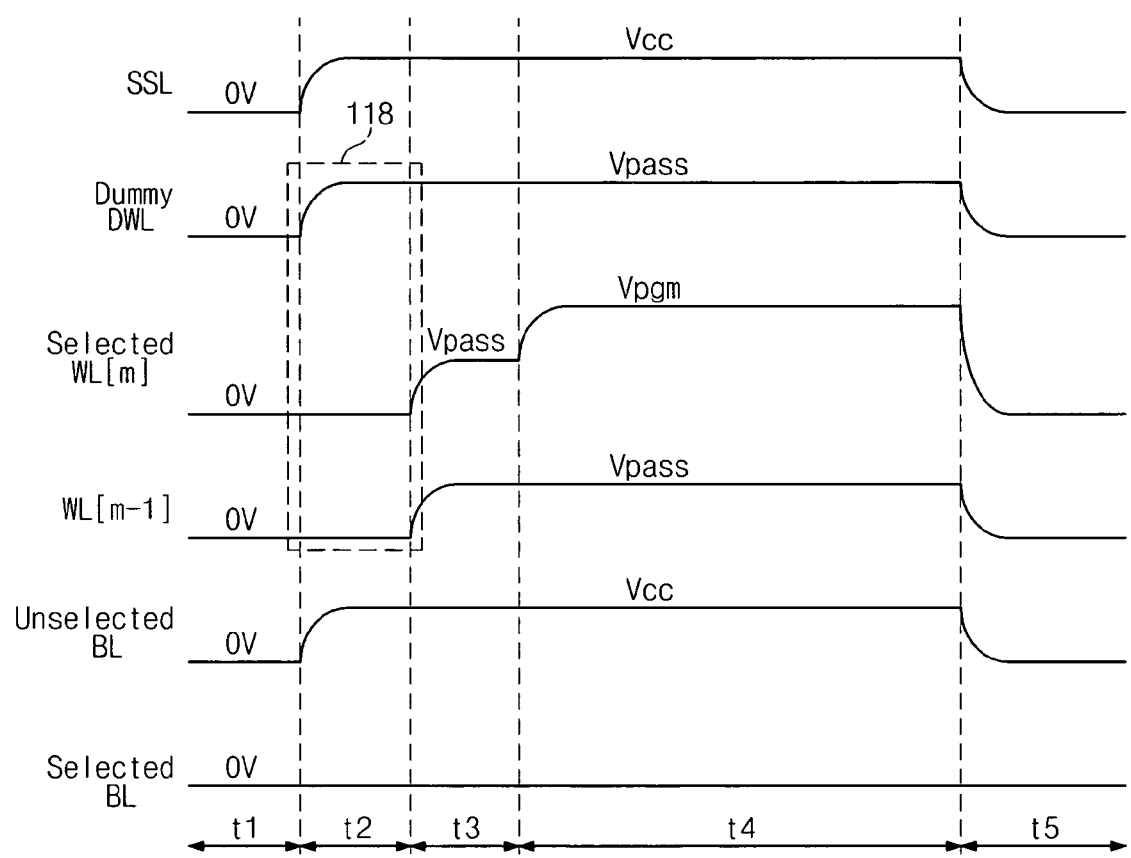
Figure 13B:
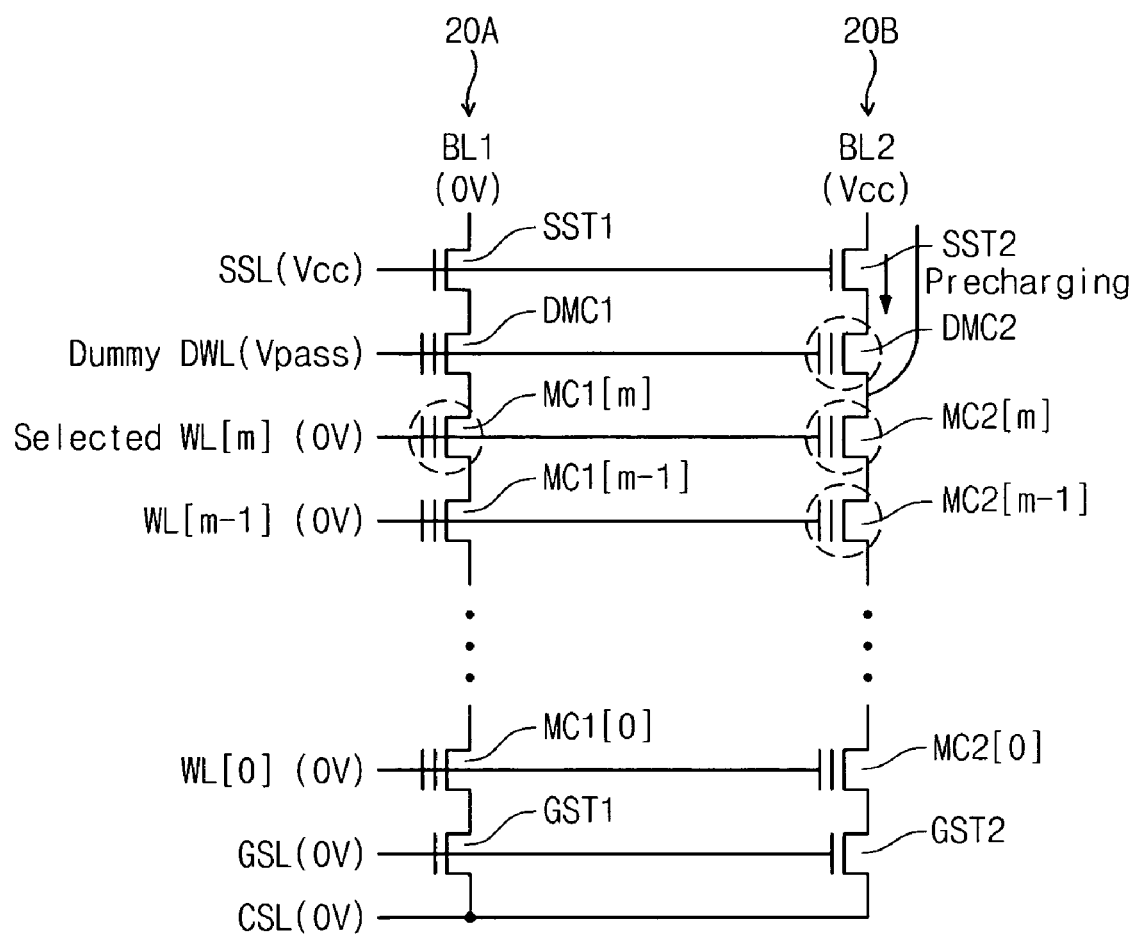

FIG. 13A is a timing diagram of signals applied to a memory cell array illustrating a memory cell programming operation in accordance with another embodiment of the present invention. FIG. 13B is a schematic diagram of a memory cell array illustrating a memory cell programming operation during time stage t2 of the timing diagram of FIG. 13A, in accordance with another embodiment of the present invention.

The programming operation of the embodiment of FIGS. 13A and 13B is similar to that shown and described above in connection with FIGS. 12A and 12B above. However, in the present embodiment of FIGS. 13A and 13B, the Vpass voltage is not applied during the t2 time stage to the selected word line WL[m], as highlighted at region 118 of the timing diagram of FIG. 13A.

Figure 14A:
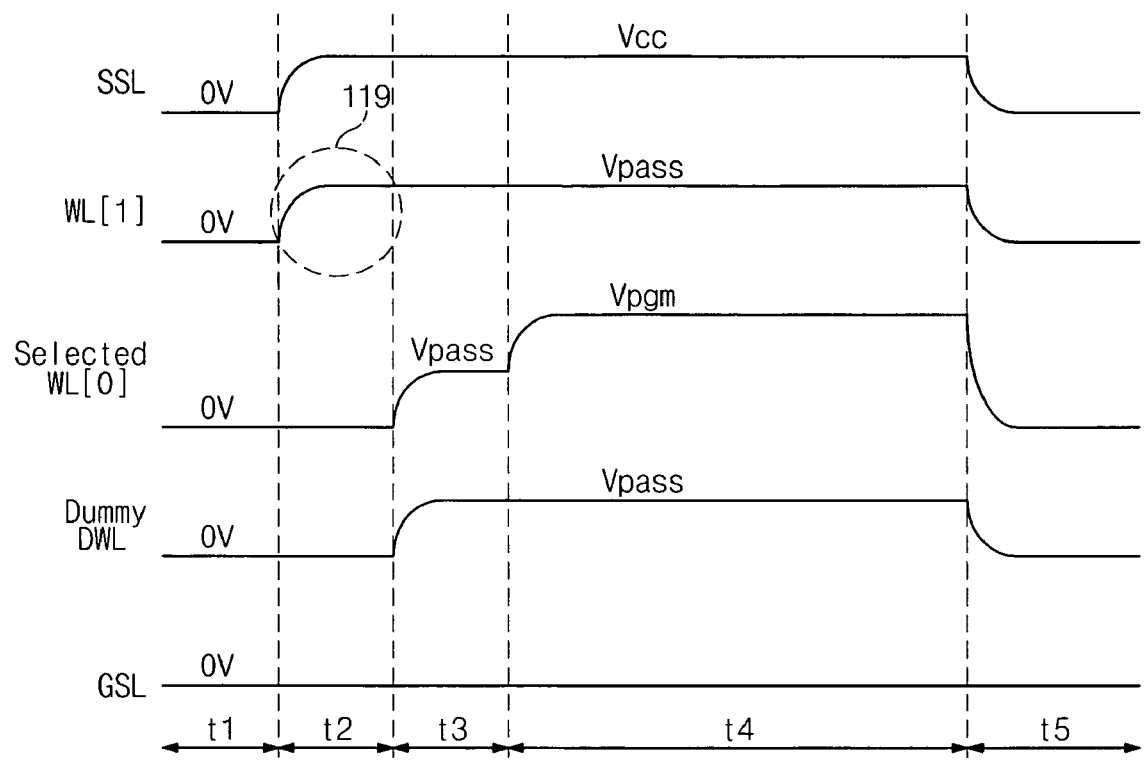
Figure 14B:
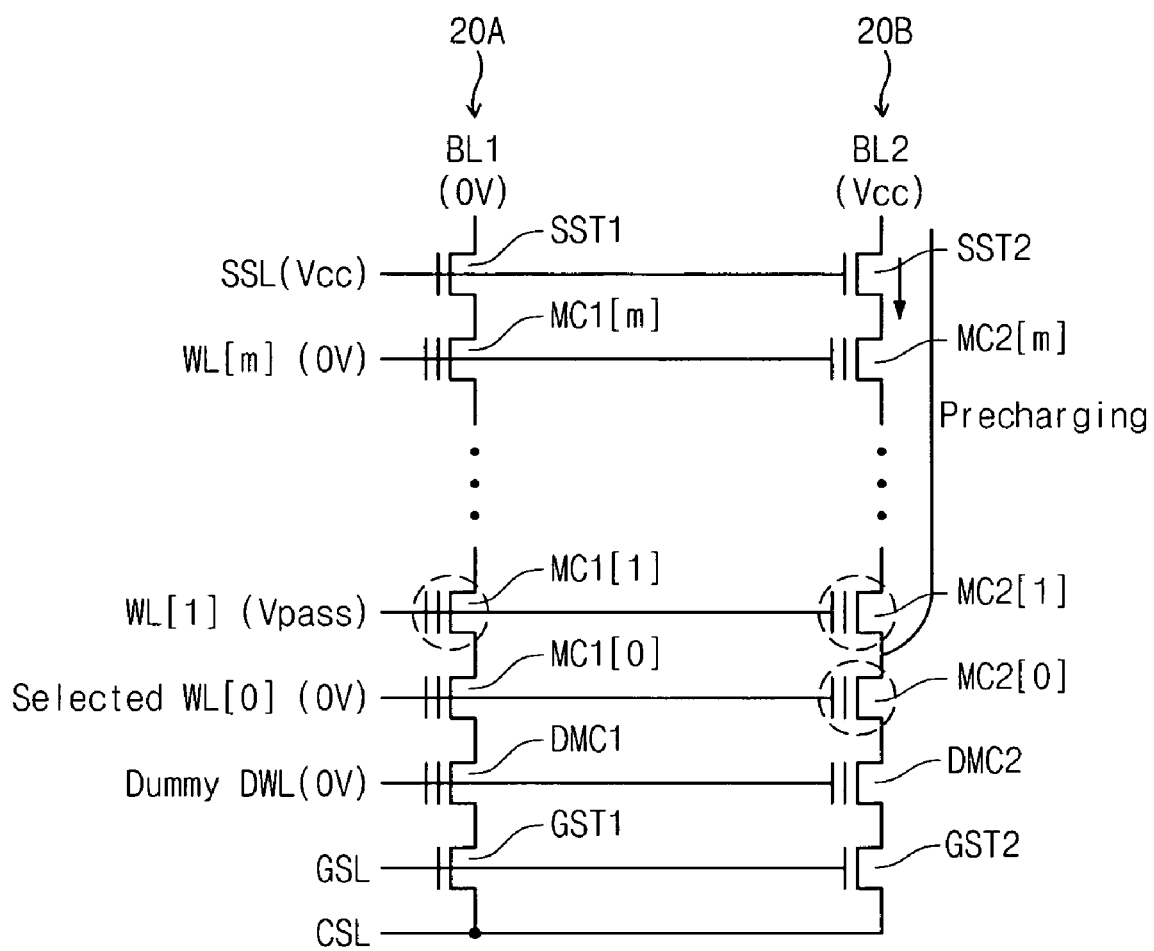

FIG. 14A is a timing diagram of signals applied to a memory cell array illustrating a memory cell programming operation in accordance with another embodiment of the present invention. FIG. 14B is a schematic diagram of a memory cell array illustrating a memory cell programming operation during time stage t2 of the timing diagram of FIG. 14A, in accordance with another embodiment of the present invention.

The programming operation of the embodiment of FIGS. 14A and 14B is similar to that shown and described above in connection with the above embodiments in that the application of the Vpass voltage to the unselected word line, in this case WL[1], neighboring the selected word line, in this case WL[0] and positioned between the selected word line WL[0] and the string select line SSL precedes the initiation of the programming operation of the selected memory cell MC1[k] at time stage t4. A distinction lies in this embodiment in that, in contrast with the embodiments of FIGS. 9-13 described above, in the present embodiment of FIGS. 14A and 14B, the dummy memory cell transistors DMC1, DMC2, . . . , DMCn are positioned in the cell strings between the memory cells MC1n[0 . . . m] and the ground select transistors GST1, GST2, . . . GSTn.

In the present example, the memory cell selected for programming MC1[0] is the lowermost memory cell in the cell string, and therefore, is connected to the first word line WL[0]. Application of the Vpass voltage to the unselected word line WL[1] neighboring the selected word line WL[0] and positioned between the selected word line WL[0] and the string select line SSL at an earlier time, as highlighted at region 119 of the timing diagram of FIG. 14A, further enhances the pre-charging of the channel region of the MC1[0] memory cell transistor sharing the same word line as WL[0] as the transistor MC1[0] selected for programming, as described above. As in the above example embodiments, in the present embodiment of FIGS. 14A and 14B, application of the Vpass voltage during time stage t2, to the neighboring word line WL[1] ensures self-boosting of the channel region of the neighboring transistor MC2[1] of the other, unselected cell strings 20B. As a result of the self-boosting of the transistors MC2[0] sharing the same word line as WL[0] as the transistor MC1[0] selected for programming, any disturbance of the pre-existing threshold voltages Vth of memory cell transistors MC2[0] is mitigated or eliminated during the programming operation of the selected memory cell transistor MC1[0], as described above.

Figure 15A:
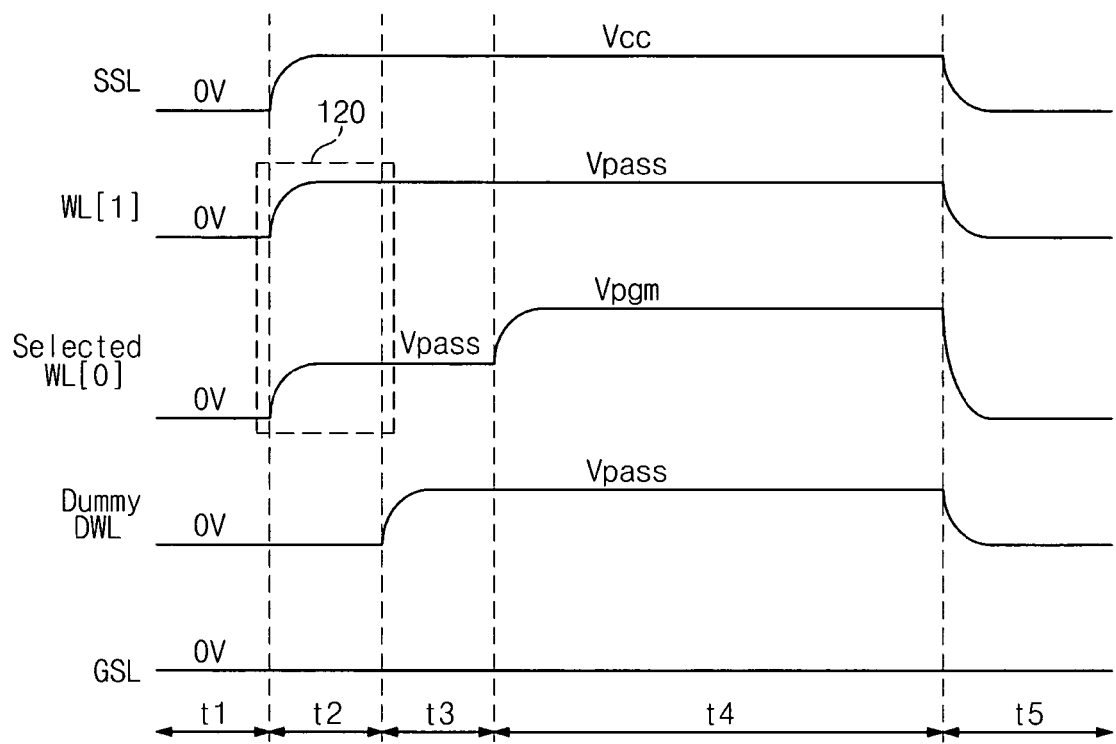
Figure 15B:
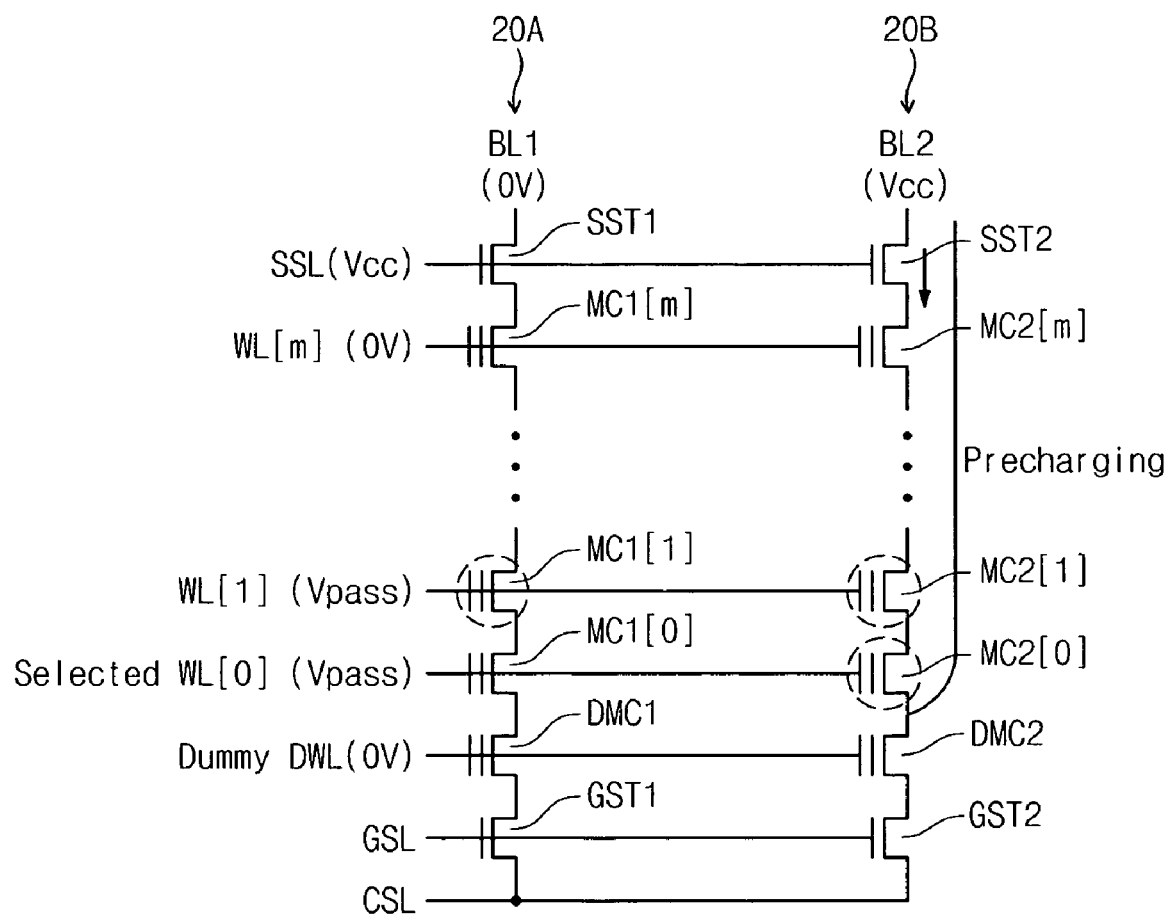

FIG. 15A is a timing diagram of signals applied to a memory cell array illustrating a memory cell programming operation in accordance with another embodiment of the present invention. FIG. 15B is a schematic diagram of a memory cell array illustrating a memory cell programming operation during time stage t2 of the timing diagram of FIG. 15A, in accordance with another embodiment of the present invention.

The programming operation of the embodiment of FIGS. 15A and 15B is similar to that shown and described above in connection with FIGS. 14A and 14B above. However, in the present embodiment of FIGS. 15A and 15B, the Vpass voltage is further applied during the t2 time stage to the selected word line WL[0], as highlighted at region 120 of the timing diagram of FIG. 15A. This further ensures pre-charging of the channel region of the MC2[0] memory cell transistor sharing the same word line as WL[0] as the transistor MC1[0] selected for programming, as described above.

Figure 16A:
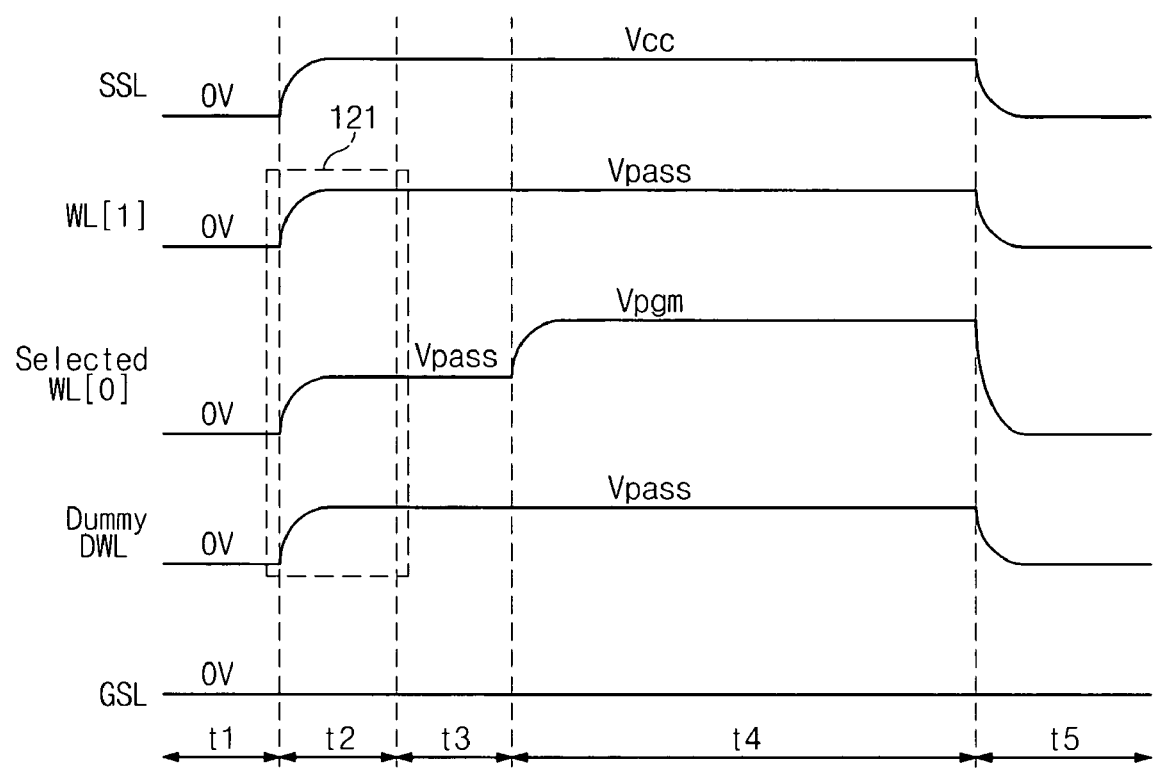
Figure 16B:
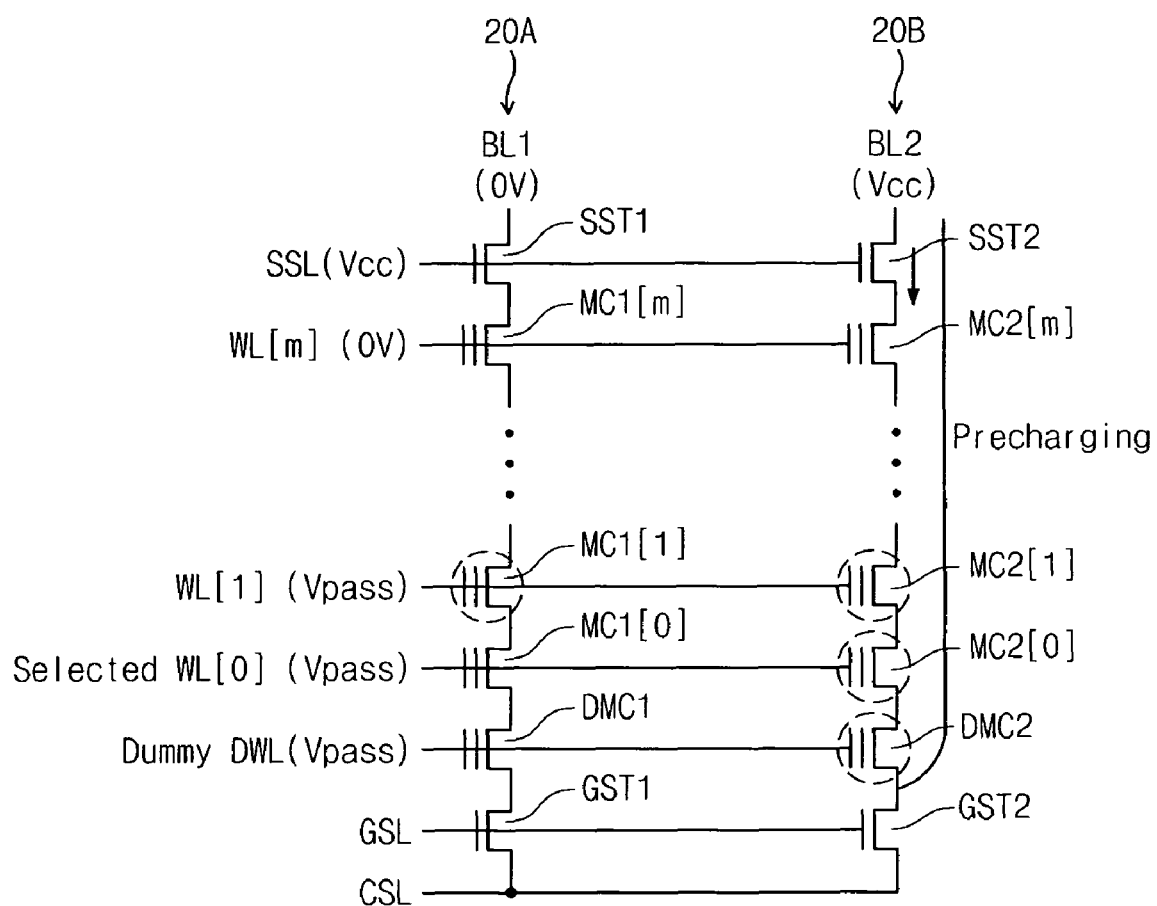

FIG. 16A is a timing diagram of signals applied to a memory cell array illustrating a memory cell programming operation in accordance with another embodiment of the present invention. FIG. 16B is a schematic diagram of a memory cell array illustrating a memory cell programming operation during time stage t2 of the timing diagram of FIG. 16A, in accordance with another embodiment of the present invention.

The programming operation of the embodiment of FIGS. 16A and 16B is similar to that shown and described above in connection with FIGS. 15A and 15B above. However, in the present embodiment of FIGS. 16A and 16B, the Vpass voltage is further applied during the t2 time stage to the selected word line WL[0], as highlighted at region 121 of the timing diagram of FIG. 16A. This further ensures pre-charging of the channel region of the MC2[0] memory cell transistor sharing the same word line as WL[0] as the transistor MC1[0] selected for programming, as described above.

Figure 17A:
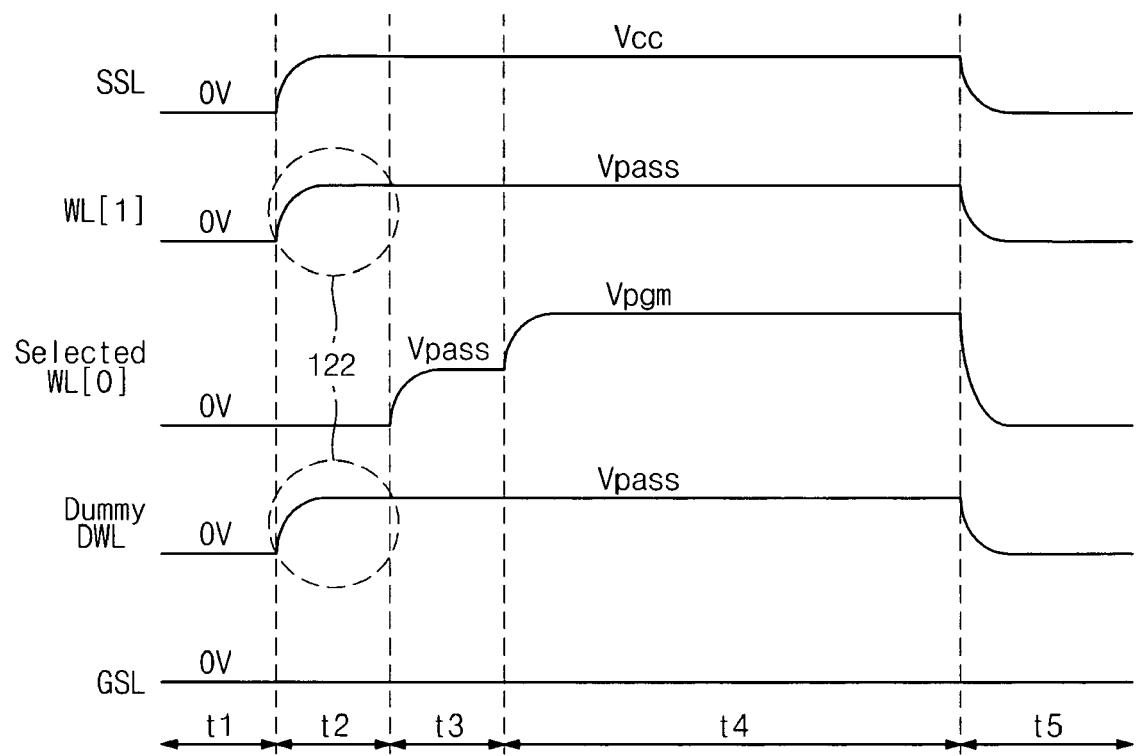
Figure 17B:
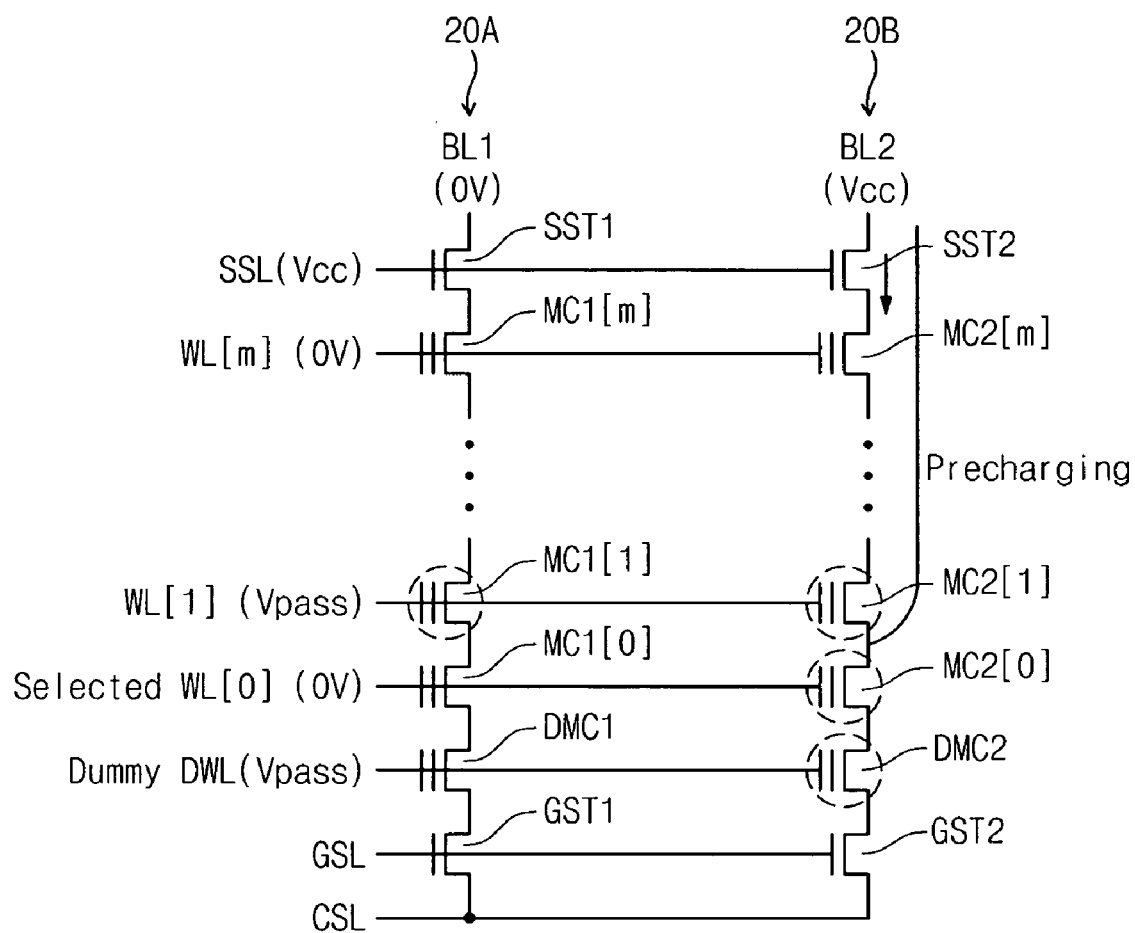

FIG. 17A is a timing diagram of signals applied to a memory cell array illustrating a memory cell programming operation in accordance with another embodiment of the present invention. FIG. 17B is a schematic diagram of a memory cell array illustrating a memory cell programming operation during time stage t2 of the timing diagram of FIG. 17A, in accordance with another embodiment of the present invention.

The programming operation of the embodiment of FIGS. 17A and 17B is similar to that shown and described above in connection with FIGS. 14A and 14B above. However, in the present embodiment of FIGS. 17A and 17B, the Vpass voltage is further applied during the t2 time stage to the dummy word line WL[0] connected to the dummy cell transistors DMC1, DMC2, ... DMCn, as highlighted at region 122 of the timing diagram of FIG. 17A. This further ensures pre-charging of the channel region of the MC2[0] memory cell transistor sharing the same word line as WL[0] as the transistor MC1[0] selected for programming, as described above. In order to alleviate or prevent the GIDL phenomenon form occurring and to ensure self-boosting, dummy WL could be program state Vth and the pre-biasing is needed for the Dummy WL.

Figure 18:
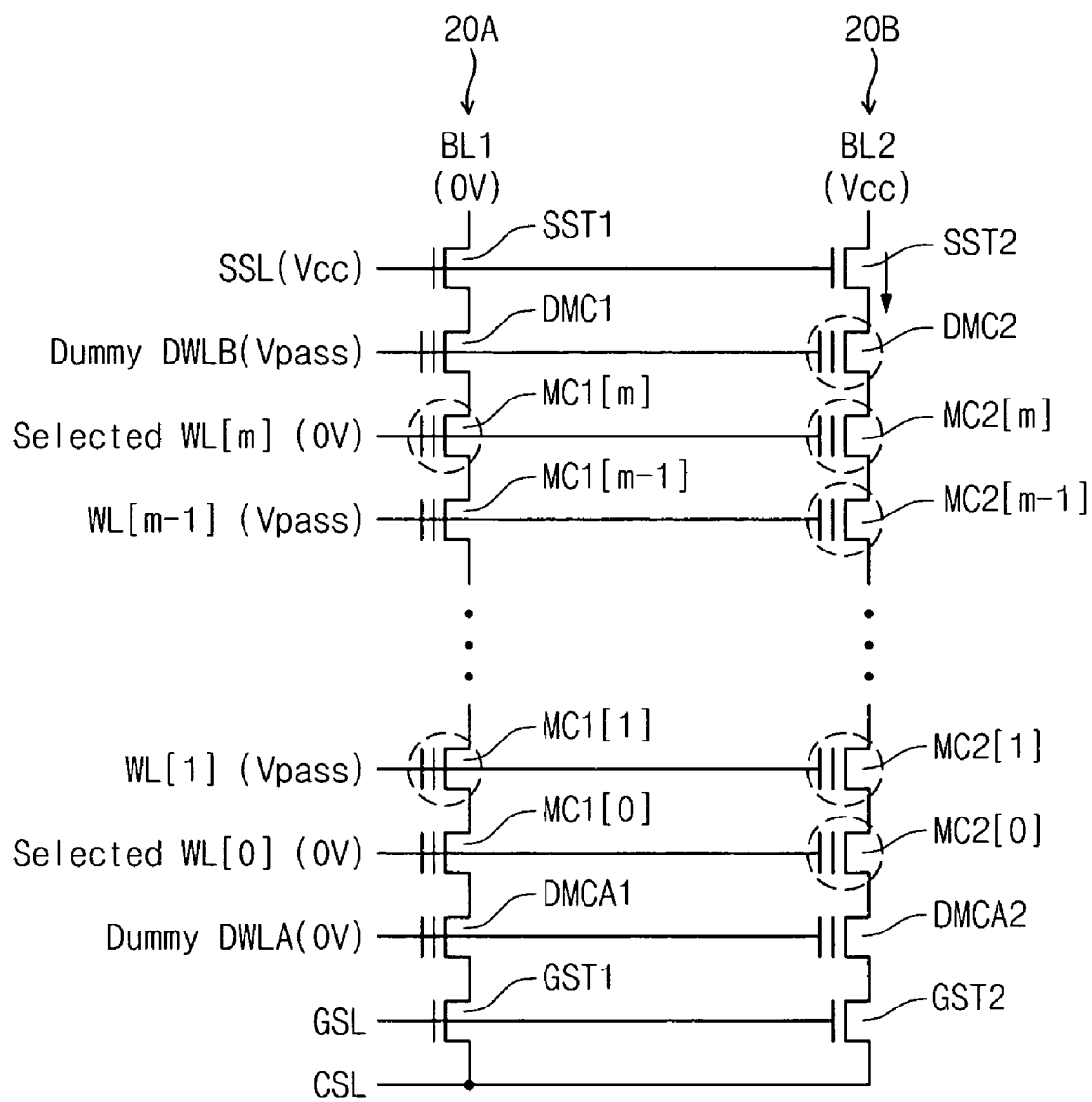
FIG. 18 is a schematic diagram of a memory cell array illustrating a memory cell programming operation in accordance with another embodiment of the present invention.

FIG. 18 is a schematic diagram of a memory cell array illustrating a memory cell programming operation in accordance with another embodiment of the present invention. In this embodiment, it is illustrated that in some embodiments, first dummy memory cell transistors DMCA1, DMCA2, ... DMCAn, activated by the first dummy word line DWLA, can be positioned between the memory cell transistors MC1[n] and the string select transistors SSTn while second dummy memory cell transistors DMCB1, DMCB2, ... DMCBn, activated by the second dummy word line DWLB, can be positioned between the memory cell transistors MC1[n] and the ground select transistors SSTn. In such embodiments, the principles that apply to the first dummy memory cell transistors DMCA1, DMCA2, ... DMCAn as described above in connection with FIGS. 9-13, and the principles that apply to the second dummy memory cell transistors DMCB1, DMCB2, ... DMCBn as described above in connection with FIGS. 14-17, can be jointly applied, as desired. In order to alleviate or prevent the GIDL phenomenon from occurring, dummy cells are added near both the SSL and GSL lines. The presence of dummy cells also ensure self-boosting of WL[m] and WL[0] when programming those cells.

Figure 19:
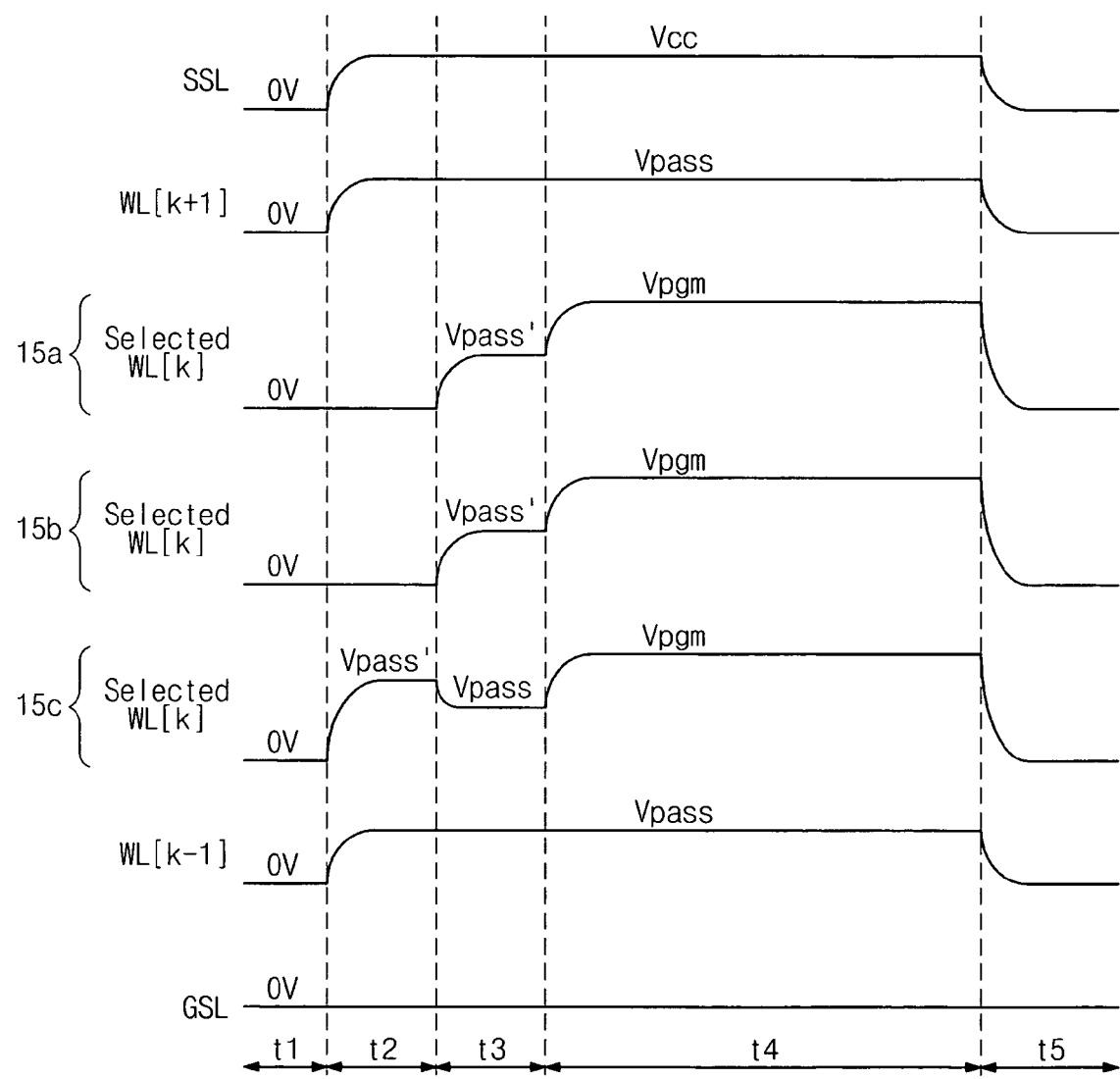
FIG. 19 is a timing diagram of signals applied to a memory cell array illustrating a memory cell programming operation in accordance with other embodiments of the present invention.

FIG. 19 is a timing diagram of signals applied to a memory cell array illustrating a memory cell programming operation in accordance with other embodiments of the present invention.

Referring to the timing diagram of FIG. 19 and to the schematic diagram of FIG. 5A, in a first embodiment 15a depicted in FIG. 19, during time stage t3 of the programming operation, the voltage applied to the selected word line WL[k] is a high-pass voltage Vpass' that can be greater than the pass voltage Vpass applied to the unselected word lines WL[0, ..., k−1; k+1, ..., m]. For example, in an embodiment where the programming voltage Vpgm is about 20V and where the pass voltage Vpass is about 10V, the high-pass voltage Vpass' can be about 13V. Application of the high-pass Vpass' voltage to the selected word line WL[k] in this manner enhances self boosting of the channel regions of the unselected memory cells MC2[k] of the unselected memory cell strings 20B, as described herein. Also, in this embodiment, during the time stage t2, a ground voltage 0V is applied to the unselected word lines WL[k+1], WL[k−1] neighboring the selected word line WL[k] (not shown).

Referring to the timing diagram of FIG. 19 and to the schematic diagram of FIG. 5A, in a second embodiment 15b depicted in FIG. 19, during time stage t3 of the programming operation, the voltage applied to the selected word line WL[k] is a high-pass voltage Vpass' that can be greater than the pass voltage Vpass applied to the unselected word lines WL[0, ..., k−1; k+1, ..., m], in a manner similar to the first embodiment. However, in this present, second, embodiment 15b, during the time stage t2, a pass voltage Vpass is applied to at least one of the unselected word lines WL[k+1], WL[k−1] neighboring the selected word line WL[k], as shown in FIG. 19. Application of the high-pass Vpass' voltage to the selected word line WL[k] coupled with application of the pass voltage Vpass to the neighboring word lines WL[k+1], WL[k−1] in this manner further enhances self boosting efficiency of the channel regions of the unselected memory cells MC2[k] of the unselected memory cell strings 20B, as described herein.

Referring to the timing diagram of FIG. 19 and to the schematic diagram of FIG. 5A, in a third embodiment 15c depicted in FIG. 19, during time stage t2 of the programming operation, the voltage applied to the selected word line WL[k] is a high-pass voltage Vpass' that can be greater than the pass voltage Vpass applied to the unselected word lines WL[0, . . . , k−1; k+1, . . . , m]. Application of the high-pass Vpass' voltage to the selected word line WL[k] in this manner during the t2 time stage further enhances self-boosting of the channel regions of the unselected memory cells MC2[k] of the unselected memory cell strings 20B, as described herein. Following the t2 time stage, the voltage applied to the selected word line WL[k] reverts to the pass voltage Vpass before the programming voltage Vpgm is applied.

In another embodiment that is a variation of the first 15a, second 15b and third 15c embodiments of FIG. 19 described above, the voltage applied to at least one of the neighboring word lines WL[k+1], WL[k−1] during the time stage t2, can be the high-pass voltage Vpass', to even further enhance self-boosting efficiency.

Figure 20A:
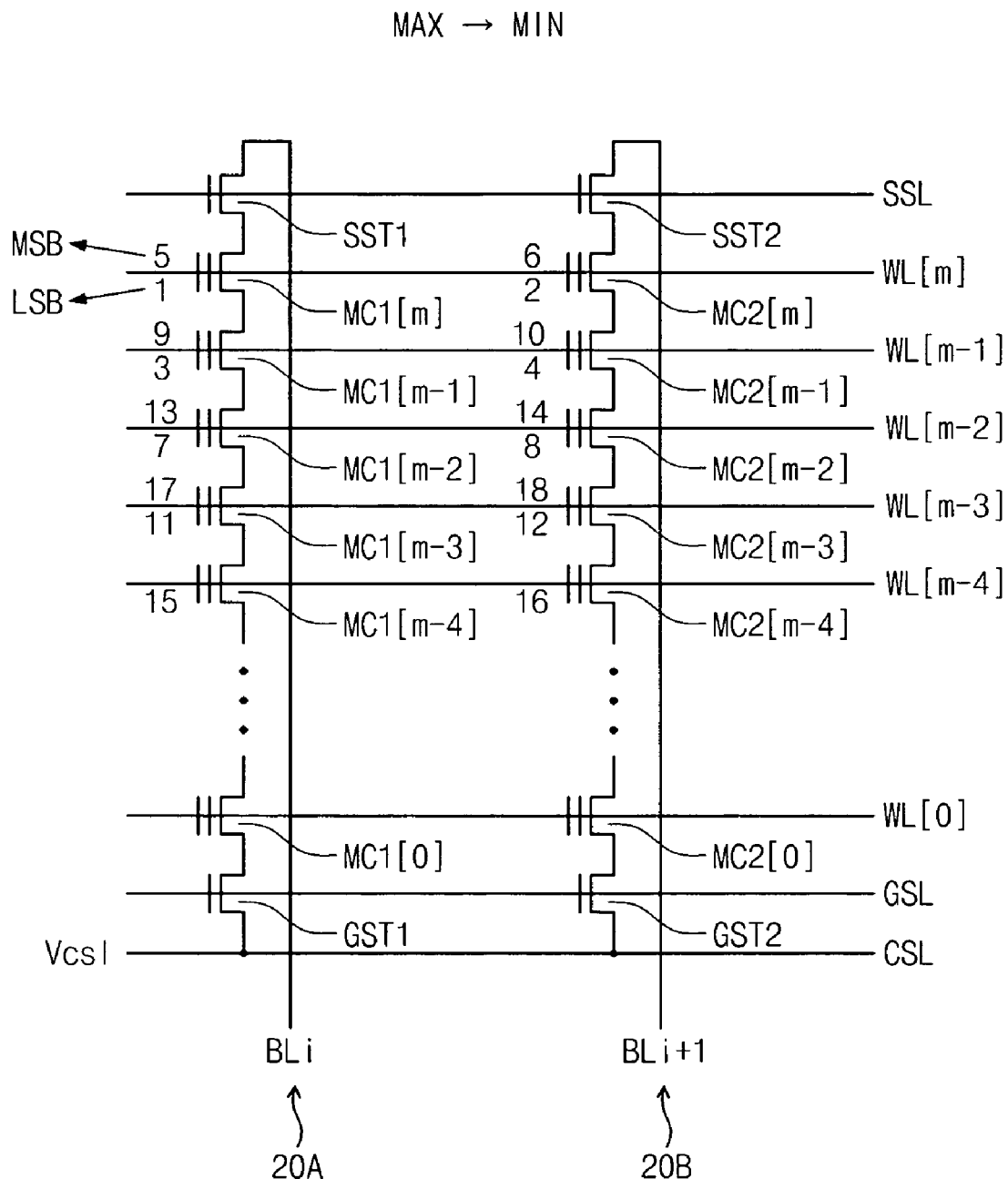
FIG. 20A is a schematic diagram of a memory cell array illustrating a memory cell programming operation in a multiple-level cell configuration in a maximum-to-minimum programming arrangement, in accordance with another embodiment of the present invention.
Figure 20B:
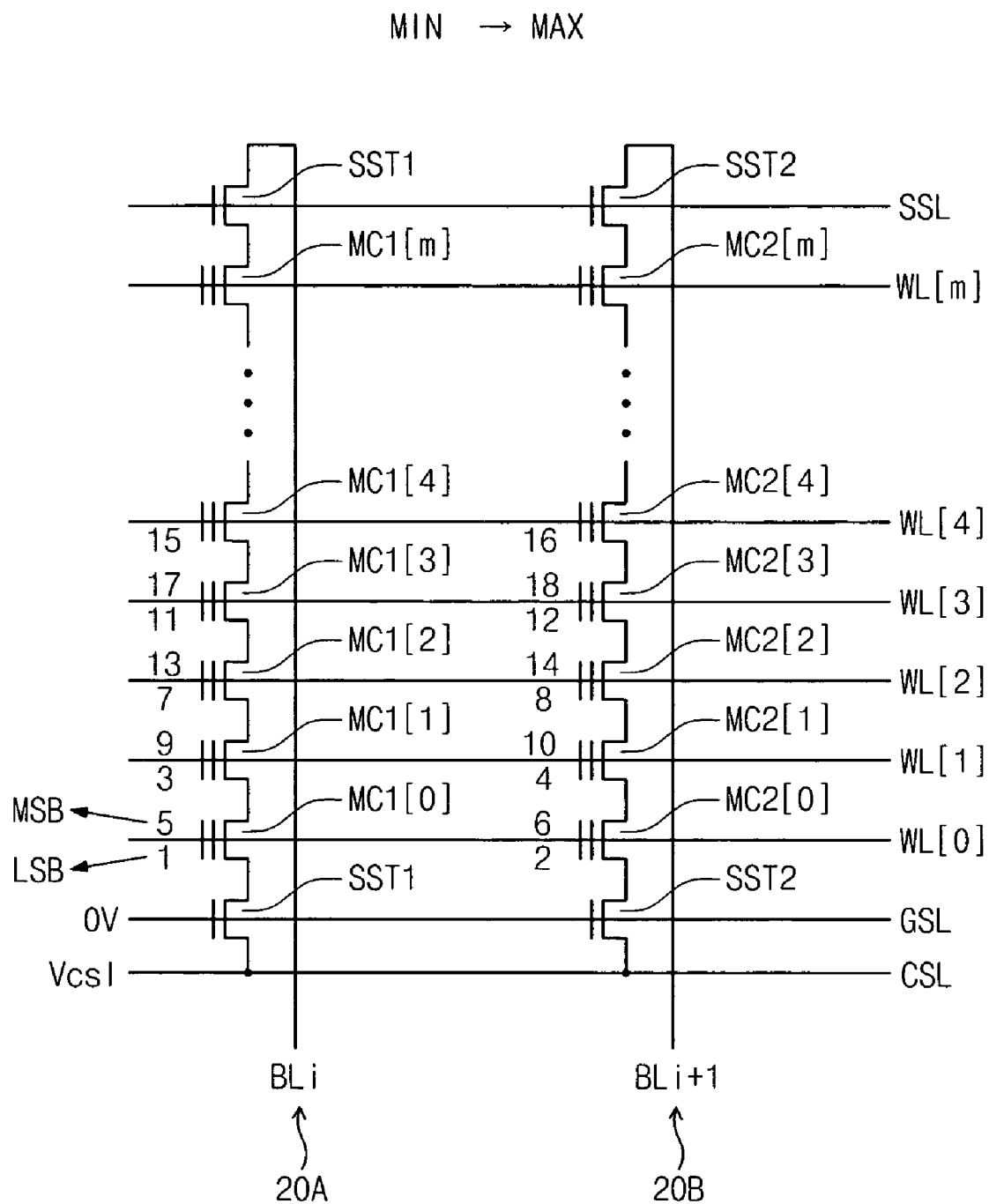
FIG. 20B is a schematic diagram of a memory cell array illustrating a memory cell programming operation in a multiple-level cell configuration in a minimum-to-maximum programming arrangement, in accordance with another embodiment of the present invention.

FIG. 20A is a schematic diagram of a memory cell array illustrating a memory cell programming operation in a multiple-level cell configuration in a maximum-to-minimum programming arrangement, in accordance with another embodiment of the present invention. FIG. 20B is a schematic diagram of a memory cell array illustrating a memory cell programming operation in a multiple-level cell configuration in a minimum-to-maximum programming arrangement, in accordance with another embodiment of the present invention.

With regard to multiple-level cell programming, the concept of multiple-level cell programming is a recent advancement in the memory device industry, and is equally applicable to the principles of the present inventive concepts. In multiple-level cell programming, each memory cell MC1, MC2 is capable of storing more than a single binary bit of information, e.g. '0', '1'. For example, under multiple-level cell programming, two or more bits of information, e.g. '00', '01', '10', '11', can be stored in each memory cell MC1, MC2. The multiple levels are related the threshold voltage Vth of a cell. For example, in some applications, a dual bit value of '00' can be represented by a −3V threshold voltage, a dual bit value of '01' can be represented by a +1V threshold voltage, a dual bit value of '10' can be represented by a +2.5V threshold voltage, and a dual bit value of '11' can be represented by a +4V threshold voltage. Alternatively, the threshold voltage may be assigned to the data to be stored in different way, which should be also construed as within the claimed scope of the present application. For example, in some applications, a dual bit value of '11' can be represented by a −3V threshold voltage, a dual bit value of '01' can be represented by a +1V threshold voltage, a dual bit value of '00' can be represented by a +2.5V threshold voltage, and a dual bit value of '01' can be represented by a +4V threshold voltage.

Cell-to-cell coupling, or cell-to-cell interference can often occur when there is a large change, or 'span', in the threshold voltage Vth of a cell, for example, due to a programming operation from the '00' state (−3V) to the ' 11' state (+4V), resulting in a total change in threshold voltage of 7V. As a result, neighboring cells can likewise be subject to a large shift in threshold voltage. This includes memory cells that neighbor the memory cell to be programmed within the same memory cell string, as well as memory cells that share the same word line as the memory cell to be programmed. This undesirable phenomenon is more significant with the industry trend toward further integration of memory devices.

A programming technique referred to in the art as "shadow programming" alleviates this problem by programming a cell in more than one step to ensure that there is no direct transition between the state having the lowest threshold voltage and the state having the highest threshold voltage. In the example given above, shadow programming ensures that no cells transition between the '00' and '11' state, thereby limiting the amount of Vth transition during a given programming operation. The shadow programming operation is applicable to the systems and methods of the embodiments of the invention described herein.

Shadow programming accomplishes its objective in two ways. First, shadow programming performs programming on one bit of the data at a time. For example, the least significant bit (LSB) is first programmed in an initial programming operation, followed by programming of the most significant bit (MSB) in a subsequent programming operation. Second, shadow programming avoids programming of neighboring memory cells of the same cell string during consecutive programming operations.

An example shadow programming operation for a multiple-level cell memory configuration is now described in connection with FIG. 20A. In this example, it is assumed that neighboring bit lines BLi, and BLi+1 are shared by the same page buffer. Referring to FIG. 20A, it can be seen that the shadow programming operation programs eighteen programming operations, numbered 1-18 on the memory cells MC1[0 . . . m] of the first cell string 20A, and on the memory cells MC2[0 . . . m] of the second cell string 20B.

According to the shadow programming operation in the example of FIG. 20A, programming is performed in a "maximum-to-minimum" direction; that is, programming is first performed on the memory cells MC1[m], MC2[m] neighboring the string select transistors SST1, SST2 and proceeding in a direction toward the memory cells MC1[0], MC2[0] neighboring the ground select transistors GST1, GST2. Initially, as indicated by program number '1', the LSB of the data to be programmed in memory cell MC1[m] is programmed. Next, as indicated by program number '2', the LSB of the data to be programmed in memory cell MC2[m] is programmed. Next, as indicated by program number '3', the LSB of the data to be programmed in memory cell MC1[m−1] is programmed. Next, as indicated by program number '4', the LSB of the data to be programmed in memory cell MC2[m−1] is programmed. Next, as indicated by program number '5', the MSB of the data to be programmed in memory cell MC1[m] is programmed. Next, as indicated by program number '6', the MSB of the data to be programmed in memory cell MC2[m] is programmed. Next, as indicated by program number '7', the LSB of the data to be programmed in memory cell MC1[m−2] is programmed. Next, as indicated by program number '8', the LSB of the data to be programmed in memory cell MC2[m−2] is programmed. Next, as indicated by program number '9', the MSB of the data to be programmed in memory cell MC1[m−1] is programmed. Next, as indicated by program number '10', the MSB of the data to be programmed in memory cell MC2[m−1] is programmed. The shadow programming operation proceeds in this manner until all memory cells MC1[0 . . . m], MC2[0 . . . m] in the first and second memory cell strings 20A, 20B have been programmed.

An alternative shadow programming operation for a multiple-level cell memory configuration is now described in connection with FIG. 20B. In this example, like the example of FIG. 20A, it is assumed that neighboring bit lines BLi, and BLi+1 are shared by the same page buffer. Referring to FIG. 20B, it can be seen that the shadow programming operation programs eighteen programming operations, numbered 1-18 on the memory cells MC1[0 . . . m] of the first cell string 20A, and on the memory cells MC2[0 . . . m] of the second cell string 20B. At the instance shown in FIG. 18, memory cell MC1[1] is being programmed, and so the voltage Vpass is applied to the word line WL[1] and 0V is applied to the neighboring word line MC1[i−1], while the Vcc voltage is applied to the selected bit line BLi and 0V is applied to the unselected bit line BL[i+1].

According to the shadow programming operation in the example of FIG. 20B, programming is performed in a "minimum-to-maximum" direction; that is, programming is first performed on the memory cells MC1[0], MC2[0] neighboring the neighboring the ground select transistors GST1, GST2, and proceeding in a direction toward the memory cells MC1[n], MC2[n] neighboring the string select transistors SST1, SST2. Initially, as indicated by program number '1', the LSB of the data to be programmed in memory cell MC1[0] is programmed. Next, as indicated by program number '2', the LSB of the data to be programmed in memory cell MC2[0] is programmed. Next, as indicated by program number '3', the LSB of the data to be programmed in memory cell MC1[1] is programmed. Next, as indicated by program number '4', the LSB of the data to be programmed in memory cell MC2[1] is programmed. Next, as indicated by program number '5', the MSB of the data to be programmed in memory cell MC1[0] is programmed. Next, as indicated by program number '6', the MSB of the data to be programmed in memory cell MC2[0] is programmed. Next, as indicated by program number '7', the LSB of the data to be programmed in memory cell MC1[2] is programmed. Next, as indicated by program number '8', the LSB of the data to be programmed in memory cell MC2[2] is programmed. Next, as indicated by program number '9', the MSB of the data to be programmed in memory cell MC1[1] is programmed. Next, as indicated by program number '10', the MSB of the data to be programmed in memory cell MC2[1] is programmed. The shadow programming operation proceeds in this manner until all memory cells MC1[0 . . . m], MC2[0 . . . m] in the first and second memory cell strings 20A, 20B have been programmed.

The programming operations disclosed herein operate to mitigate or eliminate unwanted disturbance of the threshold voltage of the memory cells of unselected cell strings sharing the same word line as the selected memory cell during the programming operation of the selected memory cell. Applying this principle to the shadow programming operation of FIG. 20A, for example, when the MSB of the data to be programmed in memory cell MC1[m−1] as indicated by program number '9', such programming can possibly cause a disturbance of the threshold voltage of the MC2[m−1] cell programmed during programming step '4' and connected to the same, selected word line WL[m−1] as the selected memory cell MC1[m−1], depending on the state of the threshold voltage of the neighboring MC2[m] transistor, programmed earlier during program steps '2' and '6'. Under certain conditions, the self-boosting of the channel region of the MC2[m−1] may not take place, depending on the pre-programmed threshold voltage of the neighboring MC2[m] transistor, which can prevent the Vcc voltage applied to the bit line BLi+1 connected to the SST2 transistor from reaching, or pre-charging, the channel region of the MC2[m−1] transistor. This is mitigated by the embodiments disclosed herein, since they ensure such pre-charging of the MC2[m−1] transistor channel region during the programming operation of the selected transistor MC2[m−1].

Variations of the shadow programming operation described above are equally applicable to the principles of the present invention. For example, local boosting programming may be adopted to the present application.

Figure 21:
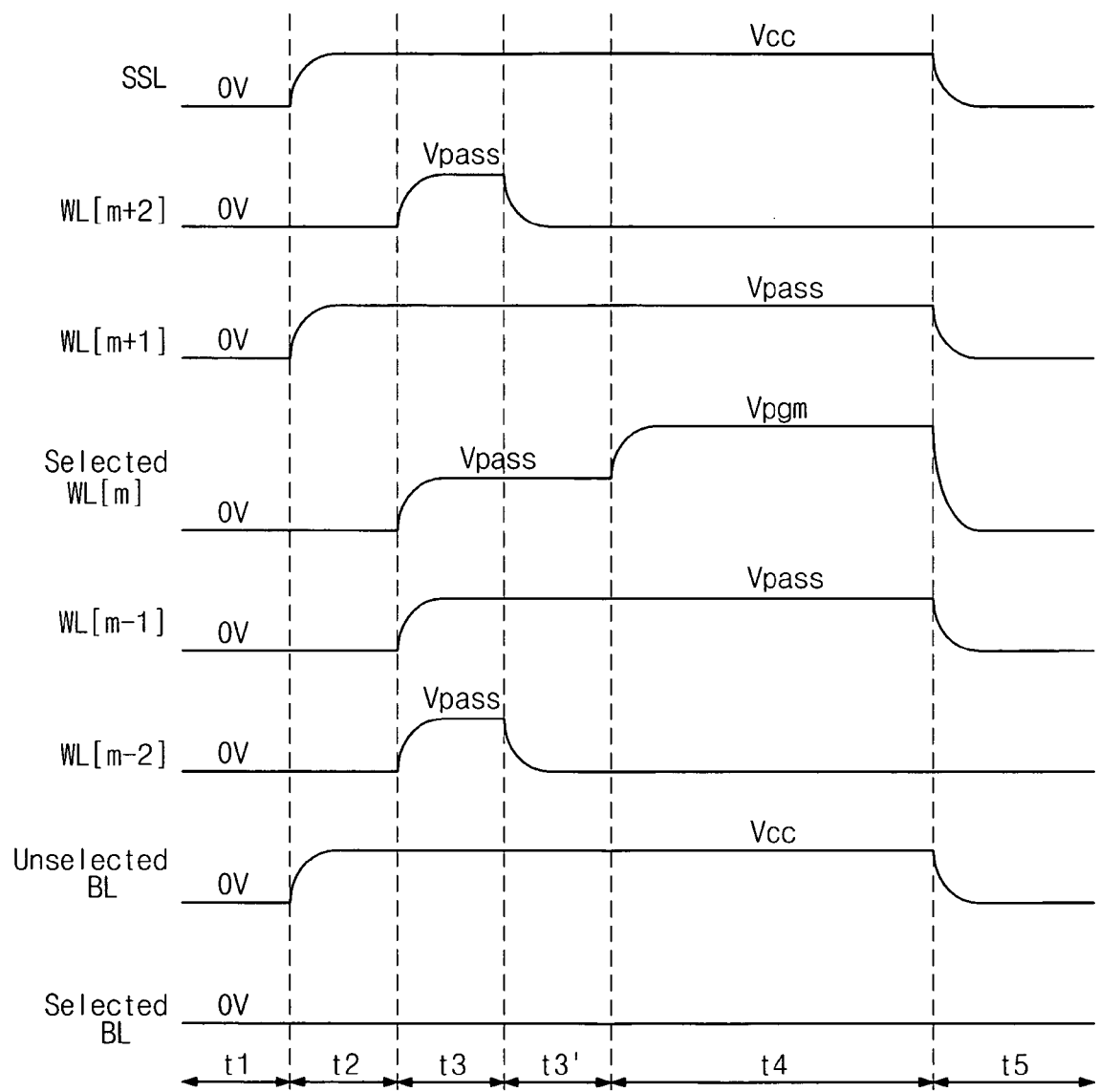
FIG. 21 is a timing diagram of signals applied to a memory cell array illustrating a memory cell programming operation in accordance with local boosting programming.

FIG. 21 is a timing diagram of signals applied to a memory cell array illustrating a memory cell programming operation in accordance with local boosting programming. In this embodiment, after the self-boosting operation is applied, and, at the same time as, or before, applying the Vpgm voltage to the selected word line WL[m], a low voltage, in this example, 0V is applied to two unselected word lines of the unselected word lines, the two unselected word lines being positioned on each side of the selected word line WL[m], thereby isolating a channel of the unselected cell transistor connected to the selected memory transistor. In this example, the two unselected word lines of the unselected word lines to which the low voltage is applied include word lines WL[m−2] and WL[m+2].

Alternatively, for example, the MSB values of data to be programmed can first be stored, followed by the LSB values. Also, more than two bit lines BLi, BLi+1 can be shared by the same page buffer, in which case, the shadow programming operation can consecutively program cells of more than two neighboring memory cell strings. Alternatively, a single page buffer can be connected to each bit line. Other variations are possible and equally applicable to the principles of the embodiments of the present invention.

Figure 22:
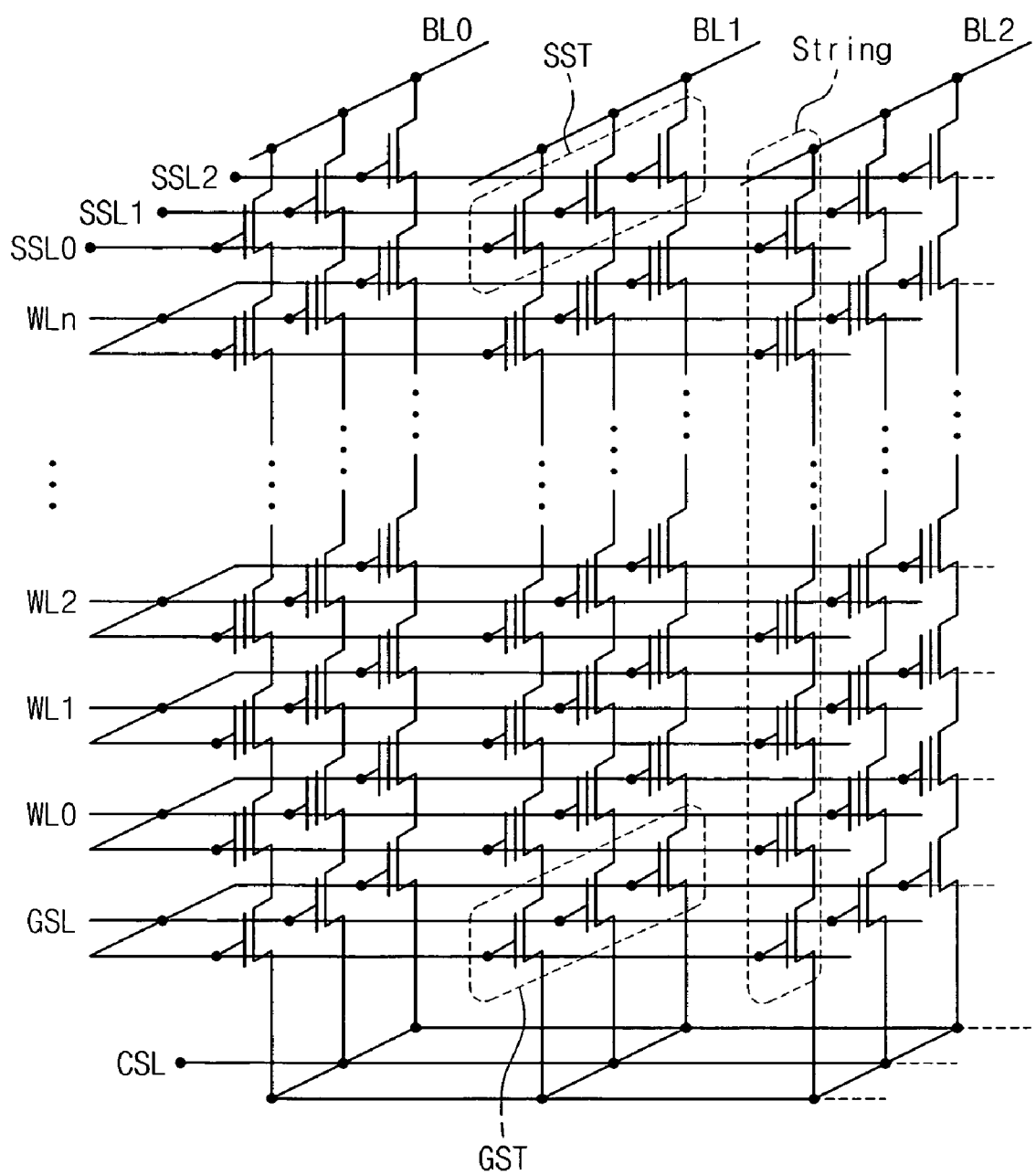
FIG. 22 is a schematic diagram of a three-dimensional memory cell array in accordance with embodiments of the present application.

FIG. 22 is a schematic diagram of a three-dimensional memory cell array in accordance with embodiments of the present application. Referring to FIG. 22, programming according to embodiments of the present application can be applied to a three-dimensional memory device such as BICs and TCAT devices. BICs and TCAT devices comprise vertical memory cell strings wherein the memory cells connected to the string comprise a vertical active body. Multi-bit cell programming and shadow programming may be applied to such three-dimensional memory cells and three-dimensional devices and thus should be also construed as falling within the scope of the present application.

Figure 23:
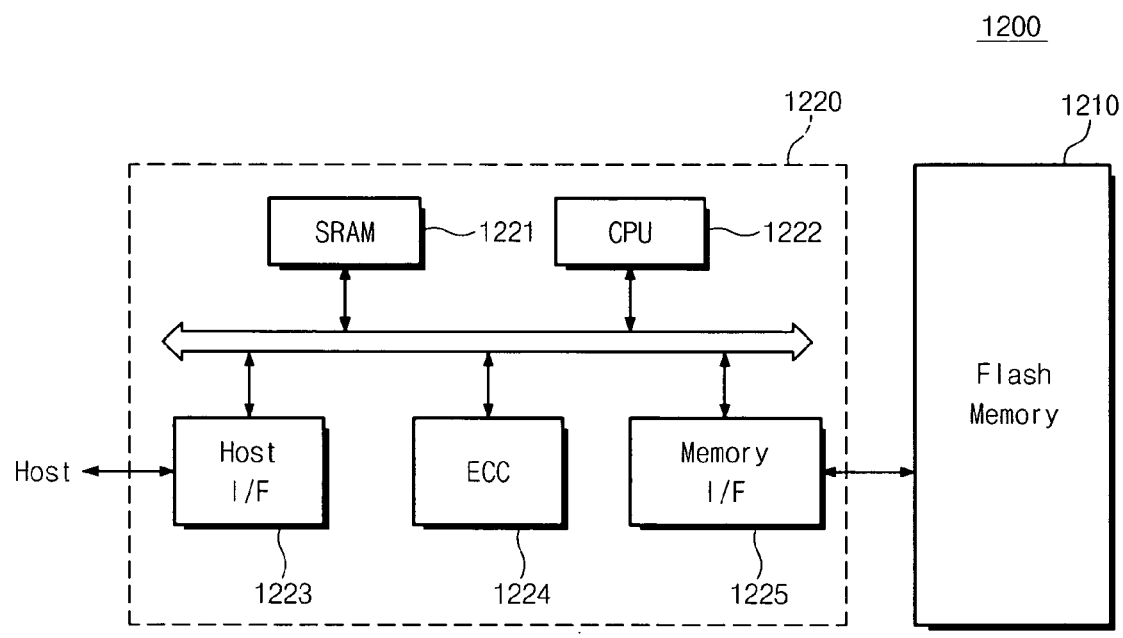
FIG. 23 is a block diagram of a memory card that comprises a semiconductor device in accordance with the embodiments of the present invention.

FIG. 23 is a block diagram of a memory card that comprises a semiconductor device in accordance with the embodiments of the present invention. The memory card 1200 comprises a memory controller 1220 that generates command and address signals C/A and a memory module 1210 for example, flash memory 1210 that comprises one or a plurality of flash memory devices. The memory controller 1220 comprises a host interface 1223 that transmits and receives command and address signals to and from a host, a controller 1224, and a memory interface 1225 that in turn transmits and receives the command and address signals to and from the memory module 1210. The host interface 1223, the controller 1224 and memory interface 1225 communicate with controller memory 1221 and processor 1222 via a common bus.

The memory module 1210 receives the command and address signals C/A from the memory controller 1220, and, in response, stores and retrieves data DATA I/O to and from at least one of the memory devices on the memory module 1210. Each memory device comprises a plurality of addressable memory cells and a decoder that receives the receives the command and address signals, and that generates a row signal and a column signal for accessing at least one of the addressable memory cells during programming and read operations.

Each of the components of the memory card 1200, including the memory controller 1220, electronics 1221, 1222, 1223, 1224, and 1225 comprised on the memory controller 1220 and the memory module 1210 can employ memory devices that are programmable according to the inventive concepts disclosed herein.

Figure 24:
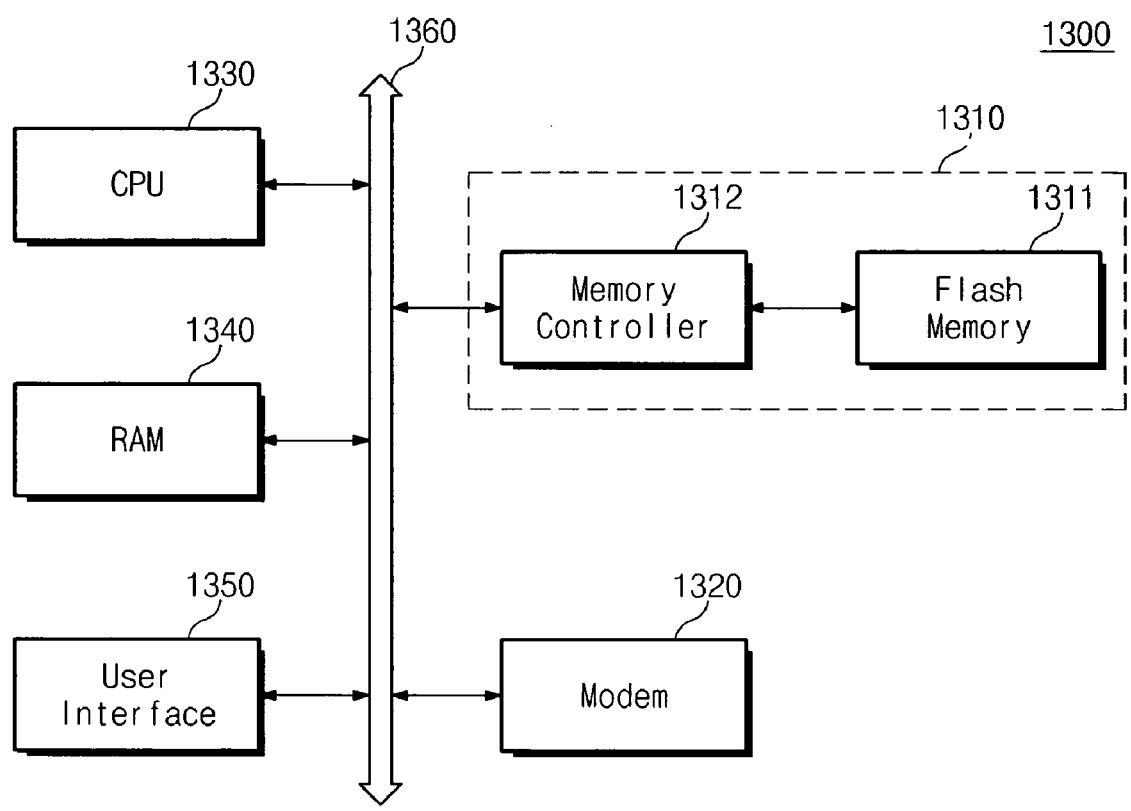
FIG. 24 is a block diagram of a memory system that employs a memory module, for example, of the type described herein, in accordance with the embodiments of the present invention.

FIG. 24 is a block diagram of a memory system 1300 that employs a memory module 1310, for example, of the type described herein. The memory system 1300 comprises a processor 1330, random access memory 1340, user interface 1350 and modem 1320 that communicate via a common bus 1360. The devices on the bus 1360 transmit signals to and receive signals from the memory card 1310 via the bus 1360. Each of the components of the memory system 1300, including the processor 1330, random access memory 1340, user interface 1350 and modem 1320 along with the memory card 1310 can employ vertically oriented memory devices of the type disclosed herein. The memory system 1300 can find application in any of a number of electronic applications, for example, those found in consumer electronic devices such as solid state disks (SSD), camera image sensors (CIS) and computer application chip sets.

The memory systems and devices disclosed herein can be packaged in any of a number of device package types, including, but not limited to, ball grid arrays (BGA), chip scale packages (CSP), plastic leaded chip carrier (PLCC) plastic dual in-line package (PDIP), multi-chip package (MCP), wafer-level fabricated package (WFP), and wafer-level processed stock package (WSP).

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A method of programming a semiconductor memory device, the memory device including: a plurality of memory cell transistors arranged in a plurality of transistor strings; a plurality of word lines, each word line connected to a corresponding memory cell transistor of each of the transistor strings; and a plurality of bit lines, each bit line connected to at least one of the transistor strings, the method comprising:
    applying a first voltage, and then applying a programming voltage to a selected word line corresponding to the selected memory cell transistor, wherein the first voltage is a first pass voltage; and
    prior to applying the first voltage to the selected word line, applying a second voltage to at least one neighboring word line that neighbors the selected word line, the neighboring word line connected to a neighboring, unselected memory cell transistor of a selected transistor string, wherein the second voltage is a second pass voltage,
    wherein a third voltage is applied to at least one unselected word line simultaneously with the first voltage, and
    wherein the third voltage is a third pass voltage.

2. The method of claim 1 wherein the application of the second voltage to the neighboring word line precedes application of the third voltage to the at least one unselected word line of the plurality of word lines.

3. The method of claim 1 wherein the first voltage and the second voltage are at the same voltage level or the first voltage is higher than the second voltage.

4. The method of claim 1 wherein the first voltage is less than the programming voltage; and wherein the second voltage is a precharge voltage.

5. The method of claim 1 wherein applying the second voltage to the neighboring word line is performed at substantially the same time as applying a voltage to a bit line.

6. The method of claim 1 wherein applying the second voltage to at least one neighboring word line that neighbors the selected word line further comprises applying the second voltage to the neighboring word line connected to the neighboring memory cell transistor of the selected transistor string positioned between the selected memory cell transistor and the other of either a ground select transistor or a string select transistor of the selected transistor string.

7. The method of claim 1 further comprising applying the second voltage to all neighboring, unselected word lines that are directly next to the selected word line, in advance of applying the first voltage to the selected word line.

8. The method of claim 1 further comprising applying the second voltage to all word lines that are connected to transistors of the transistor string that comprises the selected memory cell transistor, in advance of applying the first voltage to the selected word line.

9. The method of claim 1 wherein each transistor string further comprises at least one dummy memory cell transistor and wherein the memory device further comprises at least one dummy word line connected to a corresponding at least one dummy memory cell transistor of the transistor strings, and further comprising:
    applying the second voltage to the at least one dummy word line in advance of applying the first voltage to the selected word line.

10. The method of claim 9 wherein the at least one dummy memory cell transistor of each transistor string is positioned either between the plurality of memory cell transistors and a string select transistor of the transistor string or between the plurality of memory cell transistors and a ground select transistor of the transistor string, or both sides of the end of memory cell transistors.

11. The method of claim 10 wherein one of the at least one dummy word line is the neighboring word line of the selected word line to which the second voltage is applied in advance of applying the first voltage to the selected word line.

12. The method of claim 1 wherein the first voltage is the same as or greater than the second voltage.

13. The method of claim 12 further comprising applying a fourth voltage to the selected word line at the time stage between applying the first voltage and applying the programming voltage to the selected word line, and wherein the fourth voltage is lower than the first voltage.

14. The method of claim 1 wherein the memory cell transistors comprise a transistor type selected from the group consisting of SONOS-type, SANOS-type, TANOS-type, CTF-type, and floating gate type.

15. The method of claim 1 wherein the transistor strings of the memory device are configured as a configuration selected from the group consisting of: planar strings extending in a horizontal direction relative to a base substrate and vertical strings extending in a vertical direction relative to a base substrate.

16. A multiple-level cell (MLC) programming operation of a non-volatile memory device including the method of programming of claim 1.

17. A shadow programming operation of a non-volatile memory device including the method of programming of claim 1.

18. The shadow programming operation of a non-volatile memory device of claim 17, further comprising turning down the second voltage to a low voltage to two unselected word lines of the unselected word lines, wherein the two unselected word lines are positioned on each side of the selected word line.

19. A semiconductor memory device comprising:
    a plurality of memory cell transistors arranged in a plurality of transistor strings;

a plurality of word lines, each word line connected to a corresponding memory cell transistor of each of the transistor strings;

a plurality of bit lines, each bit line connected to at least one of the transistor strings; and a signal generator that:

applies a first voltage, and then applies a programming voltage to a selected word line corresponding to the selected memory cell transistor, wherein the first voltage is a first pass voltage; and prior to applying the first voltage to the selected word line, applies a second voltage to at least one neighboring word line that neighbors the selected word line, wherein the second voltage is a second pass voltage, the neighboring word line connected to a neighboring, unselected memory cell transistor of a selected transistor string, wherein a third voltage is applied to at least one unselected word line simultaneously with the first voltage, and wherein the third voltage is a third pass voltage.

20. The semiconductor memory device of claim 19 wherein the data are programmed in multiple-level cell (MLC) programming.

21. The semiconductor memory device of claim 19 wherein the transistor strings of the memory device are configured as a configuration selected from the group consisting of: planar strings extending in a horizontal direction relative to a base substrate and vertical strings extending in a vertical direction relative to a base substrate.

22. A memory system comprising:
a memory controller that generates command and address signals; and a memory module comprising a plurality of memory devices, the memory module receiving the command and address signals and in response storing and retrieving data to and from at least one of the memory devices, wherein each memory device comprises:

a plurality of memory cell transistors arranged in a plurality of transistor strings;

a plurality of word lines, each word line connected to a corresponding memory cell transistor of each of the transistor strings;

a plurality of bit lines, each bit line connected to at least one of the transistor strings; and a signal generator that:

applies a first voltage, and then applies a programming voltage to a selected word line corresponding to the selected memory cell transistor, wherein the first voltage is a first pass voltage; and prior to applying the first voltage to the selected word line, applies a second voltage to at least one neighboring word line that neighbors the selected word line, wherein the second voltage is second pass voltage, the neighboring word line connected to a neighboring, unselected memory cell transistor of a selected transistor string wherein a third voltage is applied to at least one unselected word line simultaneously with the first voltage, and wherein the third voltage is a third pass voltage.

* * * * *